United States Patent
Yamazaki et al.

(10) Patent No.: US 7,374,977 B2
(45) Date of Patent: May 20, 2008

(54) DROPLET DISCHARGE DEVICE, AND METHOD FOR FORMING PATTERN, AND METHOD FOR MANUFACTURING DISPLAY DEVICE

(75) Inventors: Shunpei Yamazaki, Tokyo (JP); Keitaro Imai, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 92 days.

(21) Appl. No.: 11/010,532

(22) Filed: Dec. 13, 2004

(65) Prior Publication Data
US 2005/0146551 A1    Jul. 7, 2005

(30) Foreign Application Priority Data
Dec. 17, 2003   (JP) ............... 2003-419923

(51) Int. Cl.
*H01L 21/84* (2006.01)
*H01L 21/00* (2006.01)

(52) U.S. Cl. ............. 438/149; 438/149; 438/584; 430/324; 427/96.1; 257/E21.166

(58) Field of Classification Search ........ 438/149, 438/584, 157, 674, 669; 430/324; 427/96.1; 505/100; 347/20; 257/E21.582
See application file for complete search history.

(56) References Cited

U.S. PATENT DOCUMENTS

| | | | |
|---|---|---|---|
| 6,872,672 B2 | 3/2005 | Yamazaki et al. | |
| 7,061,570 B2 * | 6/2006 | Imai | 349/187 |
| 2003/0008429 A1 | 1/2003 | Yamazaki et al. | |
| 2003/0083203 A1 * | 5/2003 | Hashimoto et al. | 505/100 |
| 2004/0070651 A1 * | 4/2004 | Usui et al. | 347/84 |
| 2004/0263564 A1 | 12/2004 | Maekawa et al. | |
| 2006/0180826 A1 | 8/2006 | Yamazaki et al. | |
| 2007/0132377 A1 | 6/2007 | Yamazaki et al. | |

FOREIGN PATENT DOCUMENTS

| | | |
|---|---|---|
| JP | 11-207959 | 8/1999 |
| JP | 11-251259 | 9/1999 |
| JP | 11251259 | * 9/1999 |
| JP | 2003-133691 | 5/2003 |
| JP | 2003-273092 | 9/2003 |
| JP | 2003-273097 | 9/2003 |

* cited by examiner

*Primary Examiner*—Michael Lebentritt
*Assistant Examiner*—Mohsen Ahmadi
(74) *Attorney, Agent, or Firm*—Cook, Alex, McFarron, Manzo, Cummings & Mehler, Ltd.

(57) ABSTRACT

It is an object of the present invention to improve the usability of a material, and to provide a display device which can be manufactured by simplifying the manufacturing process and a manufacturing technique thereof. It is also an object of the invention to provide a technique in which a pattern of a wiring or the like constituting these display devices can be formed to have a desired shape with favorable controllability. One feature of a droplet discharge device of the invention comprises: a discharge means for discharging a composition including a pattern forming material; and a shape means for shaping the shape of the composition before the composition is attached to a formation region, in which the shape means is provided between the discharge means and the formation region.

22 Claims, 33 Drawing Sheets

FIG.17
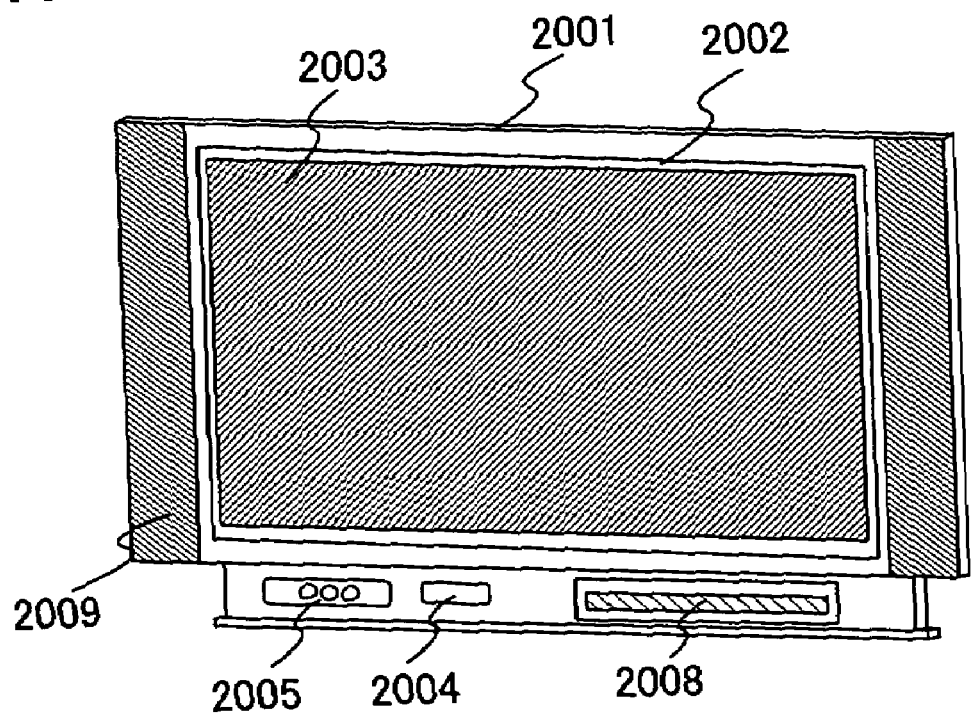
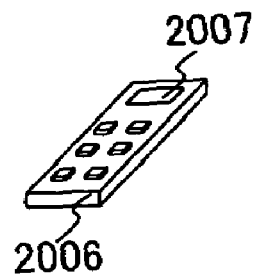

DROPLET DISCHARGE DEVICE, AND METHOD FOR FORMING PATTERN, AND METHOD FOR MANUFACTURING DISPLAY DEVICE

BACKGROUND OF THE INVENTION

1. Field of the Invention

The present invention relates to a droplet discharge device for forming a pattern by discharging (applying) a droplet, to a method for forming a pattern, and to a method for manufacturing a display device using the method thereof.

2. Description of the Related Art

A thin film transistor (hereinafter, referred to as a "TFT") and an electronic circuit using the thin film transistor are manufactured by laminating various types of thin films of a semiconductor, an insulating material, a conductive material, and the like over a substrate and then, appropriately forming a predetermined pattern with a photolithography technique. The photolithography technique means a technique of transferring a pattern of a circuit or the like formed over a surface of a transparent flat plane referred to as a photomask by using a material which does not transmit light, onto a targeted substrate by utilizing light, and the technique has widely been used in the manufacturing process of a semiconductor integrated circuit or the like.

In the manufacturing process employing a conventional photolithography technique, it is necessary to perform a multi-stage step including light exposure, developing, baking, peeling, and the like only for treating a mask pattern which is formed by using a photosensitive organic resin material referred to as a photoresist. Therefore, as the number of times of the photolithography step is increased more, the manufacturing cost is inevitably increased more. In order to improve such problems as described above, it has been tried to manufacture a TFT by reducing the number of the photolithography step (for example, Reference 1: Japanese Patent Laid-Open No. H11-251259).

However, in the technique disclosed in Reference 1, only a part of the photolithography step which is carried out plural times in TFT manufacturing process is replaced by a printing method and no contribution is made to a drastic reduction in the number of steps. Further, a light exposing apparatus to be used for transferring the mask pattern in the photolithography technique transfers a pattern of from several micrometers to 1 micrometer or less by equivalent projection light exposure or reduction projection light exposure. It is theoretically difficult for the light exposing apparatus to expose a large area substrate having a side of more than 1 meter to light all at once from a technical standpoint.

SUMMARY OF THE INVENTION

It is an object of the present invention to provide a technique in which, in the manufacturing process of a TFT, an electronic circuit using the TFT, or a light emitting display device formed by using the TFT, the manufacturing process is simplified by reducing the number of times of the photolithography step or by eliminating the photolithography step itself, and in which a large area substrate having a side of more than 1 meter can be manufactured with a higher yield at lower cost.

It is also an object of the invention to provide a technique in which a pattern of a wiring or the like constituting these display can be formed to have a desired shape with favorable controllability.

The following measures are taken in the invention to solve the problems of the above-mentioned related art.

One feature of the invention is that at least one or more of patterns required to manufacture a display panel, such as a wiring layer, a conductive layer for forming an electrode, or a mask layer for forming a predetermined pattern is/are formed by a method capable of selectively forming a pattern, and then, a light emitting display device is manufactured. A droplet discharge (apply) method (also referred to as an ink-jet method, depending on its mode) that can form a conductive layer, an insulating layer, or the like, and then, form into a predetermined pattern by selectively discharging (applying) a droplet of a composition mixed for a particular purpose is employed as the method capable of selectively forming a pattern. In addition, a method capable of transferring or drawing a pattern, for example, a printing method (a method for forming a pattern, such as screen printing or offset printing) or the like can be also employed.

In the invention, a droplet having a composition, which is attached to a form region by the above-mentioned method is shaped (deformed) to have a desired pattern with a shape (processing) means. When a miniaturized wire is required, a further thinner wiring pattern can be formed by including a discharged droplet in a thin linear shape portion included in the shape means, and drawing as if drawing a line.

Alternatively, instead of directly attaching a droplet from an outlet to a form region, the shape of the droplet is deformed through a shape means (a shape portion), and the droplet is drawn in the form region to have a desired thickness. In the shape means (the shape portion), the amount of the droplet is adjusted by passing through a thin linear string or the like, and being scanned in the form region to form a minute wiring. The shape means (the shape portion) may be like a brush in which plural liner strings are bound. The shape is not limited, and it may be a string shape or a plate shape. When a pattern is to be formed over a relatively large area, a shape means (a shape portion) which can attach a droplet to a large area at once may be selected.

According to the invention, regardless the size of an outlet which discharge a droplet, a pattern having a desired width can be formed with favorable controllability.

The shape means and an object for shaping may be formed of an inorganic material, an organic material, or a material in which a skeleton is formed by the bond of silicon and oxygen. The shape means may be also formed of a conductive material such as a metal or an insulating material such as a resin, since it is a means only for processing a droplet. Additionally, it may be formed of fiber or the like. Considering installing in a device, a shape means which is relatively lightweight and easy to process is preferable. When a minute wiring pattern is to be drawn, a nanotube material such as a carbon nanotube can be used. As an ultrafine carbon fiber formed of a carbon nanotube or the like, graphite nanofibers, carbon nanofibers, tubular graphite, carbon nanocorn, corn-shaped graphite or the like can be used. As for a material for a processing means, a material in which reaction or the like is not generated depending on a composition included in a droplet to be processed, may be selected.

The display of the invention includes a light-emitting device in which a light emitting element sandwiching an organic matter emitting luminescence referred to as electro luminescence (hereinafter also referred to as "EL") or a medium including a mixture of an organic matter and an inorganic matter between electrodes is connected to a TFT;

a liquid crystal display device in which a liquid crystal element having a liquid crystal material is used as a display element; or the like.

According to the invention, a means for improving adhesion (base pretreatment) is performed on a form region when forming a pattern by a droplet discharge method, thereby improving the reliability of a display device.

One feature of the invention is that a display device including a semiconductor film, an insulating film, a mask, and the like in addition to a wiring is formed by using a substance which has an effect of enhancing adhesion. In a step, when a predetermined pattern is formed by discharging a droplet including a predetermined composition from a fine pore, a substance formed of a high melting point metal is formed as base pretreatment for enhancing the adhesion. Specifically, a wiring material mixed in a solvent (including a material in which a wiring material (a conductive material) is dissolved or dispersed in a solvent) is formed over a conductive layer formed of a high melting point metal or the ends thereof by an application method or the like, to form a wiring. For example, a conductive material mixed in a solvent is discharged over a conductive layer formed of a high melting point metal, or a 3d transition element by a droplet discharge method. In addition to a droplet discharge method, a conductive material mixed in a solvent may be formed over the conductive layer formed of a high melting point metal by a spin coating method, a dip method, another application method, a printing method (a method for forming a pattern, such as screen printing or offset printing).

As a substance used for base pretreatment, titanium oxide ($TiO_x$), strontium titanate ($SrTiO_3$), cadmium selenide (CdSe), potassium tantalate ($KtaO_3$), cadmium sulfide (CdS), zirconia ($ZrO_2$), niobium oxide ($Nb_2O_5$), zinc oxide (ZnO), iron oxide ($Fe_2O_3$), tungsten oxide ($WO_3$) or the like can be used.

The substance used for base pretreatment can be formed by a sol-gel method such as a dip coating method, a spin coating method, a droplet discharge method, or an ion plating method, an ion beam method, a CVD method, a sputtering method, an RF magnetron sputtering method, a plasma spray method, or an anodic oxidation method. In addition, the substance does not need to have continuity as a film, depending on its formation method.

As the above-mentioned high melting point metal or a 3d transition element, a material of Ti (titanium), W (tungsten), Cr (chrome), Al (aluminum), Ta (tantalum), Ni (nickel), Zr (zirconium), Hf (hafnium), V (vanadium), Ir (iridium), Nb (niobium), Pd (lead), Pt (platinum), Mo (molybdenum), Co (cobalt), Rh (rhodium), Sc (scandium), Mn (manganese), Fe (iron), Cu (copper) or Zn (zinc), or an oxide, a nitride, or an oxynitride thereof can be used. The conductive layer is formed by a known method such as a sputtering method, a vapor deposition method, an ion implantation method, a CVD method, a dip method, or a spin coating method, preferably, by a sputtering method, a dip method or a spin coating method. In the case where the conductive layer is insulated later, it is simple and preferable to form the conductive layer in from 0.01 nm to 10 nm thick, and insulate the conductive film due to natural oxidation.

Alternatively, a method for performing plasma treatment on a formation region (formation face) is employed as another method. The plasma treatment is performed with air, oxygen, or nitrogen used as a treatment gas, with pressure from several tens of Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, the plasma density is set from $1\times10^{10}$ $m^{-3}$ to $1\times10^{14}$ $m^{-3}$, so-called corona discharge or glow discharge. Surface modification can be performed without material dependence by employing plasma treatment using air, oxygen, or nitrogen as a treatment gas. Accordingly, surface modification can be performed on any material.

As another alternative method, a substance of an organic material functioning as an adhesive may be formed to improve the adhesion of a pattern to be formed by a droplet discharge method with a formation region thereof. A film formed of one or a plurality of photosensitive or non-photosensitive organic materials (organic resin materials) (polyimide, acrylic, polyamide, polyimide amide, a resist, benzocyclobutene, or the like), a Low k material having a low dielectric constant, and the like; a lamination layer thereof; or the like can be used as the material. In addition, a material in which a skeleton is configured by the bond of silicon (Si) and oxygen (O) and which contains at least hydrogen as a substituent or which contains at least one of fluorine, an alkyl group, and aromatic hydrocarbon as a substituent may be used. A droplet discharge method or a printing method (a method for forming a pattern, such as screen printing or offset printing) can be employed as a manufacturing method. A TOF film, an SOG film, or the like obtained by an application method can be also used.

The above-mentioned step performed for improving adhesion or surface modification on a region where a conductive material is formed by using a droplet discharge method as base pretreatment, may be also performed when a conductive material is further formed over a pattern formed by using a droplet discharge method. As base pretreatment in that case, ultraviolet irradiation treatment which radiates ultraviolet ray is performed after forming a first conductive layer by a droplet discharge method, and then, a second conductive layer may be formed in a processing region by a droplet discharge method. For example, after forming a wide pattern with the use of an outlet having a large diameter, a thin pattern is formed so as to partially overlap with the wide pattern with a shape means according to the invention, thereby forming a minute pattern.

As for the composition to be discharged from the outlet by a droplet discharge method to form a conductive material (a conductive layer), a conductive material dissolved or dispersed in a solvent is used. The conductive material corresponds to a fine particle or a dispersant nano-particle of a metal such as Ag, Au, Cu, Ni, Pt, Pd, Ir, Rh, W, or Al, sulfide of a metal such as Cd or Zn, oxide of Fe, Ti, Si, Ge, Zr, Ba, or the like, or silver halide. In addition, it corresponds to indium tin oxide (ITO), ITSO formed of indium tin oxide and silicon oxide, organic indium, organotin, zinc oxide, titanium nitride, or the like which is used as a transparent conductive film. However, as for a composition to be discharged from the outlet, it is preferable to use any material of gold, silver, and copper, which is dissolved or dispersed in a solvent, taking a specific resistance value into consideration. It is more preferable to use silver or copper having a low resistance value. When silver or copper is used, a barrier film may be additionally provided as a measure for an impurity. A silicon nitride film or nickel boron (NiB) can be used as the barrier film.

In addition, a particle in which a conductive material is coated with other conductive materials to be a plurality of layers may be used. For example, a three-layer structure particle in which copper is coated with nickel boron (NiB), and then coated with silver may be used. As for such solvents, esters such as butyl acetate or ethyl acetate; alcohols such as isopropyl alcohol or ethyl alcohol; organic solvents such as methyl ethyl ketone or acetone; or the like may be used. The viscosity of the composition is preferably 20 cp or less. This is because the composition is prevented from drying or the composition is smoothly discharged from the outlet. The surface tension of the composition is preferably 40 mN/m or less. However, the viscosity of the composition and the like may be appropriately adjusted in accordance with a solvent to be used and use application. For example, the viscosity of a composition in which ITO, organic indium, or organotin is dissolved or dispersed in the solvent is from 5 mPa·S to 20 mPa·S, the viscosity of a composition in which silver is dissolved or dispersed in the solvent is from 5 mPa·S to 20 mPa·S, and the viscosity of a composition in which gold is dissolved or dispersed in the solvent is from 5 mPa·S to 20 mPa·S.

In the invention, a conductive layer which constitutes a display device can be formed by a droplet discharge method. First, a conductive layer formed with a relatively wide line width (also referred to as a "bus line") such as a gate line, a source line or other lead wiring is directly formed by a droplet discharge method. A minute wiring can be drawn by shaping a conductive layer having a relatively thin line width such as a gate electrode, a source/drain electrodes, and another wiring in a pixel portion which are formed so as to be connected to the source line or the gate line as if branching off the source line or the gate line with a shape means according to the invention. According to the invention, a gate wiring having a line width of from 10 μm or more to 40 μm or less, a gate electrode having a line width of from 5 μm or more to 20 μm or less, preferably from 0.3 μm or more to 10 μm or less; therefore, a wiring in which the line width of the gate wiring is about twice that of the gate electrode can be formed. According to the invention, requirements of reduction in resistance for flowing large current to the wiring with efficiency and high-speed, and of miniaturization of a pattern having no disconnection to an electrode can be both achieved. According to the invention, a further minute wiring can be formed without being limited to the diameter of an outlet of a droplet.

One feature of a droplet discharge device of the invention comprises: a discharge means for discharging a composition including a pattern forming material; and a shape means for shaping the shape of the composition before the composition is attached to a formation region, in which the shape means is provided between the discharge means and the formation region.

Another feature of a droplet discharge device of the invention comprises: a discharge means for discharging a composition including a pattern forming material; and a shape means for shaping the shape of the composition after the composition is attached to a formation region.

In the above-mentioned structure, the shape means may be provided to be in contact with an outlet of the droplet discharge means, or can be separately scanned by being provided separately. Additionally, the shape means has a shape portion, and various shapes such as a needle shape, a columnar shape, a stick shape, a string shape, a plate shape, or a tube shape can be used for a shape of the shape portion.

Another feature of a method for forming a pattern of the invention is that a composition including a pattern forming material is discharged toward a formation region, and a pattern is selectively formed by shaping the shape of the composition before the composition is attached to the formation region.

Another feature of a method for forming a pattern of the invention is that a composition including a pattern forming material is discharged toward a formation region, and a pattern is selectively formed by shaping the shape of the composition after the composition is attached to the formation region and before the composition is cured.

In the above-mentioned structure, the shape of the composition is shaped by the shape portion of the shape means. However, when the shape portion has a narrow shape such as a needle shape or a string shape, a minute pattern can be shaped. On the other hand, when the shape portion has a wide shape having relatively a large area such as a columnar shape or a plate shape, a large pattern can be formed at once.

Another feature of a method for manufacturing a display device of the invention comprises a semiconductor layer, a wiring, and an electrode, in which a composition including a conductive material is discharged over a formation region, a part of the shape of the composition is shaped, and the composition is selectively enlarged; thereby forming a wiring and an electrode.

In the above-mentioned structure, the wiring and the electrode can be formed by a material which constitutes the above-mentioned conductive material by a droplet discharge method. The electrode can be used as a gate electrode layer, and the width in a channel direction of the gate electrode layer is from 5 μm or more to 100 μm or less, more preferably, from 0.3 μm or more to 10 μm or less. The amount of the droplet of from 0.1 pl or more to 40 pl or less is discharged by a droplet discharge method, and a pattern can be formed.

In the above-mentioned structure, the semiconductor layer may be an amorphous semiconductor including a crystalline structure, which is formed by a gas containing hydrogen and a halogen. The semiconductor layer may be also a non-crystalline semiconductor which is formed of a gas containing hydrogen and halogen, or polycrystalline semiconductor formed of a gas containing hydrogen and a halogen element. It is preferable that the length in a channel direction in a region where the electrode and the semiconductor layer are intersected is from 5 μm or more to 100 μm or less, more preferably, from 0.3 μm or more to 10 μm or less. In addition, a TV set in which a display screen image includes the above-mentioned display device can be manufactured.

A gate insulating layer which can be used in the invention is formed by sequentially laminating a first silicon nitride film, a silicon oxide film and a second silicon nitride film. Accordingly, a gate electrode can be prevented from being oxidized, and a favorable interface with a semiconductor layer to be formed on the upper layer side of the gate insulating layer can be formed.

One feature of the invention is that a mask used for forming the gate electrode layer, the wiring layer, and for patterning can be formed by a droplet discharge method. Among patterns required to manufacture the display device, at least one pattern is formed by a method in which the pattern can be selectively formed to manufacture the display device, which achieves the object of the invention.

In addition, an insulating layer to be used as a partition wall or the like may be formed of an organic material, an inorganic material, or a material in which a skeleton is configured by the bond of silicon and oxygen. Since the organic material is superior in the planarity, the film thickness does not become extremely thin and disconnection does not occur in a step portion even when a conductive material is formed later; therefore, it is preferable. In addition, the organic material has a low dielectric constant. Accordingly, when the organic material is used as an interlayer insulating material of a plurality of wirings, the wiring capacity is reduced. Then, a multilayer wiring can be formed, and higher efficiency and higher function can be obtained.

On the other hand, a siloxane polymer can be given as a typical example of the material in which a skeleton is configured by the bond of silicon and oxygen. Specifically, it is a material in which a skeleton is configured by the bond of silicon and oxygen and which contains at least hydrogen as a substituent or which contains at least one of fluorine, an alkyl group, and aromatic hydrocarbon as a substituent. The material is also superior in planarity and has transparency and heat resistance. An insulating material formed of a siloxane polymer can be heat-treated at temperatures of approximately equal to or lower than from 300° C. to 600° C. after formation.

According to the invention, patterns of a conductive layer can be separately formed depending on the line width. Accordingly, in wirings included in a display device, a wiring with low resistance having a wide line and a minute wiring used for a pixel portion or the like can be both formed to fulfill required function depending on its role.

According to the invention, patterning of a wiring layer or a mask can be directly performed by a droplet discharge method; therefore, a TFT in which the usability of a material is improved and the manufacturing process is simplified, and a highly reliable display device using thereof can be obtained.

These and other objects, features and advantages of the present invention will become more apparent upon reading of the following detailed description along with the accompanied drawings.

BRIEF DESCRIPTION OF THE DRAWING

FIG. 17 shows electronic devices to which a certain aspect of the invention is applied;

DETAILED DESCRIPTION OF THE INVENTION

Figure 1A:
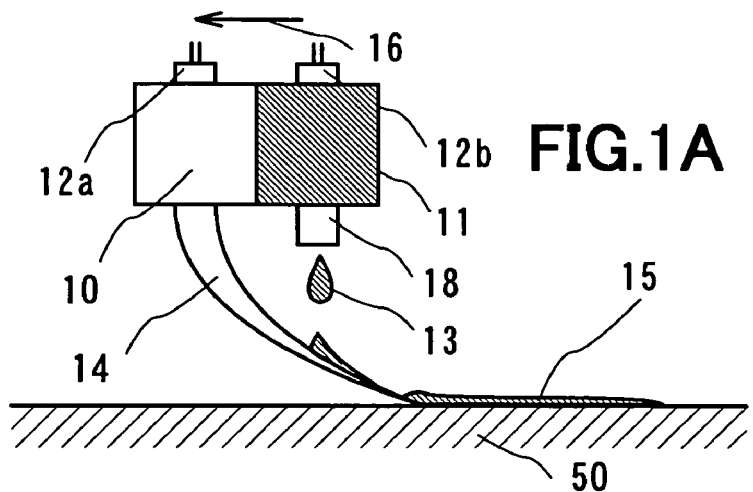
FIGS. 1A to 1D show views describing a certain aspect of the present invention.

Embodiment Mode of the present invention will be described below in detail with reference to the accompanying drawings. However, the invention is not limited to the following description and it is easily understood that various changes and modifications will be apparent to those skilled in the art, unless such changes and modifications depart from content and the scope of the invention. Therefore, the invention is not interpreted with limiting to the description in embodiment mode shown hereinafter. Note that, in the structure of the invention described hereinafter, the same reference numerals denote the same parts or parts having the same function in different drawings and the explanation will not be repeated.

Figure 29:
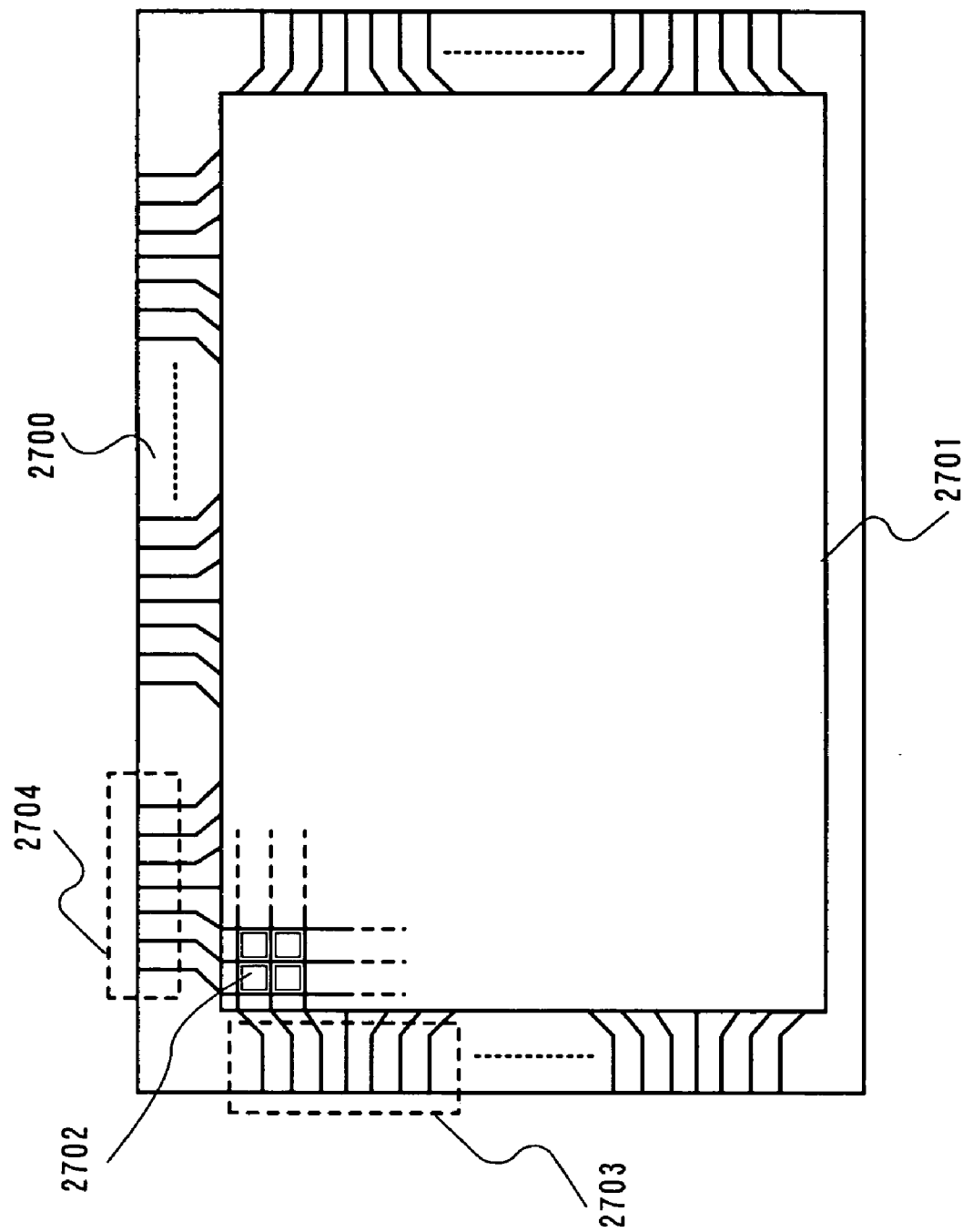
FIG. 29 is a top view of a display device of a certain aspect of the invention.

FIG. 29 shows a top view of a structure of a display panel according to the invention. A pixel portion 2701 in which pixels 2702 are arranged in a matrix, a scanning line input terminal 2703, and a signal line input terminal 2704 are formed over a substrate 2700 having an insulating surface. The number of pixels may be provided according to various standards. The number of pixels of XGA may be 1024×768×3 (RGB), that of UXGA may be 1600×1200×3 (RGB), and that of a full-speck high vision to correspond thereto may be 1920×1080×3 (RGB).

The pixels 2702 are arranged in a matrix by intersecting a scanning line extended from the scanning line input terminal 2703 with a signal line extended from the signal line input terminal 2704. Each pixel 2702 is provided with a switching element and a pixel electrode connected thereto. A typical example of the switching element is a TFT. A gate electrode side of a TFT is connected to the scanning line, and a source or drain side thereof is connected to the signal line; therefore, each pixel can be controlled independently by a signal inputted from outside.

A TFT includes a semiconductor layer, a gate insulating layer, and a gate electrode as main components. A wiring connected to one of a source region and a drain region which are formed in the semiconductor layer is concomitant thereof. A top gate type in which a semiconductor layer, a gate insulating layer, and a gate electrode layer are sequentially arranged from the substrate side, a bottom gate type in which a gate electrode layer, a gate insulating layer, and a semiconductor layer are sequentially arranged from the substrate side, and the like are known as typical structures of a TFT. However, any one of the structures may be applied to the invention.

An amorphous semiconductor (hereinafter also referred to as an "AS") manufactured by a vapor phase growth method using a semiconductor material gas typified by silane or germane or a sputtering method; a polycrystalline semiconductor that is formed by crystallizing the amorphous semiconductor by utilizing light energy or thermal energy; a semi-amorphous (also referred to as microcrystallite or microcrystalline, and hereinafter also referred to as an "SAS") semiconductor; or the like can be used for a material which forms a semiconductor layer.

An SAS is a semiconductor with an intermediate structure between an amorphous structure and a crystal structure (including a single crystal and a polycrystal). This is a semiconductor having a third condition that is stable in regard to a free energy, and a crystalline region having a short-range order and lattice distortion is included therein. A crystalline region of from 0.5 nm to 20 nm can be observed at least in a part of a region in the film. When silicon is contained as the main component, Raman spectrum is shifted to a lower frequency side less than 520 cm$^{-1}$. Diffraction peak of (111) or (220) to be caused from a crystal lattice of silicon is observed in X-ray diffraction. At least 1 atomic % or more of hydrogen or halogen is contained to teminate a dangling bond. An SAS is formed by carrying out grow discharge decomposition (plasma CVD) of a silicide gas. In addition to $SiH_4$, $Si_2H_6$, $SiH_2Cl_2$, $SiHCl_3$, $SiCl_4$, $SiF_4$, or the like can be used for the silicide gas. In addition, $GeF_4$ may be mixed. This silicide gas may be diluted with $H_2$ or $H_2$ and one or more of the rare gas element of He, Ar, Kr, and Ne. A dilution ratio ranges from 2 times to 1000 times. A pressure ranges approximately from 0.1 Pa to 133 Pa, and a power frequency ranges from 1 MHz to 120 MHz, preferably from 13 MHz to 60 MHz. A substrate heating temperature may be 300° C. or lower. It is desirable that an atmospheric constituent impurity such as oxygen, nitrogen, or carbon is 1×10$^{20}$ cm$^{-1}$ or less as an impurity element in the film, specifically an oxygen concentration is 5×10$^{19}$/cm$^3$ or less, preferably 1×10$^{19}$/cm$^3$ or less.

Figure 30:
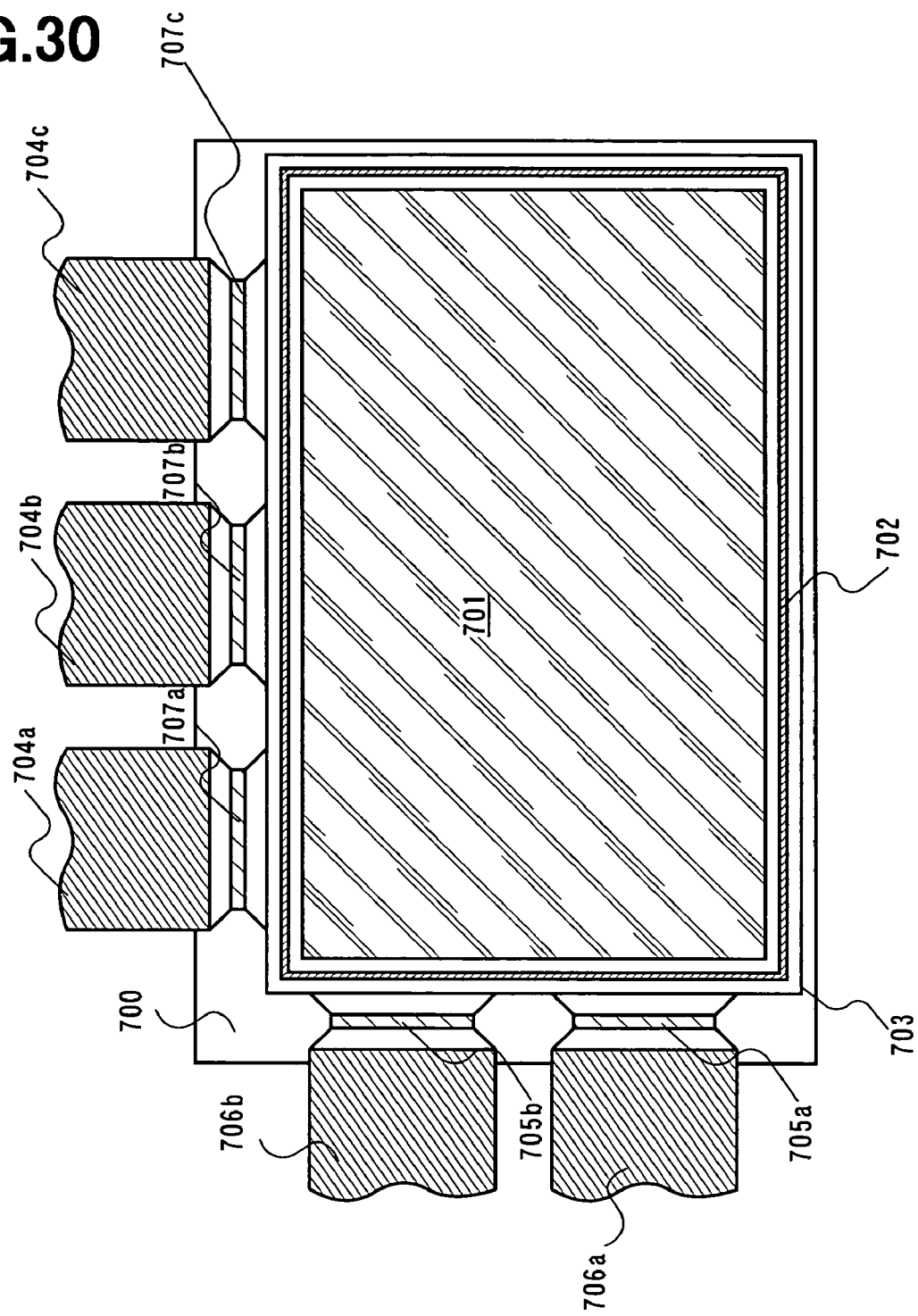
FIG. 30 is a top view of a display device of a certain aspect of the invention.

FIG. 29 shows a structure of a liquid crystal display panel that controls a signal inputting into a scanning line and a signal line by an external driver circuit. Furthermore, a driver IC may be mounted on a substrate 700 by a COG (Chip on Glass) as shown in FIG. 30. In FIG. 30, the substrate 701 is pasted with the sealing substrate 703 using a sealing material 702.

Also, a driver IC 707a, a driver IC 707b, a driver IC 707c, a driver IC 705a, and a driver IC 705b provided over the substrate 700 are connected with FPC 704a, FPC 704b, FPC 704c, FPC 706a, FPC 706b, respectively. The drive IC may be formed over a monocrystal semiconductor substrate, or the one in which a circuit is formed of a TFT over a glass substrate.

Figure 31:
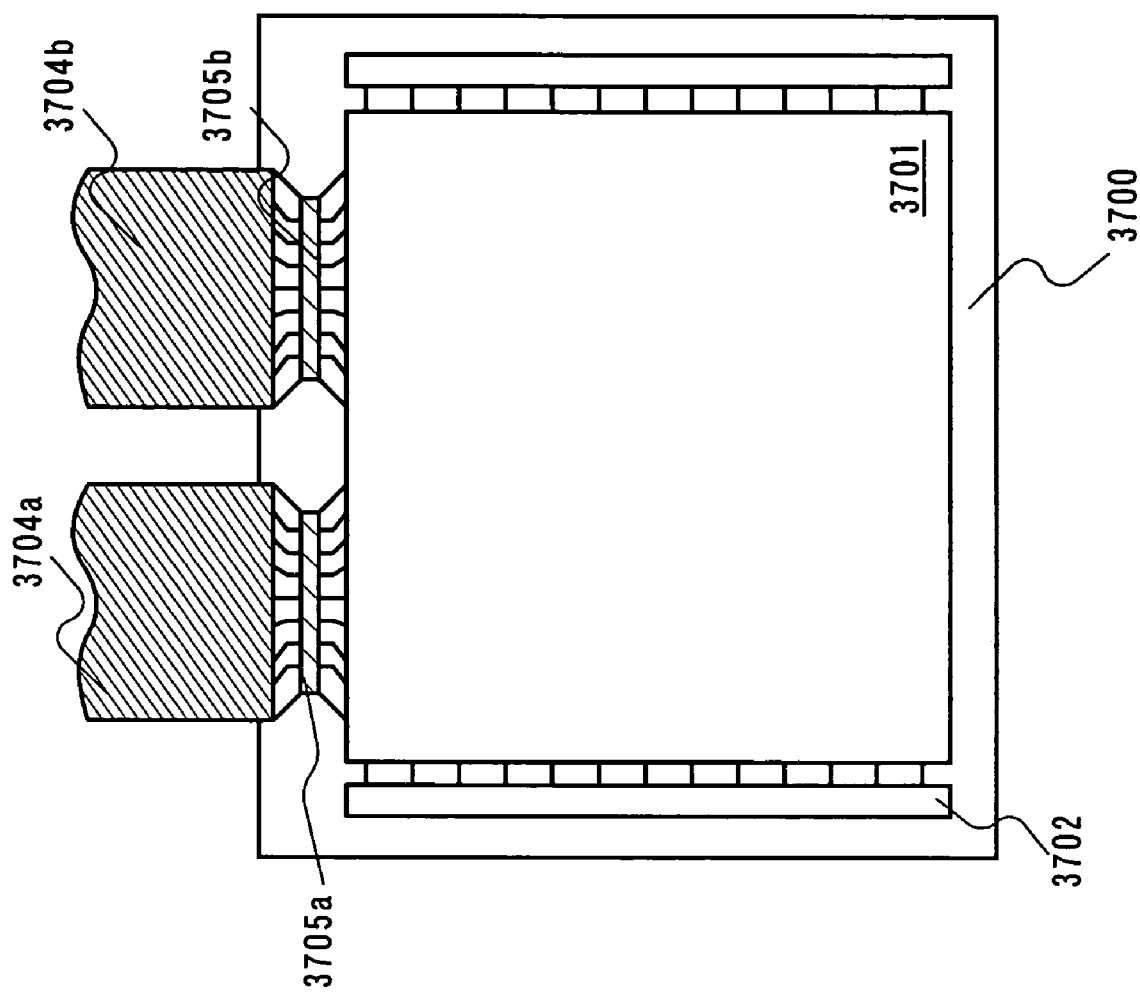
FIG. 31 is a top view of a display device of a certain aspect of the invention.

When a TFT provided in a pixel is formed of an SAS, a scanning line driver circuit 3702 may be integrally formed over a substrate 3700 as shown in FIG. 31. In FIG. 31, reference numeral 3701 denotes a pixel portion, and driver ICs 3705a and 3705b are mounted on a signal line driver circuit by COG and the signal line driver circuit is connected to FPCs 3704a and 3704b.

[Embodiment Mode 1]

Embodiment mode of the present invention is described with reference to FIGS. 1A to 1D and FIG. 16.

FIGS. 1A to 1D are detail views of a method for forming a pattern of a device according to the invention. The invention employs a method for forming a pattern by discharging a droplet.

In FIG. 1A, reference numeral 50 denotes a formation region; 11, a head portion; 12b, control means of a droplet discharge means; and 18, a nozzle. Being adjacent to them, reference numeral 10 denotes a shape means; 14, a shape portion; 12a, a control means of the shape means. A droplet 13 having a pattern formation material discharged from the nozzle 18 by the control means 12b is attached to the brush-shaped shape portion 14, and formed in a shape like a pattern 15 through the form shape 14 over the formation region 50. By scanning the shape means and the head portion in a direction 16, the pattern 15 is formed to be a linear shape.

As in this embodiment mode, when the shape potion 14 is made to have a needle shape in which the diameter is made smaller toward a tip direction, the size of a droplet discharged from an outlet of the nozzle 18 is shaped until it is attached to the formation region 50; therefore, the minute pattern 15 having a further narrower width can be formed. By scanning the shape portion 14, the amount of a droplet attached to the formation region 50 can be adjusted. Accordingly, the pattern 15 can be formed to have a desired width and shape without depending on the diameter of the nozzle by controlling the shape of the shape portion 14 and the scanning speed.

Figure 1B:
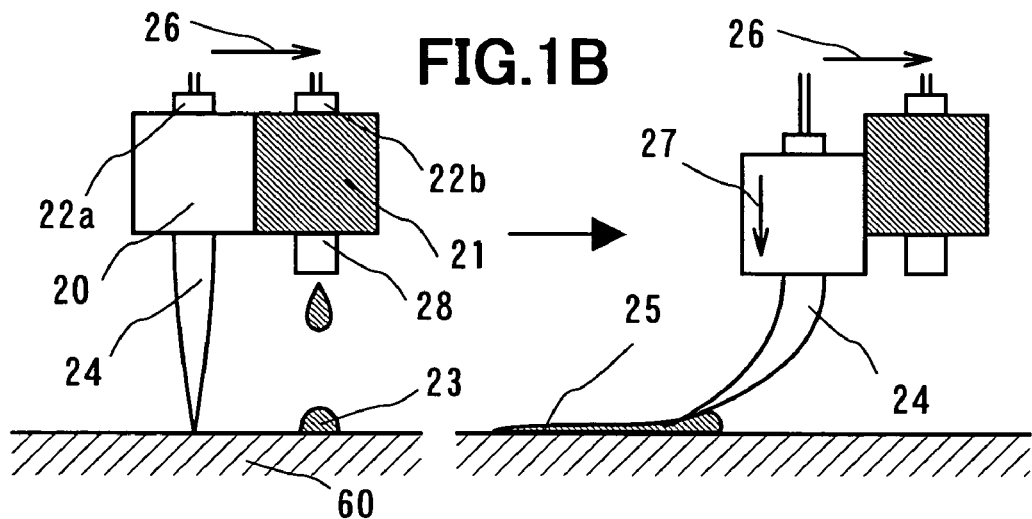

In FIG. 1A, an example in which a droplet is shaped to have a desired shape with a shape means while it is discharged from an outlet of a droplet of the nozzle until being attached to a formation face is shown. In FIG. 1B, a method for forming a shape before a composition is cured after discharging a droplet over the formation region is shown.

In FIG. 1B, reference numeral 60 denotes a formation region; 21, a head portion; 22b, a control means of a droplet discharge means; and 28, a nozzle. Being adjacent to these, reference numeral 20 denotes a shape means; 24, a shape portion; 22a, a control means of the shape means. A droplet having a pattern formation material discharged from the nozzle 28 by the control means 22b is attached to the formation region 60 as a droplet 23. Before the droplet 23 is fully solidified, the shape means 20 and the shape portion 24 are moved in a direction 27 by the control means 22a and scanned over the droplet 23 in a direction 26. At this time, the shape portion 24 shapes the droplet 23 and a pattern 25 is formed by deforming the shape. A pattern can be freely shaped by the shape portion 24 since the droplet 23 is not fully solidified at this time.

The pattern 25 can be formed to have a desired width and a shape without depending on the diameter of an outlet of the nozzle by adjusting the shape of the shape portion 24, the scanning speed in the direction 26, the moving distance in the direction 27 and the like.

In this embodiment mode, although a mode in which the shapes of the shape portions 14 and 24 have needle shapes in which the diameters become narrower toward the tips, columnar shapes, plate shapes, sting shapes and the like can be appropriately selected according to a desired pattern shape. When a pattern is to be broadly formed, a spatular shape form portion may be used so that the area being in contact with a droplet at a time becomes broader toward the tip. Alternatively, a form portion in which a plurality of fine bristles (or strings) are bound like a brush may be also used.

Figure 1C:
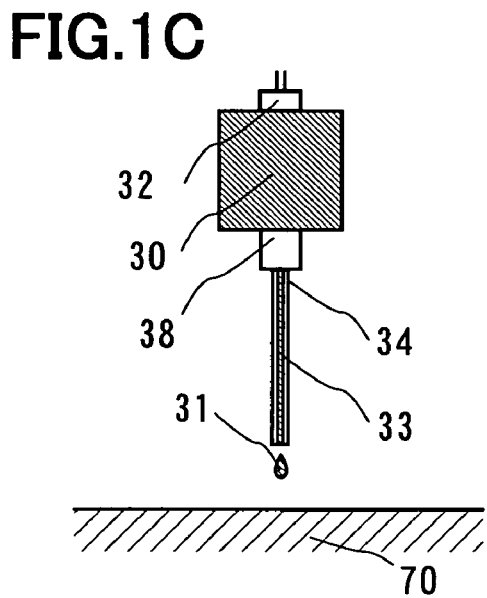
Figure 1D:
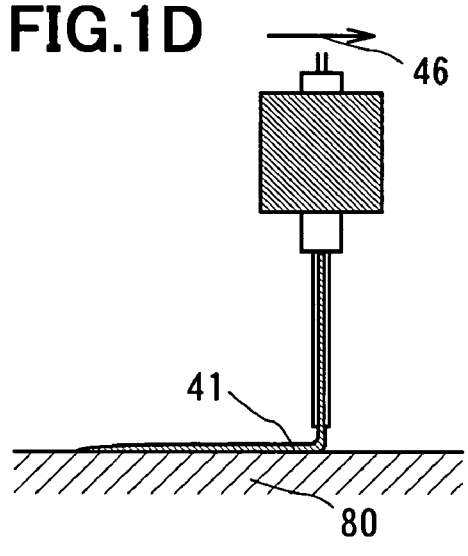
Figure 2:
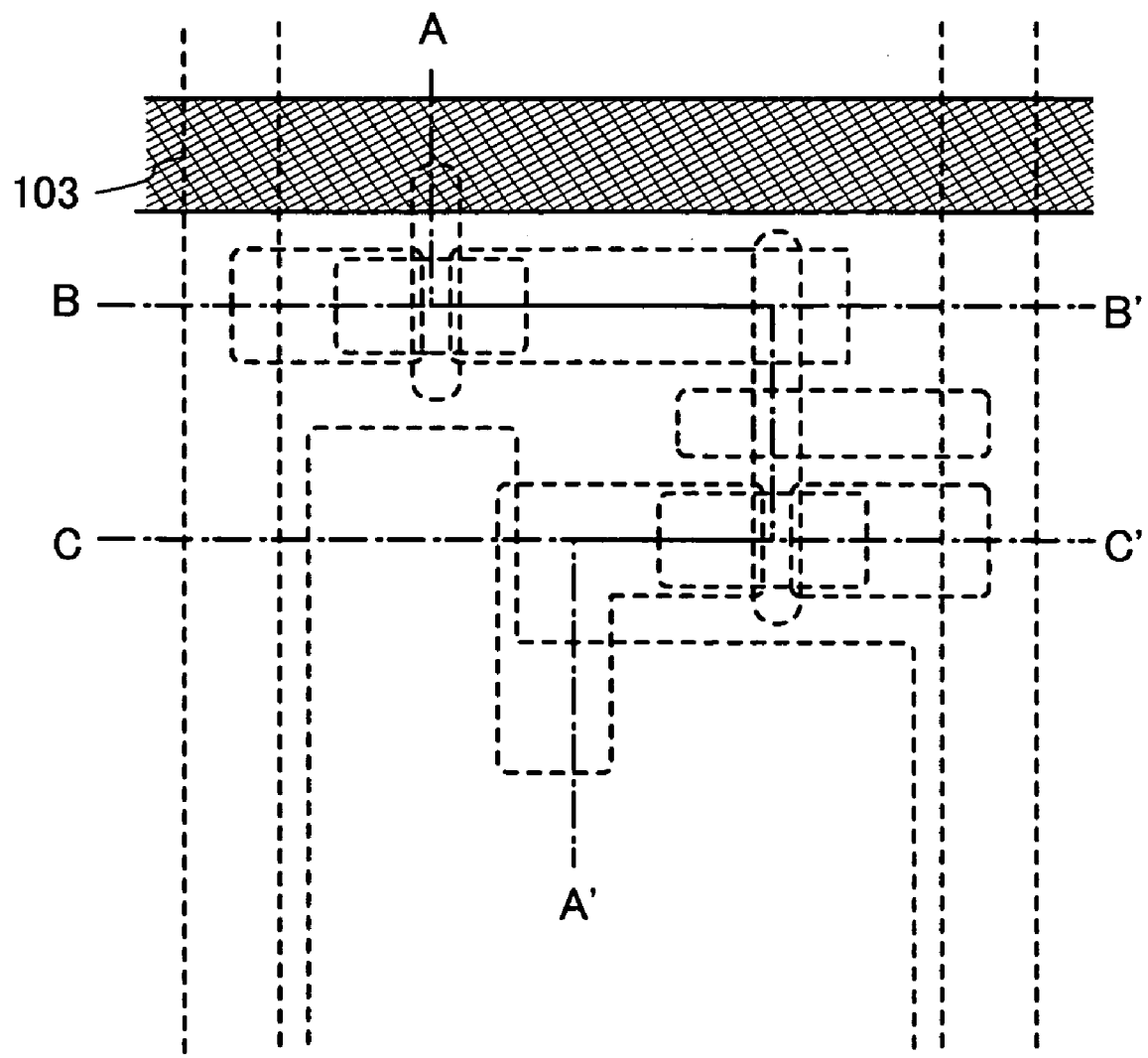
FIG. 2 shows a view describing a method for manufacturing a display device of a certain aspect of the invention.
Figure 3:
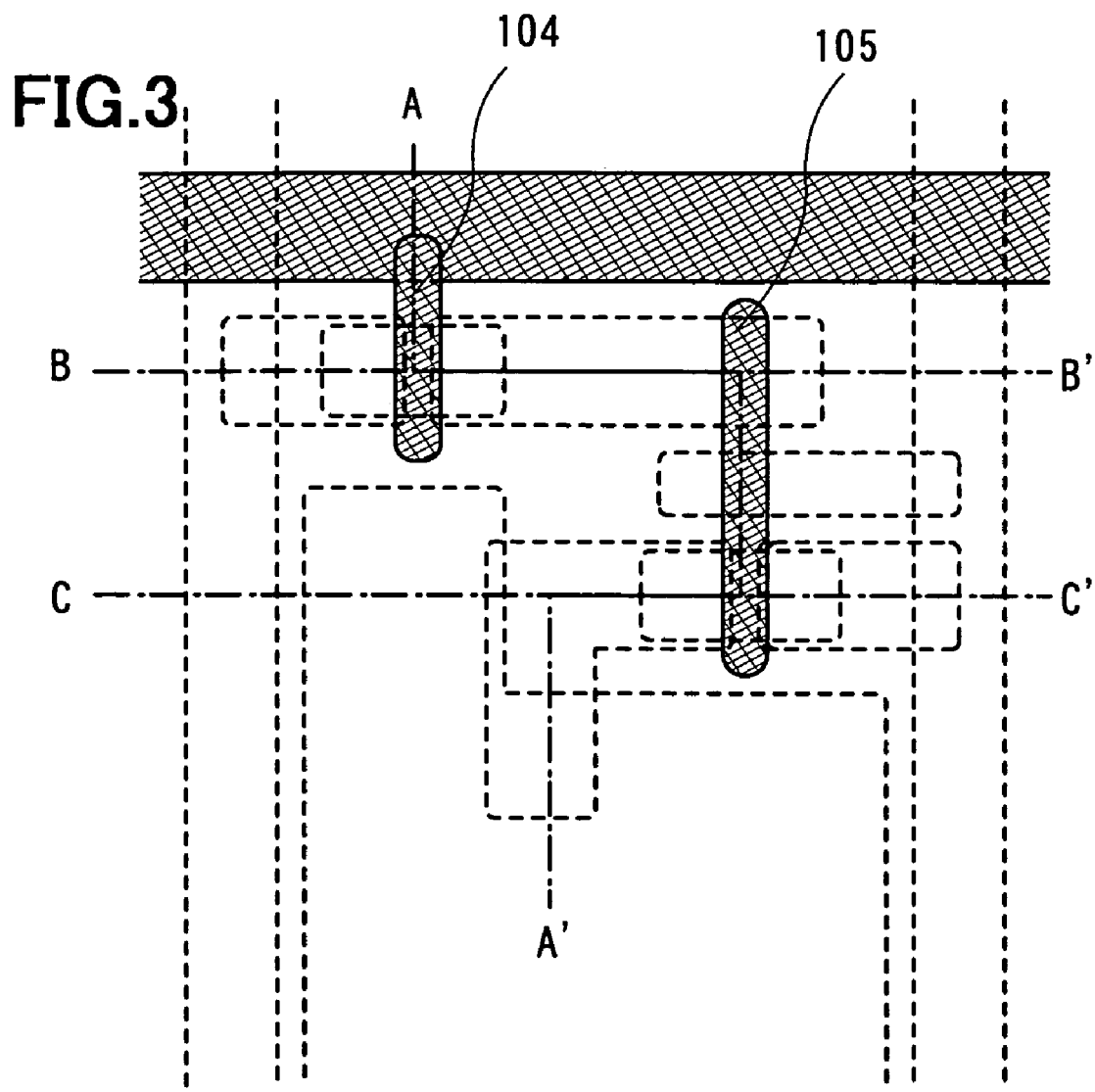
FIG. 3 shows a view describing a method for manufacturing a display device of a certain aspect of the invention.
Figure 4:
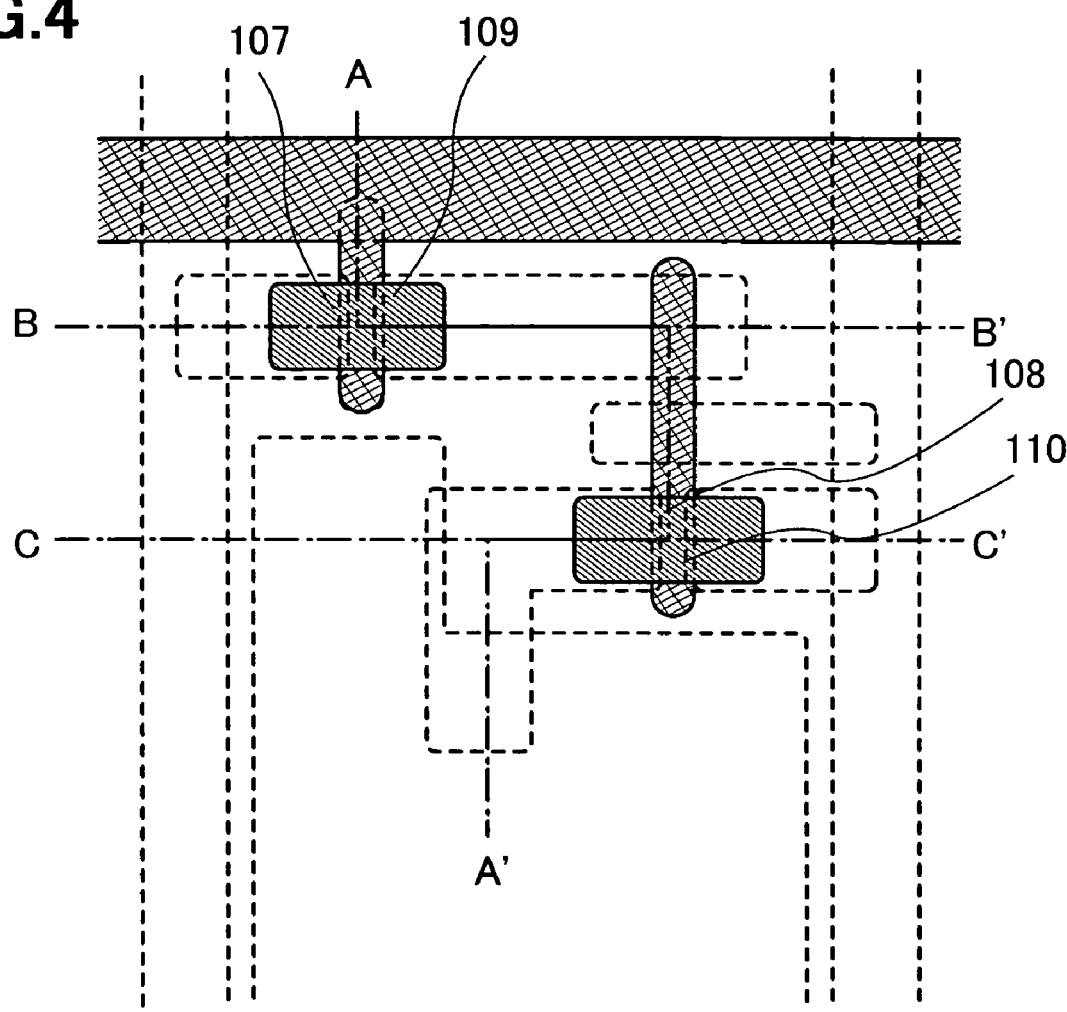
FIG. 4 shows a view describing a method for manufacturing a display device of a certain aspect of the invention.
Figure 5:
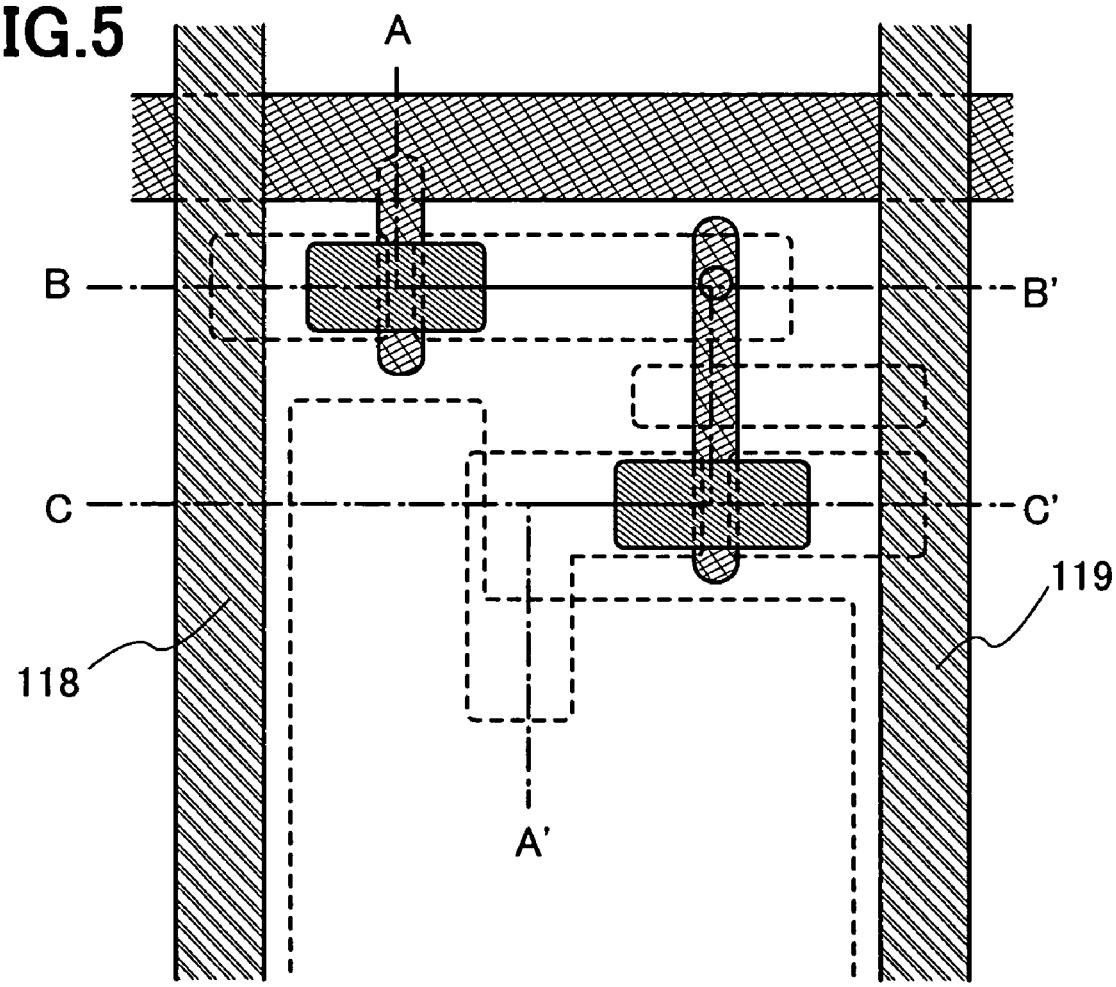
FIG. 5 shows a view describing a method for manufacturing a display device of a certain aspect of the invention.
Figure 6:
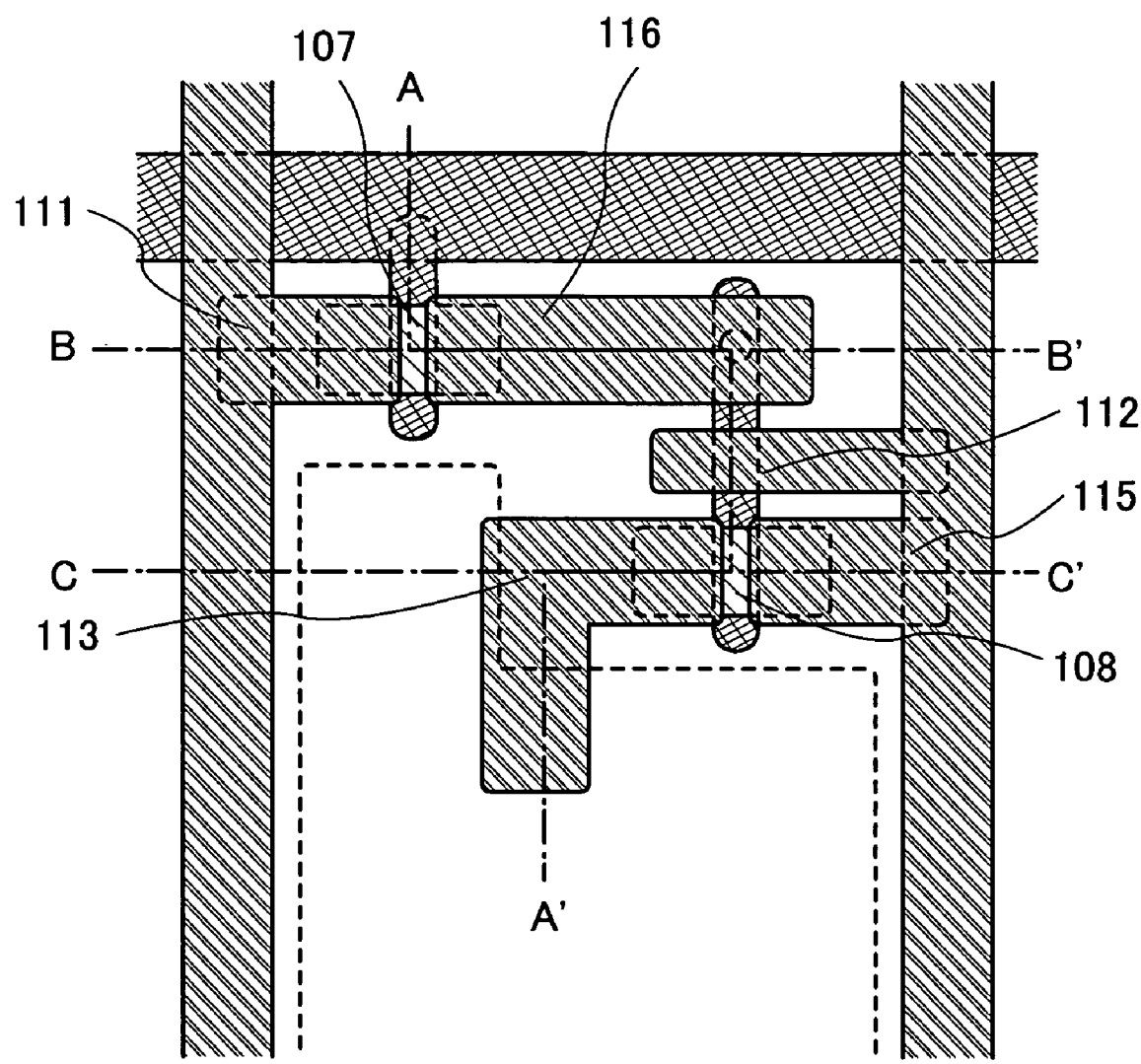
FIG. 6 shows a view describing a method for manufacturing a display device of a certain aspect of the invention.
Figure 7:
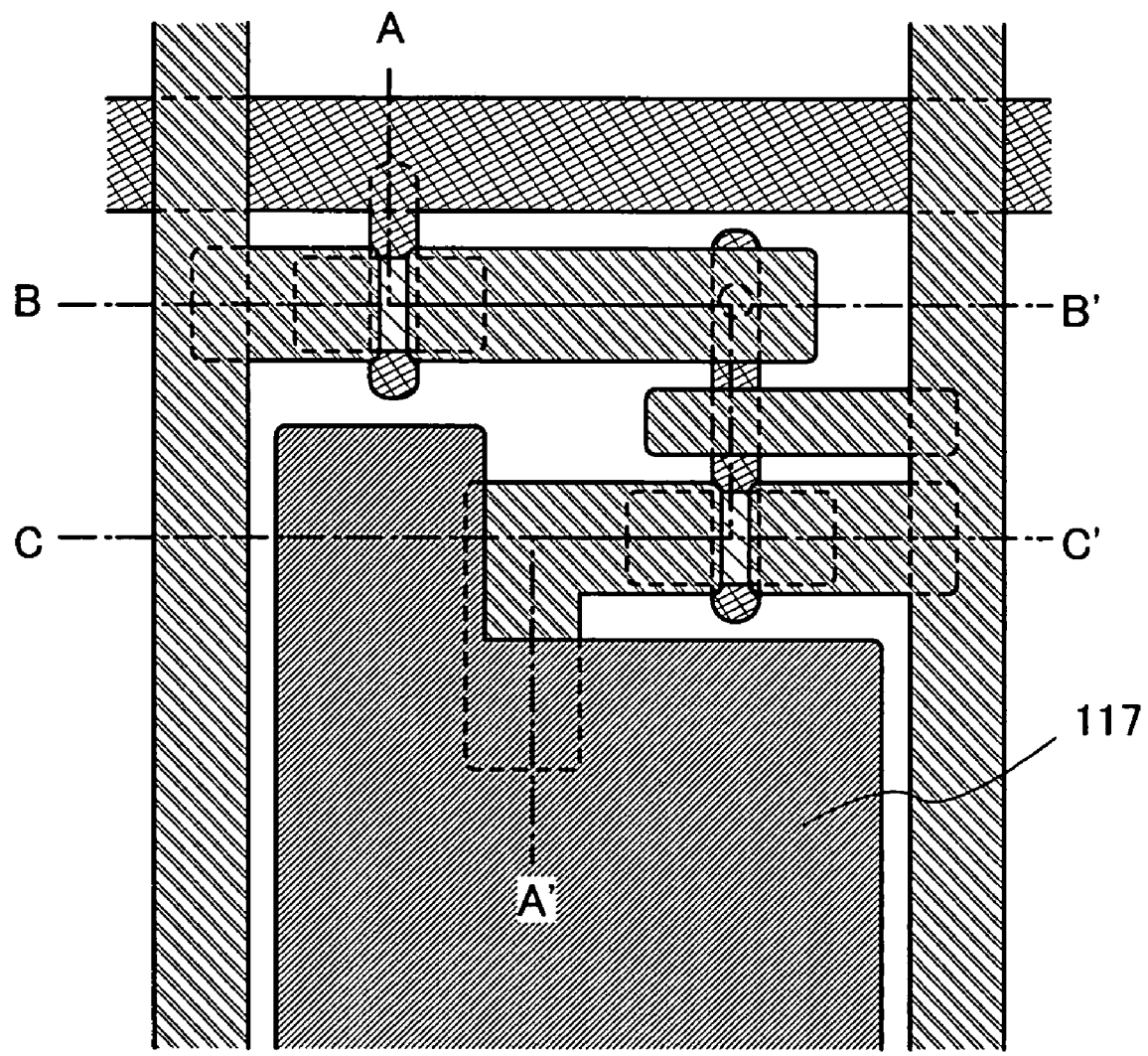
FIG. 7 shows a view describing a method for manufacturing a display device of a certain aspect of the invention.
Figure 8A:
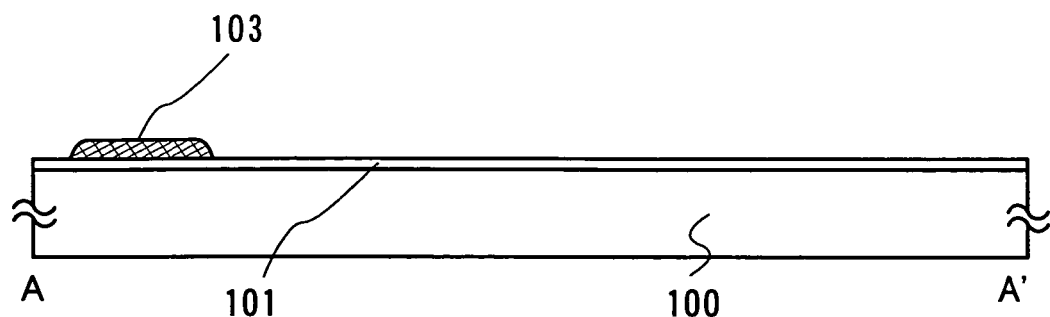
FIGS. 8A to 8C show views describing a method for manufacturing a display device of a certain aspect of the invention.
Figure 8B:
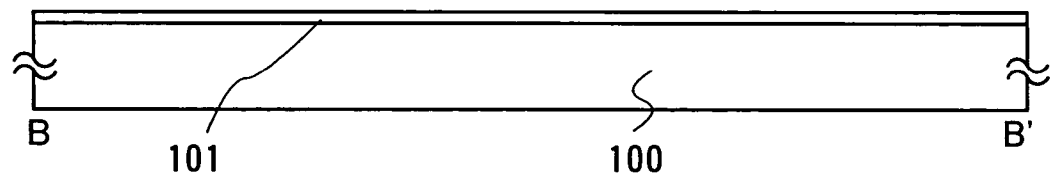
Figure 8C:
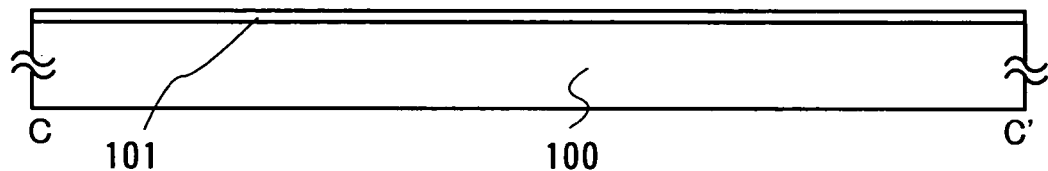
Figure 9A:
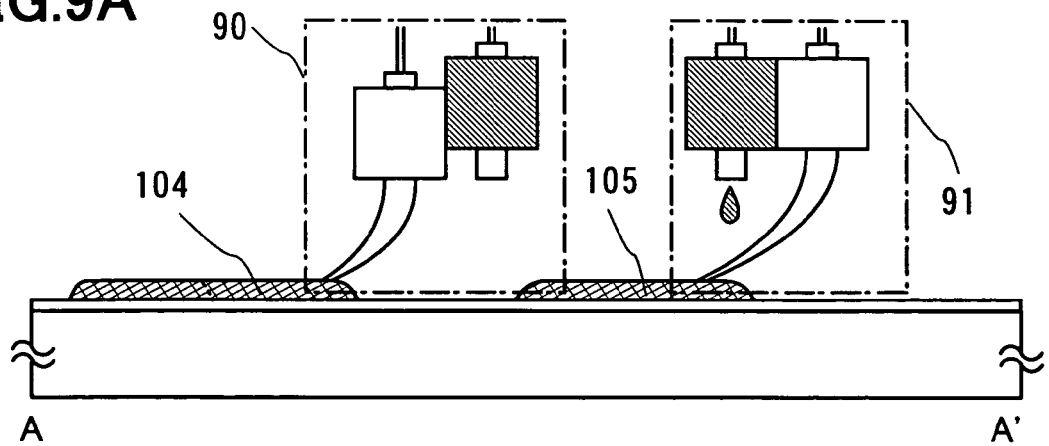
FIGS. 9A to 9C show views describing a method for manufacturing a display device of a certain aspect of the invention.
Figure 9B:
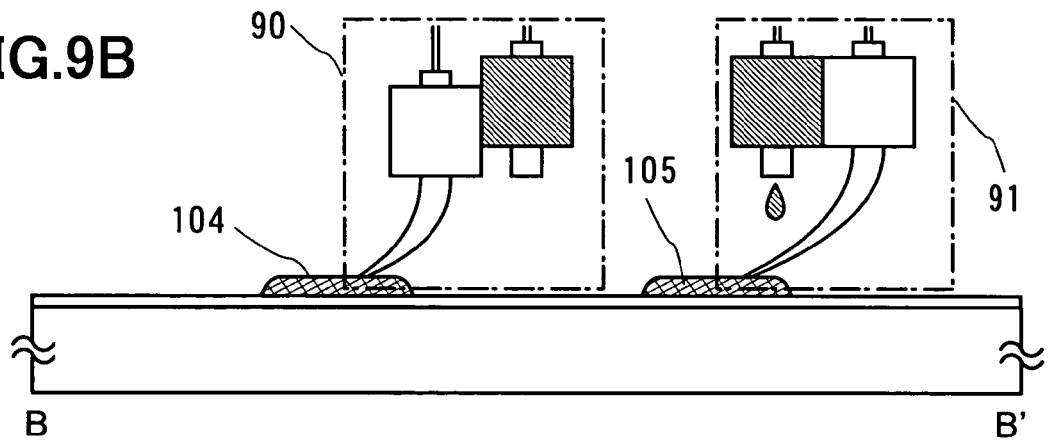
Figure 9C:
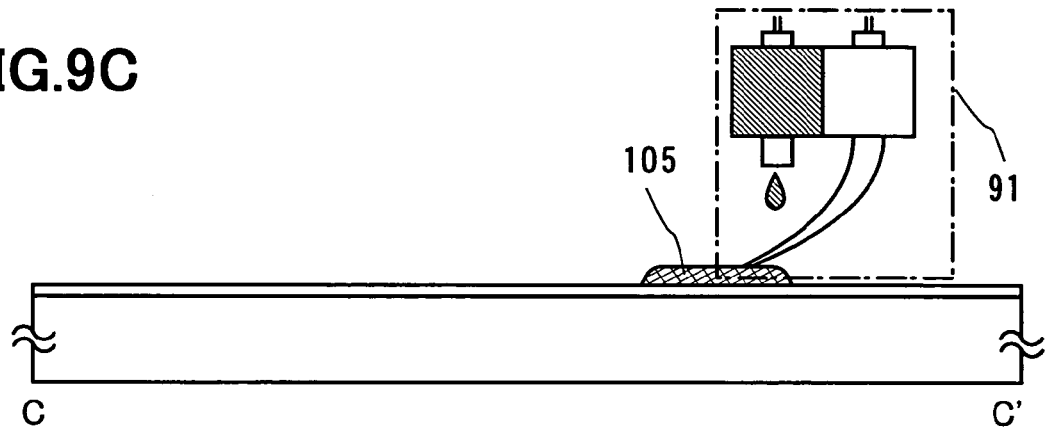
Figure 10A:
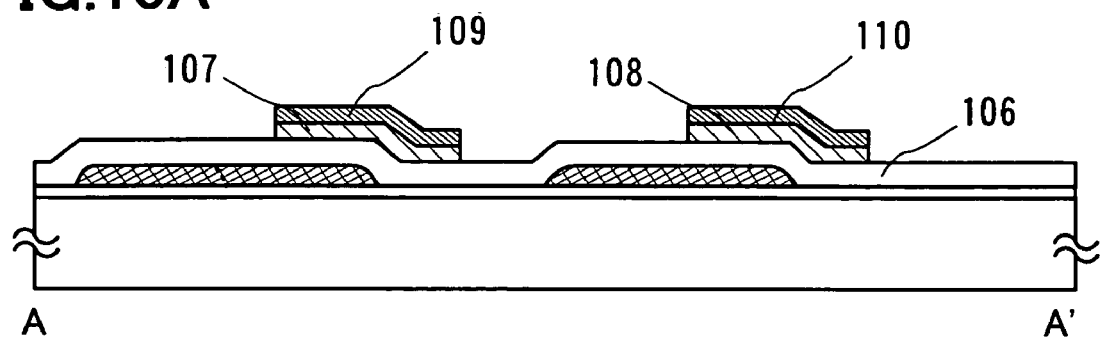
FIGS. 10A to 10C show views describing a method for manufacturing a display device of a certain aspect of the invention.
Figure 10B:
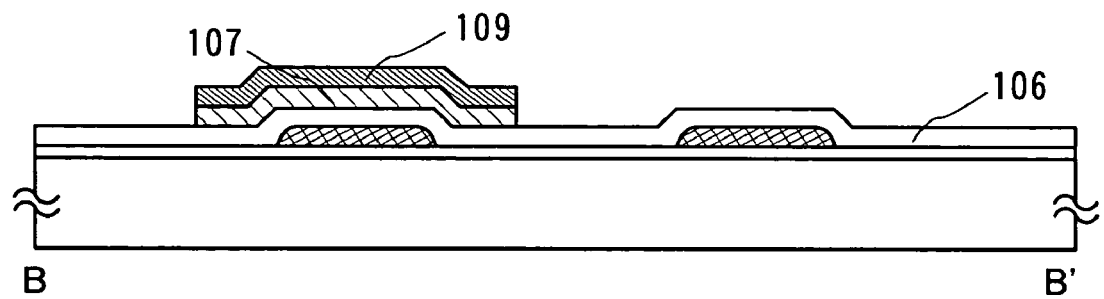
Figure 10C:
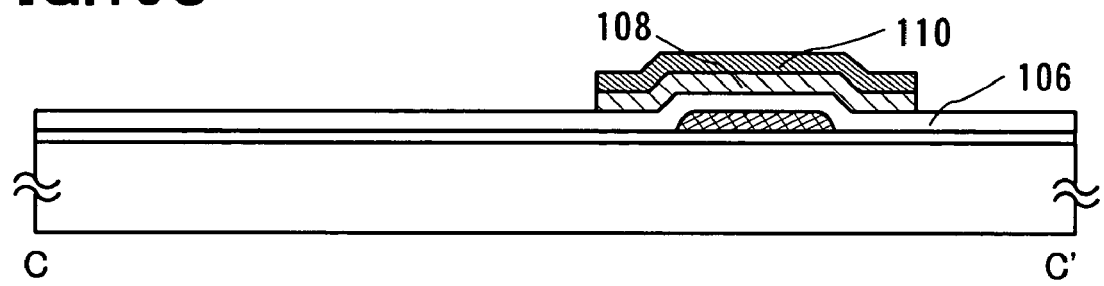
Figure 11A:
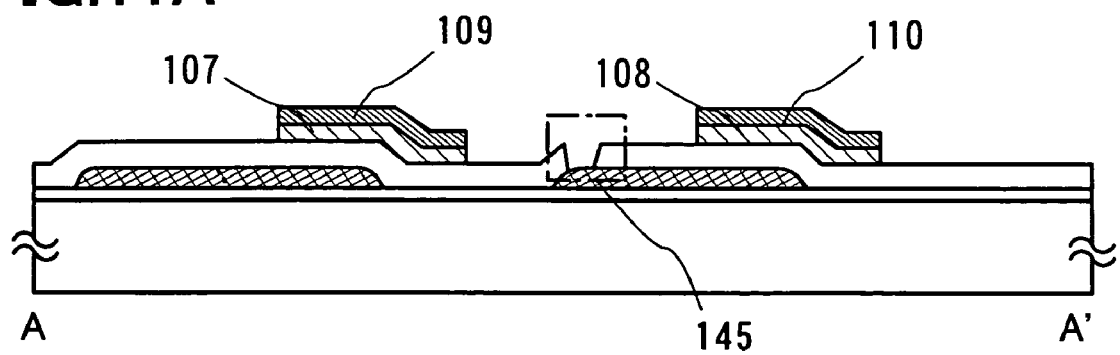
FIGS. 11A to 11C show views describing a method for manufacturing a display device of a certain aspect of the invention.
Figure 11B:
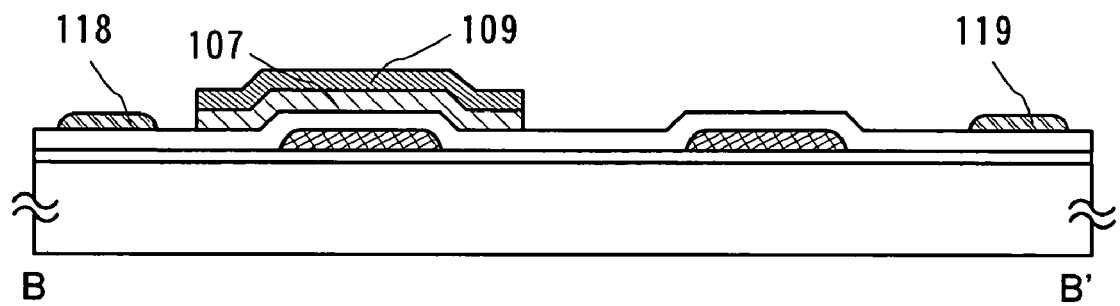
Figure 11C:
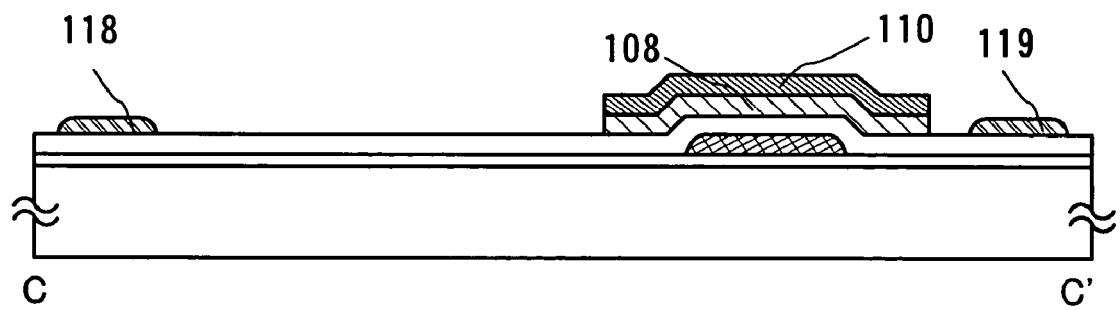
Figure 12A:
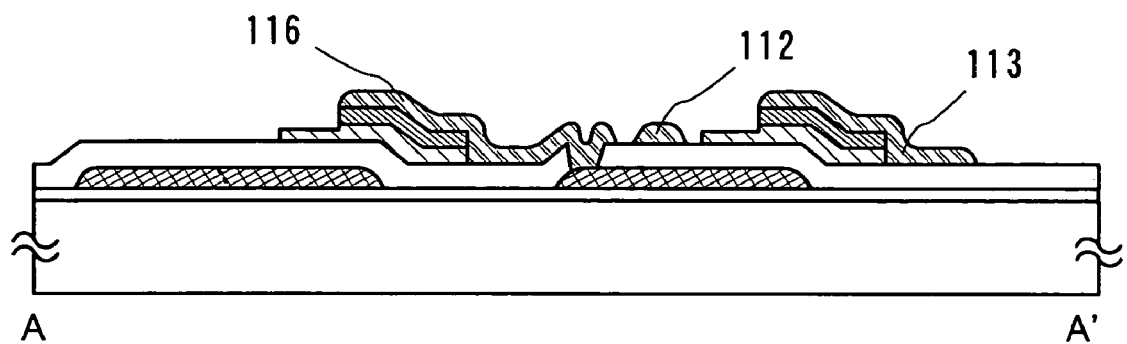
FIGS. 12A to 12C show views describing a method for manufacturing a display device of a certain aspect of the invention.
Figure 12B:
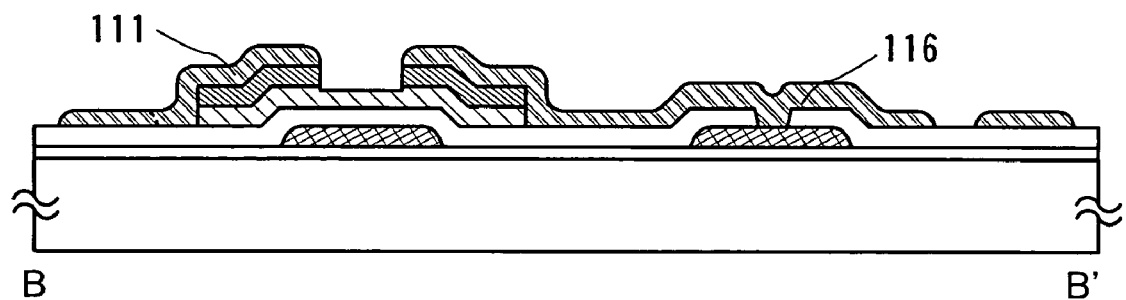
Figure 12C:
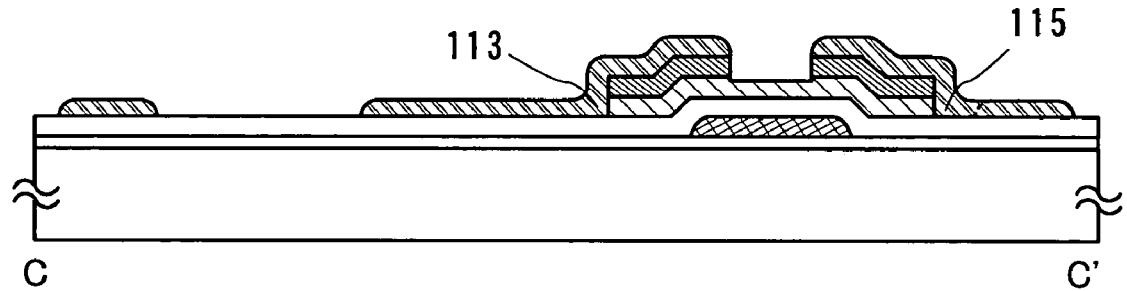
Figure 13A:
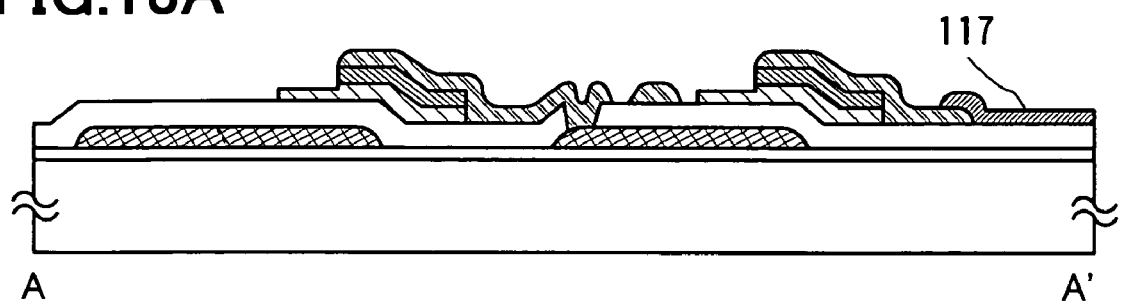
FIGS. 13A to 13C show views describing a method for manufacturing a display device of a certain aspect of the invention.
Figure 13B:
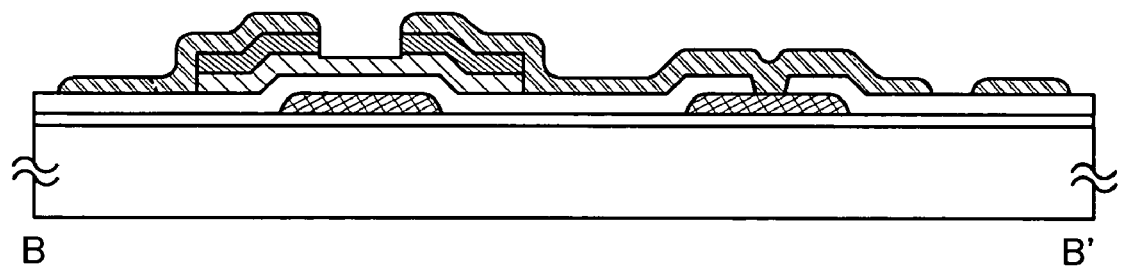
Figure 13C:
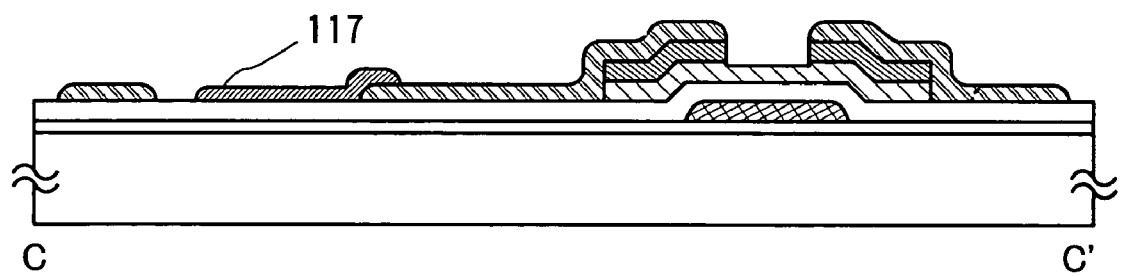

Then, another shape means methods are shown in FIGS. 1C and 1D. FIGS. 1C and 1D shows examples in which a shape portion is formed integrally in a nozzle. In FIG. 1C, reference numeral 70 denotes a formation region; 30, a head portion; 32, a control means of a droplet discharge means; and 38, a nozzle, and a shape portion 34 which is a shape means is provided for the nozzle 38. The shape portion 34 has a tube shape with space 33 therein. A droplet having a pattern formation material discharged from the nozzle 38 is controlled through the space 33 inside the shape portion 34, and is shaped to have the shape of a droplet 31 and attached to the formation region. The shape of the droplet 31 can be freely controlled by the size of the space 33 inside the shape portion 34; therefore a minute pattern can be also formed.

As shown in FIG. 1D, a minute linear pattern 41 can be also formed over a formation region 80 by sequentially discharging a droplet and scanning the droplet discharge method in a direction 46. A desired pattern can be freely formed without depending on the size of an outlet by controlling the size of the space 33 inside the shape portion 34 and the scanning speed. Thus, various patterns can be formed by selecting and providing the shape of the shape portion 34 as if replacing pen tips. Naturally, FIGS. 1A and 1B can be combined with FIGS. 1C and 1D. A minute pattern can be formed effectively since a pattern can be shaped accurately.

A shape or a material of the shape portion can be freely selected according to a pattern desired to be formed in a form region. Either a hard material or a soft material may be used. A material may be selected according to the viscosity of a material from which a pattern desired to be shaped is formed. At this time, when a droplet is physically shaped, it is desirable that a material which forms a pattern and a material in the shape portion do not react with each other. However, a pattern can be also formed over the formation region by making a material in contact with the shape portion to change its physicality.

Shape means and the shape portion can formed of silicon oxide, silicon nitride, silicon oxynitride, aluminum oxide, aluminum nitride, aluminum oxynitride, or another inorganic mateiral; acrylic acid, methacrylic acid, and a derivative thereof; a heat-resistanct polymer such as polyimide, aromatic polyamide, polybenzimidazole; another organic material; inorganic siloxane including the Si—O—Si bond among compounds including silicon, oxygen and hydrogen formed by using a siloxane system material as a start material; or an organic siloxane system material in which hydrogen over silicon is substituted by an organic group such as methyl or phenyl. Since it is a means only for shaping a droplet, a conductive material such as a metal or an insulating material such as a resin may be used. Alternatively, fiber or the like may be also used. Considering providing for a device, a material which is relatively light-weight and easy to be shaped is preferable. When a minute wiring or the like is desired to be drawn, a nanotube material such as a carbon nanotube may be also used. As an ultrafine carbon fiber formed of a carbon nanotube or the like, graphite nano-fiber, carbon nano-fiber, tube-shaped graphite, carbon nano-corn, corn-shaped graphite or the like can be used.

In the invention, a desired pattern can be freely drawn and formed as if drawing a picture with a paint brush or a pen without depending on the shape or the size of an outlet which discharges a droplet over a formation region with a shape means.

[Embodiment Mode 2]

Embodiment mode according to the present invention is described with reference to FIGS. 2 to 7. FIGS. 8A to 8C, FIGS. 9A to 9C, FIGS. 10A to 10C, FIGS. 11A to 11C, FIGS. 12A to 12C and FIGS. 13A to 13C. In more detail, a method for manufacturing a display device to which the invention is applied is described. First, a method for manufacturing a display device having a channel etch type thin film transistor to which the invention is applied is described. Each of FIGS. 2 to 7 corresponds to FIGS. 8A to 8C, FIGS. 9A to 9C, FIGS. 10A to 10C, FIGS. 11A to 11C, FIGS. 12A to 12C and FIGS. 13A to 13C. FIGS. 2 to 7 show top views of pixel portions of display devices, and FIGS. A in FIGS. 8 to 13 show cross-sectional views taken along lines A–A' in FIGS. 2 to 7. Likewise, FIGS. B in FIGS. 8 to 13 show cross-sectional views taken along lines B–B' in FIGS. 2 to 7, and FIGS. C in FIGS. 8 to 13 show cross-sectional views taken along lines C–C' in FIGS. 2 to 7.

A base film 101 which improves adhesion is formed over a substrate 100 as base pretreatment. Then, a gate wiring layer 103 is formed as shown in FIG. 2 and FIGS. 8A to 8C. A glass substrate formed of barium borosilicate glass, alumino borosilicate glass, or the like, a quartz substrate, a silicon substrate, a metal substrate, a stainless steel substrate, or a heat-resistant plastic substrate which can withstand a processing temperature in this process is used as the substrate 100. In addition, the surface of the substrate 100 may be polished by a CMP method or the like so that it is planarized. Note that an insulating layer may be formed over the substrate 100. The insulating layer is formed by using an oxide or nitride material containing silicon by a known method such as a CVD method, a plasma CVD method, a sputtering method, or a spin coating method to be a single layer or a lamination layer. The insulating layer may not be formed, but it is effective in blocking a contaminant or the like caused by the substrate 100 and the like. In the case of forming a base layer to prevent contamination from the glass substrate, the base film 101 is formed as base pretreatment for the gate wiring layer 103 to be formed thereover by a droplet discharge method.

Figure 16:
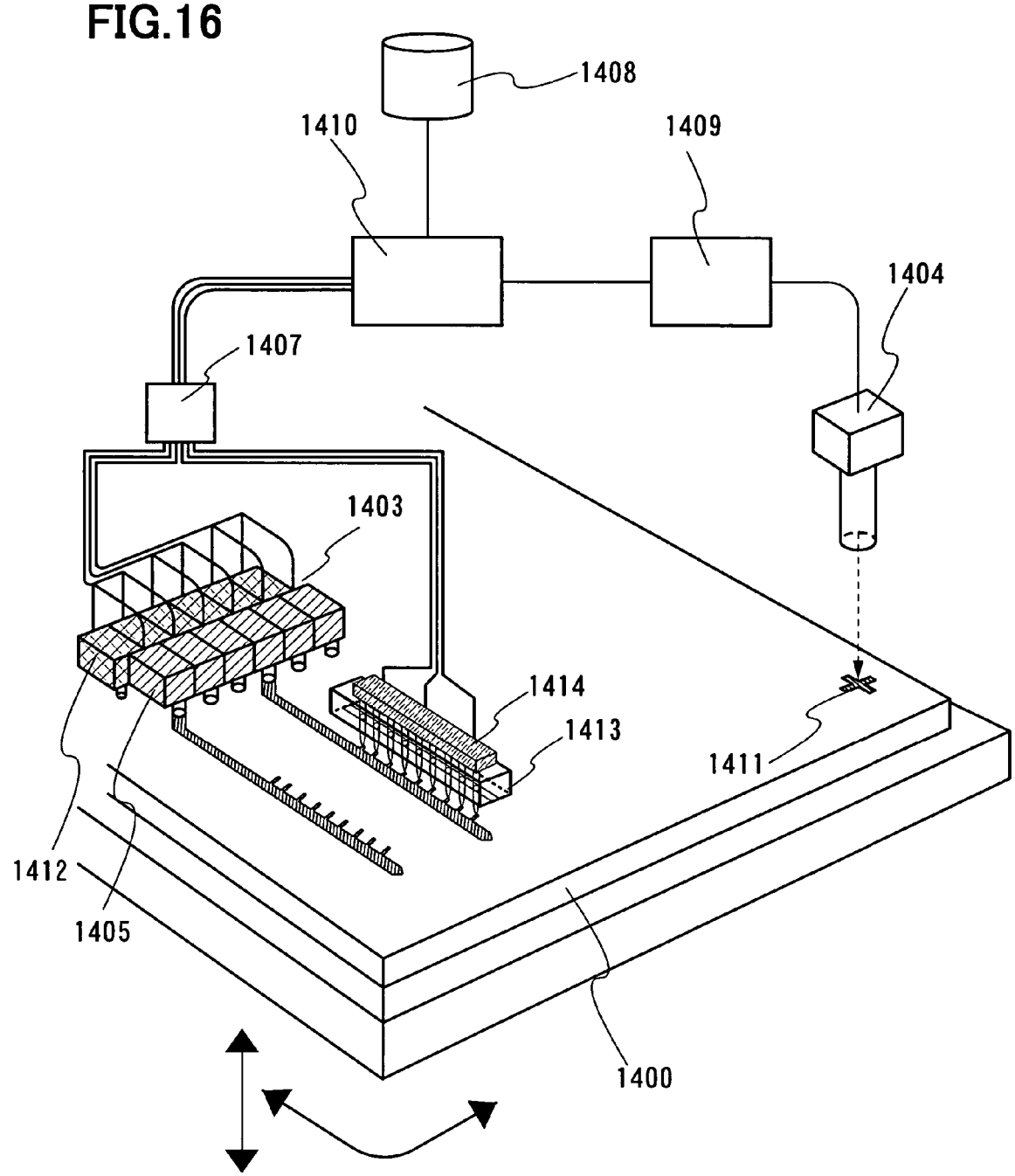
FIG. 16 shows a figure for describing a structure of a droplet discharge device to which a certain aspect of the invention can be applied.

One mode of a droplet discharge device used for forming a pattern is shown in FIG. 16. Each head 1405 and 1412 of a droplet discharge means 1403 is connected to a control means 1407, and is controlled by a computer 1410, so that a preprogrammed pattern can be drawn. The timing of drawing may be determined based on a marker 1411 that is formed over a substrate 1400, for example. Alternatively, a reference point can be determined based on an edge of the substrate 1400. That is detected by an imaging means 1404 such as a CCD, and information on the reference point converted into a digital signal by an image processing means 1409. Then, the digital signal is recognized by the computer 1410, and a control signal is generated and is transmitted to the control means 1407. Naturally, information on a pattern to be formed over the substrate 1400 is stored in a storage medium 1408, and a control signal is transmitted to the control means 1407 based on the information, so that each heads 1405 and 1412 of the droplet discharge means 1403 can be individually controlled. Reference numeral 1413 denotes a shape means and, in this embodiment mode, it is controlled and scanned by the control means 1407.

The sizes of the heads 1405 and 1412 are different each other, and different materials can be simultaneously drawn to have different widths. Each of a conductive material, an organic or inorganic material, and the like can be discharge from one head and drawn. When a droplet is drawn over a wide area, for example, an interlayer film, one material is simultaneously discharged from a plurality of nozzles to improve a throughput, and thus, drawing can be performed. Droplets including a composition discharged from heads 1405 and 1412 are shaped to have desired patterns by the shape means 1413. In this embodiment mode, the example in which the heads 1405 and heads 1412 included in the droplet discharge means 1403 and the shape means 1413 are separately scanned is shown. However, as described in Embodiment Mode 1, the heads may be provided to be adjacent to each other or to be integrally formed. When a large-sized substrate is used, the head 1405 can freely scan over the substrate in a direction indicated by an arrow, and a region to be drawn can be set freely. Thus, a plurality of the same patterns can be drawn over one substrate.

The base film 101 formed as the base pretreatment in this embodiment can be formed by a sol-gel method such as a dip coating method, a spin coating method, a droplet discharge method, an ion plating method, an ion beam method, a CVD method, a sputtering method, an RF magnetron sputtering method, a plasma thermal spraying method, a plasma spray method, or an anodic oxidation method. In addition, the substance does not need to have continuity as a film depending on its formation method. A solvent may be baked or dried when it is necessary to be removed in the case of forming the base film 101 by an application method such as a dip coating method or a spin coating method.

The case of forming a $TiO_X$ (typically, $TiO_2$) crystal having a predetermined crystal structure by a sputtering method as the base film 101 is described in this embodiment mode. Sputtering is performed using metal titanium (a titanium tube) as a target and using an argon gas and oxygen. Further, a He gas may be introduced. $TiO_X$ may be formed while heating a film formation chamber or a substrate provided with an object to be treated.

The thus formed $TiO_X$ may be a very thin film.

Further, the base film 101 formed of a metal material such as Ti (titanium), W (tungsten), Cr (chromium), Ta (tantalum), Ni (nickel), or Mo (molybdenum), or oxide thereof may be formed by a sputtering method, an evaporation method or the like.

The base film 101 may be formed to be from 0.01 nm to 10 nm in thickness. It may be formed to be very thin and need not necessarily have a layer structure. When the base film has conductivity since high melting point metal material, or a 3d transition element is used, it is preferable to carry out either of the following two steps on the base film which is in except for a conductive layer formation region.

As the first method, the base film 101 which is not overlapped with the gate wiring layer 103 is insulated; thereby forming an insulating layer. In other words, the base film 101 which is not overlapped with the gate wiring layer 103 is oxidized and insulated. When the base film 101 is oxidized and insulated in this way, it is preferable to form the base film 101 to be from 0.01 nm to 10 nm in thickness; thus, the base film can be easily oxidized. Note that oxidization may be performed by exposing to an oxygen atmosphere or by performing heat treatment. Additionally, an oxygen plasma method, an $O_3$ oxidation method, a $UV$-$O_3$ oxidation method or the like can be also used.

As the second method, a formation region of the gate wiring layer 103 (a region over which a composition including a conductive material is discharged) is selectively formed. The base film 101 may be selectively formed over a substrate using a droplet discharge method, or the base film 101 may be formed over the entire face followed by being etched and removed selectively using the gate wiring layer 103 as a mask. When this step is employed, there is no limitation on a thickness of the base film 101.

Alternatively, a method for performing plasma treatment on a formation region (formation face) can be employed as another base pretreatment. The plasma treatment is performed with air, oxygen, or nitrogen used as a treatment gas, with pressure from several tens of Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set from $1 \times 10^{10}$ m$^{-3}$ to $1 \times 10^{14}$ m$^{-3}$, so-called corona discharge or glow discharge. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve the adhesion of a pattern to be formed by a droplet discharge method with a formation region thereof. An organic material (an organic resin material) (polyimide or acrylic) or a material in which a skeleton is configured by the bond of silicon (Si) and oxygen (O), and which contains at least hydrogen as a substituent, or which contains at least one of fluorine, an alkyl group, and aromatic hydrocarbon as a substituent may be used.

The gate wiring layer 103 is formed by a droplet discharge method (see FIG. 2 and FIGS. 8A to 8C). In the invention, among conductive layers configuring a display device, a gate wiring layer or a capacitor wiring layer which are across between pixels and are formed with relatively wide line widths, and a gate electrode layer formed with a relatively narrow line width within a pixel, and the like are separately formed. By forming a conductive layer having a wide line width such as a gate wiring layer or a capacitor wiring layer first by adjusting the diameter of an outlet, a gate wiring layer and a capacitor wiring layer which have high-reliability and low resistance can be formed without disconnection or the like.

The gate wiring layer 103 is formed by using a droplet discharge means. The droplet discharge means is a general term for the one having a means of discharging a droplet such as a nozzle having an outlet of a composition or a head equipped with one nozzle or plural nozzles. The diameter of the nozzle included in the droplet discharge means is set in the range of from 0.02 µm to 100 µm (favorably, 30 µm or less) and the amount of the composition to be discharged from the nozzle is set in the range of from 0.001 pl to 100 pl (favorably, 0.1 pl or more to 40 pl or less, more favorably, 10 pl or less). The amount of the composition to be discharged increases in proportion to the size of the diameter of the nozzle. Further, it is preferable that the distance between an object to be processed and the outlet of the nozzle is as short as possible in order to drop the droplet on a desired position. Favorably, the distance is set approximately in the range of about from 0.1 mm to 3 mm (more favorably, 1 mm or less).

As for the composition to be discharged from the outlet, a conductive material dissolved or dispersed in a solvent is used. The conductive material corresponds to a fine particle or a dispersant nano-particle of metal such as Ag, Au, Cu, Ni, Pt, Pd, Ir, Rh, W, or Al, sulfide of metal such as Cd or Zn, oxide of Fe, Ti, Si, Ge, Zr, Ba, or the like, or silver halide. In addition, it also corresponds to indium tin oxide (ITO), ITSO formed of indium tin oxide and silicon oxide, organic indium, organotin, zinc oxide, titanium nitride, or the like which is used as a transparent conductive film. However, as for compositions to be discharged from the outlet, it is preferable to use any material of gold, silver, and copper, which is dissolved or dispersed in a solvent, taking a specific resistance value into consideration. It is more preferable to use silver or copper having a low resistance value. When silver or copper is used, a barrier film may be additionally provided as a measure for an impurity. A silicon nitride film or nickel boron (NiB) can be used as the barrier film.

In addition, a particle in which a conductive material is coated with other conductive materials to be a plurality of layers may be used. For example, a three-layer structure particle in which copper is coated with nickel boron (NiB), which is further coated with silver may be used. As for such solvents, esters such as butyl acetate and ethyl acetate; alcohols such as isopropyl alcohol and ethyl alcohol; organic solvents such as methyl ethyl ketone and acetone; or the like may be used. The viscosity of the composition is preferably 20 mPa·S or less. This is because the composition is prevented from drying or the composition is smoothly discharged from the outlet. The surface tension of the composition is preferably 40 mN/m or less. However, the viscosity of the composition and the like may be appropriately adjusted in accordance with a solvent to be used and use application. For example, the viscosity of a composition in which ITO, organic indium, or organotin is dissolved or dispersed in the solvent may be set from 5 mPa·S to 20 mPa·S, the viscosity of a composition in which silver is dissolved or dispersed in the solvent may be set from 5 mPa·S to 20 mPa·S, and the viscosity of a composition in which gold is dissolved or dispersed in the solvent may be set from 5 mPa·S to 20 mPa·S.

The conductive layer may be formed by laminating a plurality of conductive materials. In addition, the conductive layer may be formed by a droplet discharge method using silver as a conductive material; thereafter, it may be plated with copper or the like. Plating may be performed by electroplating or a chemical (electroless) plating method. Plating may be performed by soaking a substrate surface into a container filled with a solution having a plating material. A solution having a plating material may be applied so that the solution flows over the substrate surface with the substrate placed obliquely (or vertically). When the plating is performed by applying a solution with the substrate placed vertically, there is an advantage of miniaturizing a process apparatus.

The diameter of a particle of the conductive material is preferably as small as possible for the purpose of preventing clogged nozzles and manufacturing a high-definition pattern, although it depends on the diameter of each nozzle, a desired shape of a pattern, and the like. Preferably, the diameter of the particle of the conductive material is 0.1 µm or less. The composition is formed by a known method such as an electrolyzing method, an atomizing method, a wet reducing method, or the like, and the particle size thereof is typically about from 0.01 µm to 10 µm. However, when a gas evaporation method is employed, a nanomolecule protected with a dispersant is minute, about 7 nm. When each surface of particles is covered with a coating, the nanoparticles do not cohere in the solvent and are uniformly dispersed in the solvent at a room temperature, and show a property similar to that of liquid. Accordingly, it is preferable to use a coating.

When the step of discharging the composition is performed under low pressure, the solvent of the composition is evaporated during a period from discharging the composition until the composition lands on an object to be processed, and thus, later steps of drying and baking the composition can be both omitted. It is preferable to perform the step under low pressure, since an oxide film or the like is not formed on the surface of the conductive material. After discharging the composition, either or both steps of drying and baking is/are performed. Each step of drying and baking is a step of heat treatment. For example, drying is performed for three minutes at 100° C. and baking is performed for from 15 minutes to 60 minutes at temperatures of from 200° C. to 350° C., each of which has a different purpose, temperature, and period. The steps of drying and baking are performed at normal pressure or under low pressure by laser light irradiation, rapid thermal annealing, a heating furnace, or the like. Note that the timing of the heat treatment is not particularly limited. The substrate may be heated to favorably perform the steps of drying and baking. The temperature of the substrate at the time depends on a material of the substrate or the like, but it is typically from 100° C. to 800° C. (preferably, from 200° C. to 350° C.). According to the steps, nanoparticles are made in contact with one another and fusion and welding are accelerated by hardening and shrinking a peripheral resin as well as evaporating the solvent in the composition or chemically removing the dispersant.

A continuous wave or pulsed wave gas laser or solid laser may be used for laser light irradiation. An excimer laser, a YAG laser, and the like can be given as the gas laser, and a laser using a crystal of YAG or YVO$_4$ which is doped with Cr, Nd, or the like can be given as the solid laser. Note that it is preferable to use a continuous wave laser in relation to the absorptance of laser light. Moreover, a so-called hybrid laser irradiation method which combines a pulsed wave and a continuous wave may be used. However, it is preferable that the heat treatment by laser light irradiation is instantaneously performed within several microseconds to several tens of seconds so that the substrate 100 is not damaged, depending on heat resistance of the substrate 100. Rapid thermal annealing (RTA) is carried out by raising the temperature rapidly and heating for several microseconds to several minutes using an infrared lamp or a halogen lamp emitting light of from ultraviolet to infrared in an inert gas atmosphere. Since the treatment is performed instantaneously, only a thin film on a top surface can be substantially heated and a lower layer film is not affected. In other words, even a substrate having low heat resistance such as a plastic substrate is not affected.

In addition, the above-described step of forming the base film 101 is carried out as base pretreatment for a conductive layer to be formed by using a droplet discharge method; however, this treatment step may be carried out also after forming the gate wiring layer 103.

After forming the gate wiring layer 103 by discharging a composition by a droplet discharge method, the surface may be planarized by pressing it with pressure to enhance its planarity. As a pressing method, projections may be smoothed by scanning a roller-shaped object on the surface, or the surface may be vertically pressed with a flat plate-shaped object. Heat treatment may be performed at the time of pressing. Alternatively, a projection portion of the surface may be removed with an air knife by softening or melting the surface with a solvent or the like. A CMP method may be also used for polishing the surface. This step may be applied for planarizing a surface when projections are generated by a droplet discharge method.

Then, a gate electrode layer 104 and a gate electrode layer 105 are formed. The gate electrode layer 104 is formed in contact with the gate wiring layer 103 (see FIG. 3). The gate electrode layer 104 can be shaped by forming the gate wiring layer 103, and then, by drawing a minute wiring with a shape means 90 of the invention. In this embodiment mode, after forming the gate wiring layer 103, a part of the gate wiring layer is expanded with a shape portion included in the shape means 90 before the gate wiring layer 103 is fully solidified, thereby being formed as the gate electrode layer 104 (see FIGS. 9A to 9C). In this way, when the gate wiring layer 103 is formed integral with the gate electrode layer 104 within one layer, they can be formed without boundary resulting in lower resistance. On the other hand, the gate electrode layer 105 is shaped by newly discharging a conductive material and forming the material so as to have a thin line with a shape means 91. Needless to say, the gate electrode layer 104 may be also shaped by newly discharging a conductive material with a shape means without being formed integrally with the gate wiring layer 103, in the same manner as the gate wiring layer 105. In this case, the above-mentioned base pretreatment may be also performed on a formation region where the gate electrode layers 104 and 105 are formed. The gate electrode layer 104 may be formed after performing ultraviolet irradiation treatment as the base pretreatment on a region where the gate wiring layer 103 and the gate electrode layer 104 are in contact with each other in order to enhance adhesion. According to the invention, the line width of the gate wiring layer is formed to be 10 μm or more to 40 μm or less, the line width of the gate electrode layer is formed to be 5 μm or more to 20 μm or less, preferably 0.3 μm or more and 10 μm or less; therefore, a wiring in which the line width of the gate wiring layer is twice that of the gate electrode layer.

The gate wiring layer 103 and the gate electrode layers 104 and 105 may be simultaneously formed as well. In that case, shape means having different shape portions are respectively installed in each of a plurality of heads included in the droplet discharge device, and the gate wiring layer 103 and the gate electrode layers 104 and 105 are simultaneously formed by scanning the shape means once. For example, only a nozzle is scanned in a region where the gate wiring layer 103 is formed, and a nozzle head installed with a shape means having a shape portion so as to shape a minute pattern is scanned in a region where the gate electrode layers 104 and 105 are formed. A conductive material is continuously discharged from an outlet which forms the gate wiring layer 103, and a conductive material is discharged from an outlet which forms the gate electrode layers 104 and 105 when the head is scanned in the form region, and shaped with a shape means. Patterns having different line widths can be formed even in this way, and a throughput can be improved.

Subsequently, a gate insulating layer 106 is formed over the gate electrode layers 104 and 105 (see FIG. 4 and FIGS. 10A to 10C). The gate insulating layer 106 may be formed of a known material such as an oxide or nitride material of silicon, and may be a lamination layer or a single layer. In this embodiment mode, it may be a lamination layer of three layers of a silicon nitride film, a silicon oxide film, and a silicon nitride film, or may be a single layer of them or of a silicon oxynitride film, or a lamination layer of two layers. A silicon nitride film having minute film quality is preferably used. In the case of using silver, copper, or the like for the conductive layer formed by a droplet discharge method, and forming a silicon nitride film or a NiB film thereover as a barrier film, the silicon nitride film or the NiB film is effective in preventing an impurity from diffusing and in planarizing the surface. Note that a rare gas element such as argon is preferably included in a reactive gas and is preferably mixed in the insulating film to be formed in order to form a minute insulating film with few gate leak current at a low film-formation temperature.

Then, semiconductor layers are formed. The semiconductor layers having one conductivity type may be formed if necessary. In this embodiment mode, N-type semiconductor layers 109 and 110 are laminated as semiconductor layers having one conductivity type with semiconductor layers 107 and 108 (see FIG. 4 and FIG. 10A to 10C). Additionally, an NMOS structure of an N-channel type TFT by forming an N-type semiconductor layer, a PMOS structure of a P-channel type TFT by forming a P-type semiconductor layer, and a CMOS structure of an N-channel type TFT and a p-cahnnel TFT can be manufactured. An N-channel type TFT and a P-channel type TFF can be also formed by adding an element which imparts conductivity by doping to form an impurity region in the semiconductor layers in order to impart conductivity.

The semiconductor layers may be formed with a known method (a sputtering method, an LPCVD method, a plasma CVD method or the like). Although a material for the semiconductor layers are not limited, they may be preferably formed of silicon, a silicon germanium (SiGe) alloy or the like.

As a material of the semiconductor layers, an amorphous semiconductor (hydrogenated amorphous silicon as a representative example) or a crystalline semiconductor (polysilicon as a representative example) is used. Examples of polysilicon include a so-called high-temperature polysilicon which uses, as a main material, polycrystalline silicon to be formed through process temperatures of 800° C. or higher, so-called low-temperature polysilicon which uses, as a main material, polycrystalline silicon to be formed at process temperatures of 600° C. or lower and crystalline silicon which is crystallized by adding, for example, an element which promotes crystallization.

Further, as other substances, a semi-amorphous semiconductor or a semiconductor containing a crystalline phase in a part of a semiconductor film can be also used. The term "semi-amorphous semiconductor" herein means a semiconductor having an intermediate structure of an amorphous structure and a crystalline structure (including single crystals and poly-crystals) and having a stable third state with respect to free energy, and is a crystalline having a short-range order and a lattice distortion. Typically, it is a semiconductor layer, including silicon as a main component, with a lattice distortion, in which Raman spectrum is shifted to a low frequency side from 520 cm$^{-1}$. Further, at least 1% by atom of hydrogen or a halogen is contained therein to terminate a dangling bond. On this occasion, such semiconductor as described above is referred to as a semi-amorphous semiconductor (hereinafter, referred to "SAS" in short). The SAS is also referred to as a so-called microcrystal semiconductor (microcrystalline silicon as a representative example).

The SAS can be obtained by decomposing a silicide gas by means of glow discharge (plasma CVD). As for a representative silicide gas, SiH$_4$ is mentioned. As for other gases, Si$_2$H$_6$, SiH$_2$Cl$_2$, SiHCl$_3$, SiCl$_4$, SiF$_4$ and the like can be used. Additionally, GeF$_4$ and F$_2$ can be mixed. Formation of the SAS can be facilitated by using these silicide gases diluted with hydrogen or a mixture of hydrogen and at least one rare gas of helium, argon, krypton and neon. A dilution ratio of hydrogen to the silicide gas is, for example, preferably in the range of from 2 times to 1000 times in terms of flow volume ratio. Although the formation of the SAS by glow discharge decomposition is preferably performed under low pressure, the formation can be also performed under atmospheric pressure by utilizing an electric discharge. As a representative example, the formation may be performed in the pressure range of from 0.1 Pa to 133 Pa. A power supply frequency for generating the glow discharge is in the range of from 1 MHz to 120 MHz and preferably, in the range of from 13 MHz to 60 MHz. A high-frequency power supply may be appropriately set. A temperature for heating the substrate is preferably 300° C. or lower and the temperature in the range of from 100° C. to 200° C. is also permissible. As for impurity elements to be incorporated mainly at the time of forming a film, an impurity derived from an atmospheric-component such as oxygen, nitrogen or carbon is preferably used in concentrations of $1\times10^{20}$ cm$^{-3}$ or less and, particularly, the concentration of oxygen is $5\times10^{19}$ cm$^{-3}$ or less and preferably $1\times10^{19}$ cm$^{-3}$ or less. Further, stability of the SAS can be enhanced by promoting the lattice distortion through allowing a rare gas element such as helium, argon, krypton or neon to be contained, to thereby obtain a favorable SAS. An SAS layer formed of a hydrogen system gas may be laminated over an SAS layer formed of a fluorine-based gas as a semiconductor layer.

When a crystalline semiconductor layer is used as the semiconductor layer, a known method (a laser crystallization method, a heat crystallization method, a heat crystallization method using an element promoting crystallization such as nickel, or the like) may be employed as a method for manufacturing the crystalline semiconductor layer. In the case of not introducing an element promoting crystallization, hydrogen is released until hydrogen concentration contained in an amorphous silicon film becomes $1\times10^{20}$ atoms/cm$^3$ or less by heating the amorphous silicon film for one hour at a temperature of 500° C. in nitrogen atmosphere before irradiating the amorphous silicon film with laser light. This is because the amorphous silicon film containing much hydrogen is damaged when it is irradiated with laser light.

There is no particular limitation on a method for introducing a metal element into the amorphous semiconductor layer as long as it is a method capable of making the metal element exist on the surface of or inside the amorphous semiconductor layer. For example, a sputtering method, a CVD method, a plasma treating method (including a plasma CVD method), an adsorption method, or a method for applying a metal salt solution can be employed. Among them, the method using a solution is simple and easy and is useful in terms of easy concentration adjustment of the metal element. It is preferable that an oxide film is formed by UV light irradiation in oxygen atmosphere, a thermal oxidation method, treatment with ozone water or hydrogen peroxide including a hydroxyl radical, or the like in order to improve wettability on the surface of the amorphous semiconductor layer and to spread an aqueous solution over the entire surface of the amorphous semiconductor layer.

In addition, heat treatment and laser light irradiation may be combined to crystallize the amorphous semiconductor layer. The heat treatment and the laser light irradiation may be independently performed plural times.

A crystalline semiconductor layer may be also formed directly over the substrate with a linear plasma method. Alternatively, a crystalline semiconductor layer may be also selectively formed over a substrate with a linear plasma method.

An organic semiconductor using an organic material may be used as a semiconductor. A low molecular weight material, a high molecular weight material, or the like is used for the organic semiconductor, and in addition, a material such as an organic pigment, a conductive high molecular weight material can be used.

In this embodiment mode, an amorphous semiconductor is used as a semiconductor. A semiconductor layer is formed and then, an N-type semiconductor layer is formed with a plasma CVD method or the like as a semiconductor layer having one conductivity type.

Then, the semiconductor layer and the N-type semiconductor layer are simultaneously pattern-processed by using a mask including an insulating material such as a resist or polyimide to from the semiconductor layers 107 and 108, and the N-type semiconductor layers 109 and 110 (see FIG. 4 and FIGS. 10A to 10C). The mask can be formed by selectively discharging a composition. A resin material such as an epoxy resin, an acrylic resin, a phenol resin, a novolac resin, a melamine resin or an urethane resin is used for the mask. The mask is formed by a droplet discharge method by using an organic material such as benzocyclobutene, parylene, flare or polyimide having transmitting properties; a compound material formed by polymerization of a siloxane system polymer; a composition material containing a water-soluble homopolymer and a water-soluble copolymer; or the like. Alternatively, a commercially available resist material including a photosensitive agent may be also used and, for example, a typical positive type resist such as a novolac resin and a naphthoquinonediazide compound which is a photosensitive agent, a negative type resist such as a base resin, diphenylsilanediol, an acid generation agent or the like, may be also used. The surface tension and viscosity of any material is appropriately adjusted by adjusting the solvent concentration or adding a surface-active agent.

A mask including an insulating material such as a resist, polyimide or the like is formed again by using a droplet discharge method, and a through-hole 145 is formed in a part of the gate insulating layer 106 by etching-processing. Thus, a part of the gate electrode layer 105 which is disposed under the gate insulating layer 105 is exposed. Either plasma etching (dry etching) or wet etching may be adopted for the etching-process; however, plasma etching is suitable for processing a large area substrate. As the etching gas, a fluorine-based gas or a chlorine-based gas such as $CF_4$, $NF_3$, $Cl_2$, $BCl_3$ may be used, and an inert gas such as He or Ar may be appropriately added. When etching-processing of atmospheric pressure electric discharging is adopted, local electric discharging is possible; therefore, a mask layer is not necessarily formed over the entire surface of the substrate.

After removing the mask, a source wiring layer 118 and a power supply line 119 are formed by a droplet discharge method (see FIG. 5 and FIGS. 11A to 11C). The step of forming the source wiring layer 118 and the power supply line 119 can be also performed as the step of forming the above-mentioned gate wiring layer 103.

As a conductive material to form the source wiring layer 118 and the power supply line 119, a composition which mainly contains a particle of a metal such as Ag (silver), Au (gold), Cu (copper), W (tungsten), Al (aluminum) can be used. Alternatively, indium tin oxide (ITO), ITSO which includes indium tin oxide and silicon oxide, organic indium, organotin, zinc oxide, titanium nitride and the like, which have light-transmitting properties may be combined.

Source or drain electrode layers 111, 113, 115 and 116, and a conductive layer 112 are formed by discharging a composition which includes a conductive material, and shaped by a shape means. Then, using the source or drain electrode layers 111, 113, 115 and 116 as a mask, the N-type semiconductor layer is pattern-processed (see FIG. 6 and FIGS. 12A to 12C). Although it is not shown, the above-mentioned base pretreatment step in which a $TiO_x$ film or the like is selectively formed in the region where the source or drain electrode layers 111, 113, 115 and 116, and the conductive layer 112 are formed before forming the source or drain electrode layers 111, 113, 115 and 116, and the conductive layer 112. Thus, the conductive layer can be formed to have preferable adhesion.

The above-mentioned step of forming the base film is performed as base pretreatment for the conductive layer which is formed by using a droplet discharge method, and this treatment step may be also performed after forming the conductive layer. According to the step, reliability of the display device is also enhanced since the adhesion of an interlayer is improved.

The source or drain electrode layers 111 and 115, and the conductive layer 112 are formed to be in contact with the source wiring layer 118 and the power supply line 119 which are formed before; therefore, the source or drain electrode layers 111 and 115, and the conductive layer 112 may be shaped integrally with the source wiring layer 118 and the power supply line 119 by using a shape means as in the case of forming the gate electrode layers 104 and 105. In this embodiment mode, the source or drain electrode layer 111 is formed by the shape means before the source wiring layer 118 is fully cured, and the conductive layer 112 and the source or drain electrode layer 115 are formed by the shape means before the power supply line 119 is cured. When a material such as an extra fine nanotube is used for a shape portion, a further minute pattern can be formed.

In the through-hole 145 formed in the gate insulating layer 106, the source or drain electrode 116 and the gate electrode layer 105 are electrically connected to each other. The conductive layer 112 forms a capacitor element. As a conductive material which forms the source or drain electrode layers 111, 113, 115 and 116, and the conductive layer 112, a composition which mainly contains a particle of a metal such as Ag (silver), Au (gold), Cu (copper), W (tungsten), or Al (aluminum) can be used. Alternatively, indium tin oxide (ITO) having light-emitting properties, ITSO which includes indium tin oxide and silicon oxide, organic indium, organotin, zinc oxide, titanium nitride and the like may be combined.

In the step of forming the through-hole 145 in a part of the gate insulating layer 106, the through-hole 145 may be formed by using the source or drain electrode layers 111, 113, 115 and 116, and the conductive layer 112 as a mask after forming the source or drain electrode layers 111, 113, 115 and 116, and the conductive layer 112. Then, a conductive layer is formed in the through-hole 145 to electrically connect the source or drain electrode layer 116 and the gate electrode layer 105. In this case, there is an advantage that the step is simplified.

Subsequently, a composition including a conductive material is selectively discharged over the gate insulating layer 106 to form a first electrode layer 117 (see FIG. 7 and FIGS. 13A to 13C). When light is emitted from the substrate 100 side, or a transmissive EL panel is manufactured, the first electrode layer 117 may be formed and baked by forming a predetermined pattern with a composition which contains indium tin oxide (ITO), indium tin oxide containing silicon oxide (ITSO), zinc oxide (ZnO), tin oxide ($SnO_2$) or the like.

Preferably, the first electrode layer 117 is formed of indium tin oxide (ITO), indium tin oxide containing silicon oxide (ITSO), zinc oxide (ZnO) or the like by a sputtering method. More preferably, indium tin oxide containing silicon oxide is used by a sputtering method by using a target in which from 2 weight percent to 10 weight percent of silicon oxide is contained in ITO. In addition to this, an oxide conductive material which contains silicon oxide and in which from 2% to 20% of zinc oxide (ZnO) is mixed in indium oxide may be used. After forming the first electrode layer 117 by a sputtering method, the first electrode layer 117 may be formed to have a desired pattern by etching by forming a mask layer with the use of a droplet discharge method. In this embodiment mode, the first electrode layer 117 is formed of a conductive material having light-transmitting properties by a droplet discharge method, and specifically, it is formed by using indium tin oxide and ITSO including ITO and silicon oxide. Although it is not shown, a $TiO_x$ film may be formed in a region where the first electrode layer 117 is to be formed to perform base pretreatment in the same manner when the gate insulating layer 103 is formed. According to the base pretreatment, adhesion is improved and the first electrode layer 117 can be formed to have a desired pattern.

In this embodiment mode, an example in which the gate insulating layer is formed of a three-layer, namely, a silicon nitride film, a silicon oxynitride (silicon oxide film), silicon nitride film, which includes silicon nitride is previously mentioned. As a preferable structure, the first electrode layer 117 including indium tin oxide containing silicon oxide is formed to be closely in contact with the insulating layer including silicon nitride which is included in the gate insulating layer 106. Accordingly, an effect in which a ratio of light emitted from an electroluminescent layer to the exterior can be increased, is obtained. The gate insulating layer is sandwiched between the gate wiring layer or the gate electrode layer and the first electrode layer, and can also function as a capacitor element.

When a reflective type EL display panel is manufactured in the case of a structure in which emitted light is emitted to the opposite side of the substrate 100 side, a composition which mainly contains particles of a metal such as Ag (silver), Au (gold), Cu (copper), W (tungsten), or Al (aluminum) can be used. Alternatively, the first electrode layer 117 may be formed by forming a transparent conductive film or a conductive film having light reflectivity by a sputtering method, forming a mask pattern by a droplet discharge method, and then combining etching-processing.

The first conductive layer 117 may be cleaned and polished by a CMP method or by cleaning with polyvinyl alcohol-based porous body so that the surface of the first conductive layer 117 is made flat. In addition, after polishing with the use of a CMP method, ultraviolet irradiation or oxygen plasma treatment may be performed on the surface of the first electrode layer 117.

According to the above-mentioned steps, the substrate 100 having a TFT of a bottom gate type (also referred to as "a reverse stagger type") and a TFT for a display panel to which a pixel electrode is connected, is completed. The TFT in this embodiment mode is a channel etch type.

Subsequently, an insulating layer (also referred to as a partition wall or a bank) 121 is selectively formed (see FIGS. 33A to 33C). The insulating layer 121 is formed to have an opening over the first insulating layer 117. In this embodiment mode, the insulating layer 121 is formed over the entire surface, and etched and patterned by using a mask of a resist or the like. When the insulating layer 121 is formed by using a droplet discharge method or a printing method which can form the insulating layer 121 directly and selectively, patterning by etching is not necessarily required. The insulating layer 121 can be also shaped to have a desired shape with a shape means according to the invention. Productivity is improved by selecting the shape of the shape portion such as a columnar shape or a plate shape like a spatular shape according to a dimension of the form region of the insulating layer 121.

The insulating layer 121 can be formed of silicon oxide, silicon nitride, silicon oxynitride, aluminum oxide, aluminum nitride, aluminum oxynitride or another inorganic insulating material; acrylic acid, methacrylic acid, or a derivative thereof; a heat-resistant polymer such as polyimide, polybenzimidazole; inorganic siloxane containing the Si—O—Si bond among a composition including silicon, oxygen and hydrogen, which is formed by using a siloxane system material as a start material; or an organic siloxane-based insulating material in which an organic group such as methyl or phenyl is substituted for hydrogen over silicon. The insulating layer 121 may be also formed by using a photosensitive material such as acrylic or polyimde, or a non-photosensitive material.

After forming the insulating layer 121 by discharging a composition by a droplet discharge method, the surface may be pressed with pressure to planarize in order to enhance its planarity. As a pressing method, projections may smoothed the projections by scanning a roller-shaped object, or the surface may be vertically pressed with a flat plate-shaped object. Alternatively, a projection portion of a surface may be removed with an air knife by softening or melting the surface with a solvent or the like. A CMP method may be also used for polishing the surface. This step may be applied for planarizing a surface when projections are generated by a droplet discharge method. When planarity is enhanced according to the step, display irregularity or the like of a display panel can be prevented; therefore, a high-definition image can be displayed.

Figure 33A:
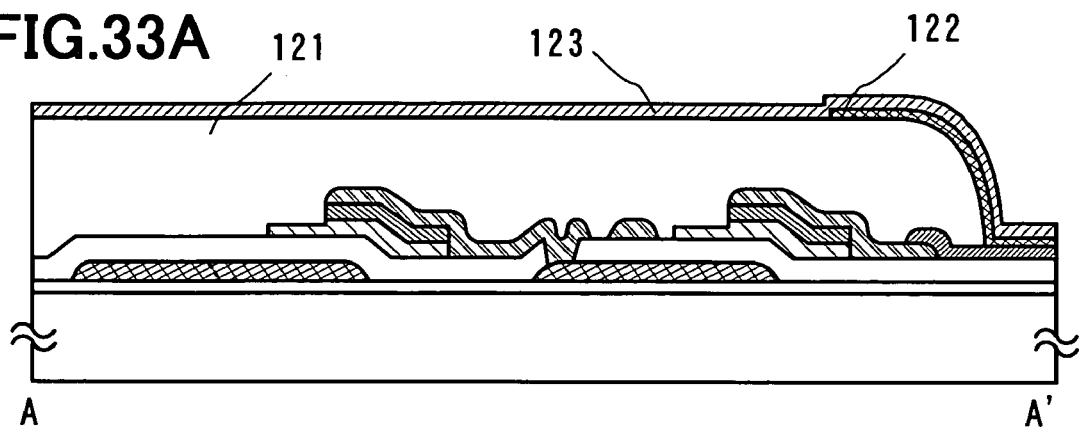
FIGS. 33A to 33C show views describing a method for manufacturing a display device of a certain aspect of the invention.
Figure 33B:
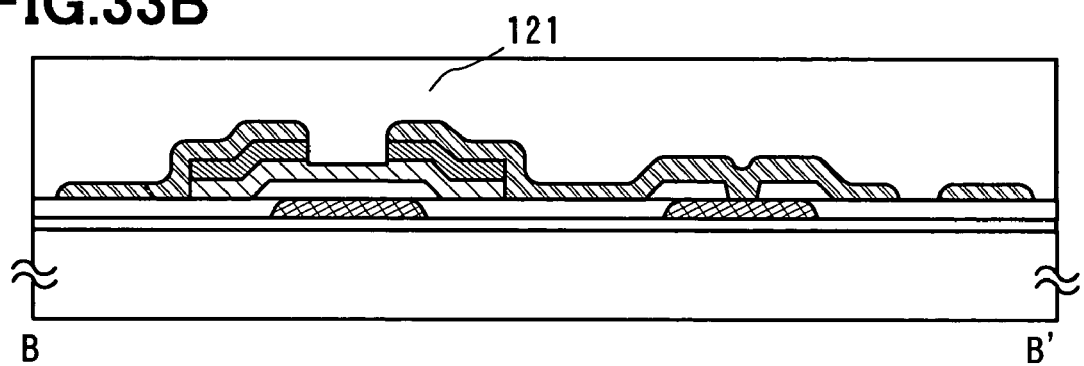
Figure 33C:
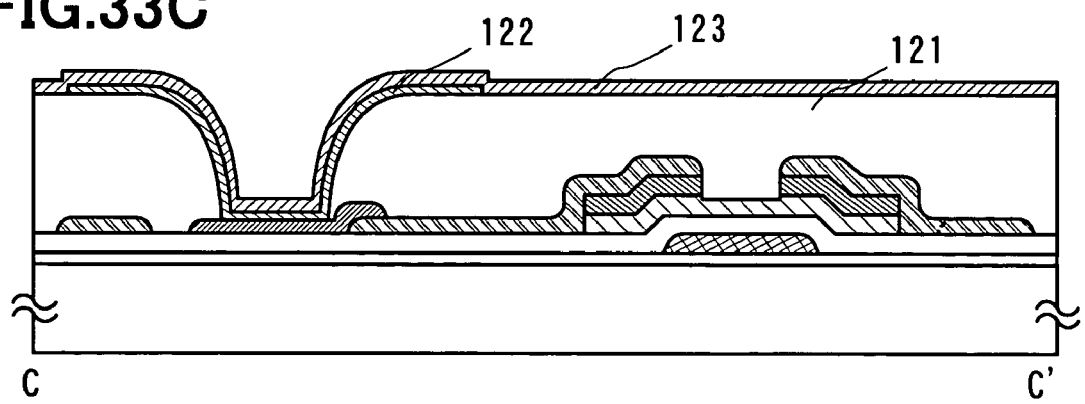

A light emitting element is formed over the substrate 100 having a TFT for a display panel (see FIGS. 33A to 33C).

Before forming an electroluminescent layer 122, moisture in the insulating layer 121 or adsorbed on its surface is removed by performing heat treatment at a temperature of 200° C. under atmospheric pressure. It is preferable to perform heat treatment at temperatures of from 200° C. to 400° C., preferably from 250° C. to 350° C. under low pressure, and to form the electroluminescent layer 122 without being exposed to atmospheric air by a vacuum evaporation method or a droplet discharge method which is performed under low pressure.

As the eletcroluminescent layer 122, materials each indicates the luminescence of red (R), green (G) and blue (B) is selectively formed by an evaporation method using an evaporation mask or the like for each. The materials (low molecular weight materials or high molecular weight materials) each indicates luminescence red (R), green (G) and blue (B) can be formed by a droplet discharge method in the same manner as a color filter. This case is preferable since separate coloring of RGB can be carried out even without using a mask. Then, a second electrode layer 123 is laminated over the electroluminescent layer 122 to complete a display device having a display function using a light emitting element (see FIGS. 33A to 33C). In this embodiment mode, an EL (light emitting) display device is completed since an EL (light emitting) element is used for a display element; however, when a liquid crystal display element using a liquid crystal material of a display element is used, a liquid crystal display device can be completed.

Although it is not shown, it is effective to provide a passivation film so as to cover the second electrode layer 123. As the passivation film, a single layer of an insulating film containing silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide which has more nitrogen content than oxygen content, aluminum oxide, diamond like carbon (DLC) or a nitrogen-containing carbon film ($CN_x$), or a lamination layer in which the insulating films are combined can be used. For example, a lamination layer such as a nitrogen-containing carbon film ($CN_x$) and silicon nitride (SiN) or an organic material can be used, or a lamination layer of a polymer such as a styrene polymer may be used. Alternatively, a material which has a skeleton formed by the bond of silicon (Si) and oxygen (O), and which includes at least hydrogen as a substituent, or at least one of fluorine, alkyl group, and aromatic hydrogen as a substituent may be also used.

At this time, it is preferable to use a film having preferable coverage as the passivation film, and a carbon film, particularly, a DLC film is effective. A DLC film can be formed within the temperatures ranging from a room temperature to 100° C. or lower; therefore, a DLC film can be easily formed over an electroluminescent layer having low heat resistance. A DLC film can be formed by a plasma CVD method (typically, an RF plasma CVD method, a microwave CVD method, an electron cyclotron resonance (ECR) CVD method, a heat filament CVD method or the like), a combustion flame method, a sputtering method, an ion beam evaporation method, a laser evaporation method or the like. A hydrogen gas and a hydrocarbon system gas (for example $CH_4$, $C_2H_2$, $C_6H_6$ or the like) are used as a reactive gas which is used for forming the film. The reaction gas is ionized by glow discharge. The ions are accelerated to collide with a cathode applied with negative self bias. A CN film may be formed by using a $C_2H_2$ gas and an $N_2$ gas as a reactive gas. The DLC film has high blocking effect on oxygen and can suppress the oxidation of the electroluminescent layer. Accordingly, the electroluminescent layer can be prevented from oxidizing during a subsequent sealing step.

Subsequently, a sealant is formed and sealing is performed with a sealing substrate. Then, a flexible wiring substrate may be connected to the gate wiring layer 103 to electrically connect to the exterior. This is the same for the source wiring layer 118.

In this embodiment mode, although the case where a light emitting element is sealed with a glass substrate is shown, sealing treatment is treatment to protect a light emitting element from moisture. Therefore, any of a method in which a light emitting element is mechanically sealed with a cover material, a method in which a light emitting element is sealed with a heat-curable resin or an ultraviolet-light-curable resin, and a method in which a light emitting element is sealed with a thin film such as metal oxide, nitride or the like having high barrier capabilities, can be used. As for the cover material, glass, ceramics, plastic or metal can be used. However, when light is emitted to the cover material side, the cover material needs to have light-transmitting properties. Enclosed space is formed by attaching the cover material to the substrate over which the above-mentioned light emitting element is formed with a sealant such as a heat-curable resin or an ultraviolet-light-curable resin and then by curing the resin with heat treatment or ultraviolet irradiation treatment. It is also effective to provide a hydroscopic absorbent material typified by barium oxide in the enclosed space. The absorbent material may be provided over the sealant or over a partition wall or a peripheral part so as not to block light emitted from a light emitting element. Further, it is also possible to fill the space between the cover material and the substrate over which the light emitting element is formed with a heat-curable resin or an ultraviolet-light-curable resin. In this case, it is effective to add a hydroscopic material typified by barium oxide in the heat-curable resin or the ultraviolet-light-curable resin.

In this embodiment mode, although a single gate structure is shown for a switching TFT, a multi-gate structure such as a double gate structure may be also used.

As described above, in this embodiment mode, a photolithography step using a photomask is not employed, and thus steps can be omitted. In addition, a display panel can be easily manufactured by directly forming various patterns over the substrate with the use of a droplet discharge method even when a glass substrate which is in and after the fifth generation having 1000 mm or more on a side is used.

Moreover, regardless of the size of an outlet which discharges a droplet, a pattern having a desired width can be formed with preferable controllability; therefore, electric characteristics and reliability are improved.

[Embodiment Mode 3]

Figure 14:
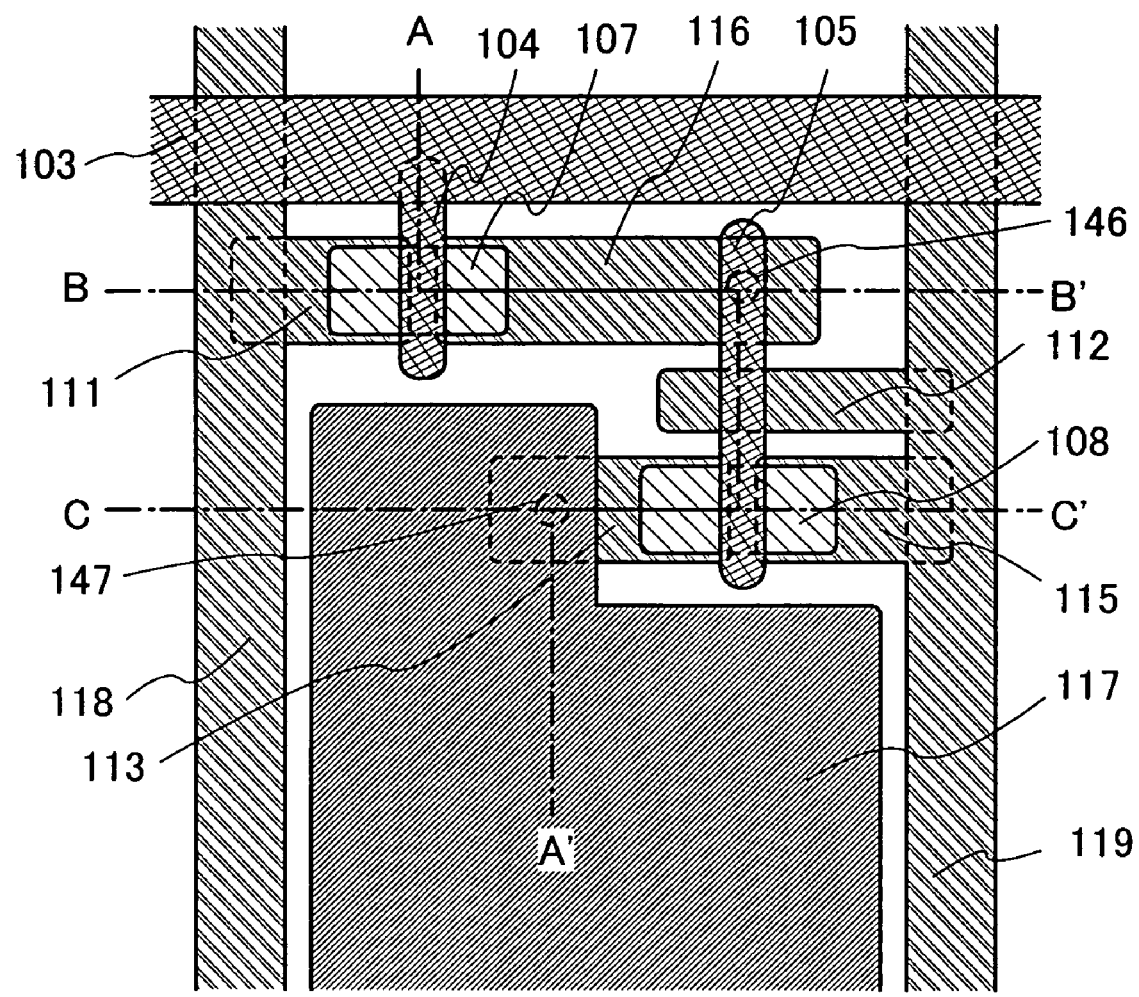
FIG. 14 shows a view describing method for manufacturing a display device of a certain aspect of the invention.
Figure 15A:
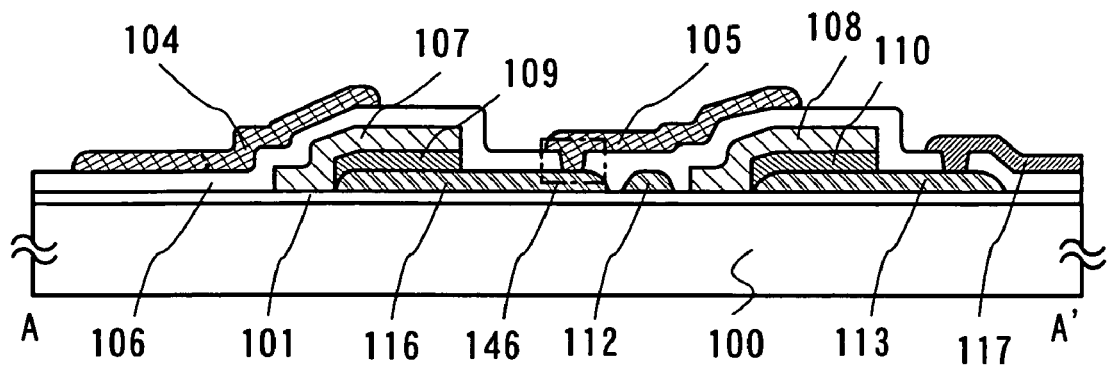
FIG. 15A to 15C show a view describing a method for manufacturing a display device of a certain aspect of the invention.
Figure 15B:
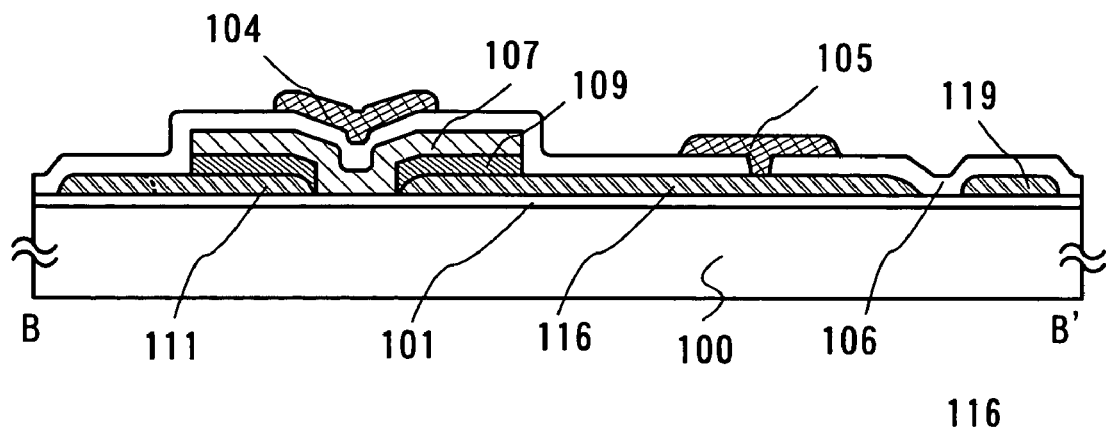
Figure 15C:
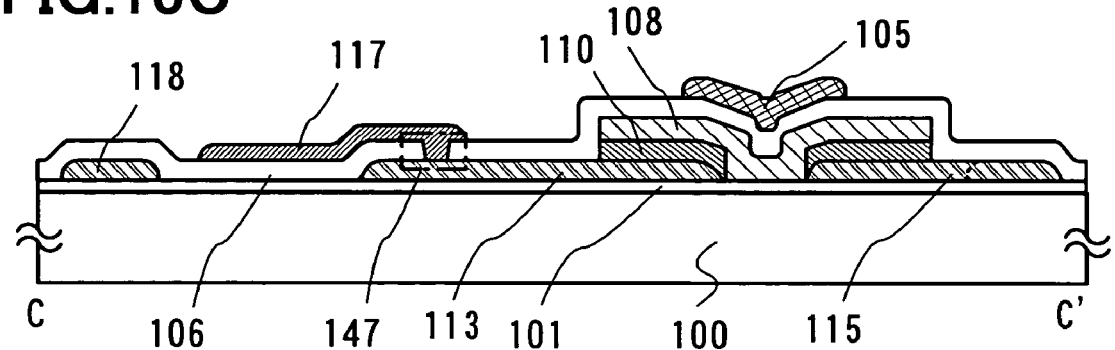

FIG. 14 and FIGS. 15A to 15C are used to describe an embodiment mode of the present invention. In this embodiment mode, a top gate type (a forward stagger type) thin film transistor is used as a thin film transistor instead of the one described in Embodiment Mode 2. Hence, the repeating description of the identical part or a part which a similar function is omitted. Note that FIG. 15A shows a cross-sectional view taken along a line A–A' in FIG. 14, FIG. 15B shows a cross-sectional view taken along a line B–B' in FIG. 14, and FIG. 15C shows a cross-sectional view taken along a line C–C' in FIG. 14.

A source wiring layer 118 and a power supply line 119 are formed over a substrate 100 by discharging a composition including a conductive material by a droplet discharge method. Then, source or drain electrode layers 111, 113, 115 and 116, and a conductive layer 112 are formed with a shape means of the invention. The source or drain electrode layers 111 and 115, and the conductive layer 112 may be formed integrally with the source wiring layer 118 and the power supply line 119 with a shape means as in the case of forming the gate electrode layer 104 and the gate electrode layer 105, since they are formed to be in contact with the source wiring layer 118 and the power supply line 119 which are formed before. In this embodiment mode, the source or drain electrode layer 111 is formed with a shape means before the source wiring layer 118 is fully cured, and the conductive layer 112 and the source or drain electrode layer 115 are formed with a shape means before the power supply line 119 is fully cured. When a material such as an extra fine nanotube is used for a shape portion, a further minute pattern can be formed.

An N-type semiconductor layer is formed over the source or drain electrode layers 111, 113, 115 and 116 and etching is performed with a mask formed of a resist or the like. The resist may be formed by a droplet discharge method. A semiconductor layer is again formed over the N-type semiconductor layer and is patterned with the use of a mask or the like. Thus, N-type semiconductor layers 109 and 110, and semiconductor layers 107 and 108 are formed.

Then, a gate insulating layer 106 is formed with a single layer structure or a laminated structure by using a plasma CVD method, a sputtering method or the like. As a preferable mode in particular, a three-layer laminated body of an insulating layer 106a formed of silicon nitride, an insulating layer 106b formed of silicon oxide, and an insulating layer 106c formed of silicon nitride corresponds to the gate insulating layer.

A mask including an insulator such as a resist or polyimide is formed by using a droplet discharge method to form through-holes 146 and 147 in a part of the gate insulating layer 106 by etching-processing with the use of the mask. Thus, a part of the source or drain electrode layers 113 and 116 which are located under the gate insulating layer 106 is exposed.

A gate wiring layer 103 is formed by discharging a composition including a conductive material. Then, gate electrode layers 104 and 105 are formed with the use of a shape means of the invention. The gate electrode layer 104 may be formed integrally with the gate wiring layer 103 with the use of a shape means as in the case of forming the source or drain electrode layer 111 since it is formed to be in contact with the gate wiring layer 103 which is formed before. In this embodiment mode, the gate electrode layer 104 is formed with a shape means before the gate wiring layer 103 is fully cured. When a material such as an extra fine nanotube is used for a shape portion, further minute pattern can be formed. Lower resistance and improved mobility are achieved since a width in a channel direction of the gate electrode layer 104 can be made narrower.

In the through-hole 146 formed in the gate insulating layer 106, the gate electrode layer 105 and the source or drain electrode layer 116 are electrically connected to each other. A capacitor element is formed of the gate electrode layer 105, the gate insulating layer 106 and the conductive layer 112.

A first electrode layer 117 is formed by a droplet discharge method. Naturally, the first electrode layer can be also shaped to have a desired pattern with a shape means of the invention. The first electrode layer and the source or drain electrode layer 113 are electrically connected to each other in the though-hole 147 formed before.

Subsequently, an insulating layer is formed as in Embodiment Mode 2, and an electroluminescent layer and a second insulating layer are formed after providing an opening over the first electrode layer. Further, a sealant is formed and sealing is performed with a sealing substrate. Then, a flexible wiring substrate may be connected to the gate wiring layer 103 or the source wiring layer 118. As described above, a display panel having a display function can be manufactured.

As described above, in this embodiment mode, steps can be omitted since a photolithography step using a photomask is not employed. In addition, a display panel can be easily manufactured even when a glass substrate which is in and after the fifth generation having 1000 mm or more on a side is used by directly forming various patterns over the substrate with the use of a droplet discharge method.

Moreover, regardless of the size of an outlet which discharges a droplet, a pattern having a desired width can be formed with preferable controllability; therefore, electrical characteristics and reliability are improved.

[Embodiment Mode 4]

Figure 32A:
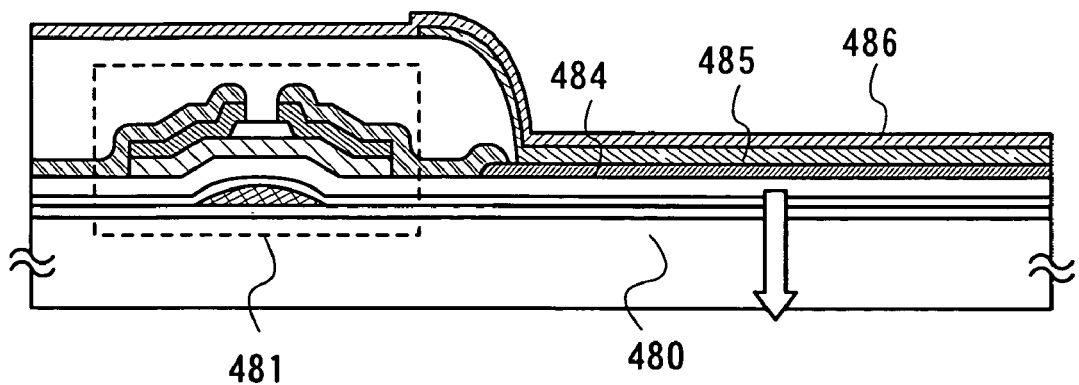
FIGS. 32A to 32C are cross-sectional views of a display device of a certain aspect of the invention.
Figure 32B:
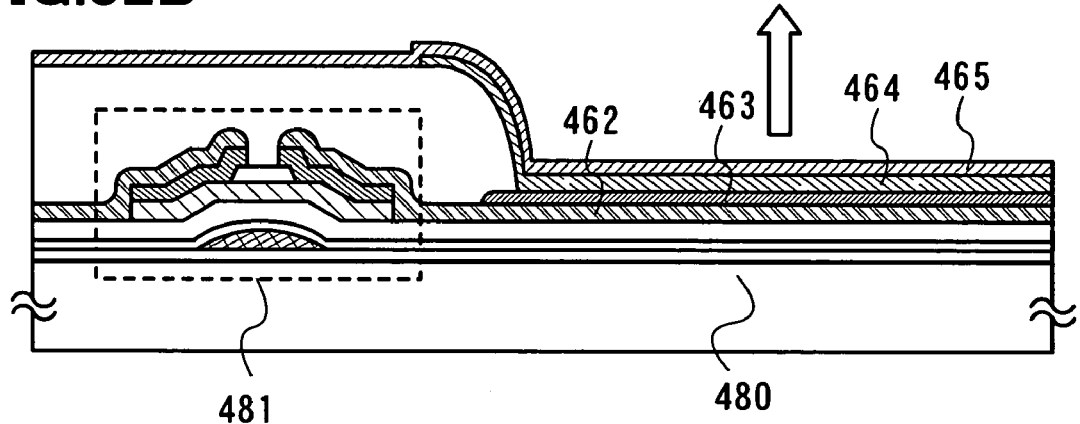
Figure 32C:
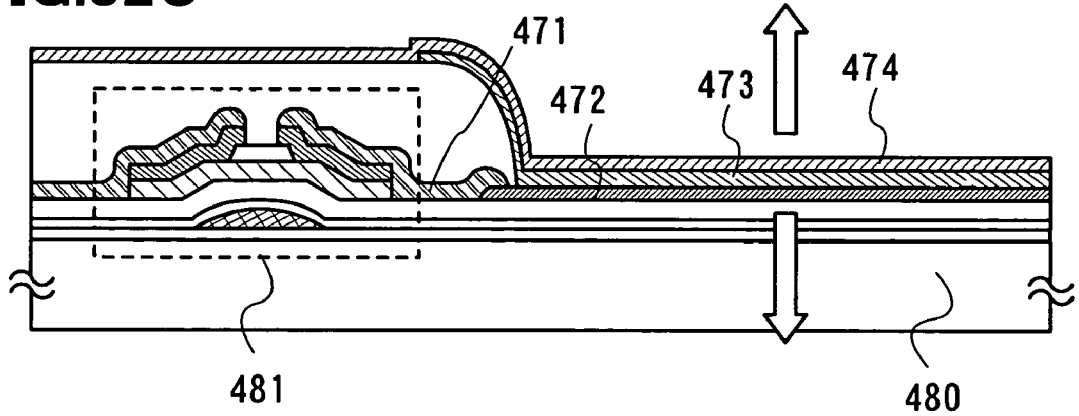

A thin film transistor can be formed by applying the present invention, and a display device can be formed with the use of the thin film transistor. In addition, when a light emitting element is used and an N-type transistor is used as a transistor which drives the light emitting element, light emitted from the light emitting element performs any of bottom emission, top emission and dual emission. Here, FIGS. 32A to 32C are used to describe laminated structures of a light emitting element according to each emission.

In this embodiment mode, a channel protective type thin film transistor 481 including a channel protective film to which the invention is applied is used. The channel protective film may be formed by dropping polyimide, polyvinyl alcohol or the like with the use of a droplet discharge method. As a result, a photolithography step can be omitted. As the channel protective film, one kind of an inorganic material (silicon oxide, silicon nitride, silicon oxynitride, silicon nitride oxide or the like), a photosensitive or non-photosensitive organic material (an organic resin material) (polyimide, acrylic, polyamide, polyimide amide, a resist, benzocyclobutene or the like), a Low k material which has a low dielectric constant, and the like; a film including plural kinds thereof; a lamination layer thereof; or the like can be used. Additionally, a material which has a skeleton formed by the bond of silicon (Si) and oxygen (O), and which includes at least hydrogen as a substituent, or at least one of fluoride, alkyl group, and aromatic hydrocarbon as a substituent, may be used. As a manufacturing method, a vapor phase growth method such as a plasma CVD method or a heat CVD method, or a sputtering method can be used. A droplet discharge method or a printing method (a method for forming a pattern, such as a screen printing or offset printing) can be also used. A TOF film or an SOG film obtained by an application method can be also used.

First, the case where light is emitted to the side of a substrate 480, in other words, bottom emission is performed, is described with reference to FIG. 32A. In this case, source or drain wiring 483, a first electrode 484, an electroluminescent layer 485, and a second electrode 486 are sequentially laminated so as to be electrically connected to the transistor 481. Next, the case where light is emitted to the side opposite the substrate 480, in other words, top emission is performed, is described with reference to FIG. 32B. Source or drain wiring 462, a first electrode 463, an electroluminescent layer 464 and a second electrode 465 which are electrically connected to the transistor 481 are sequentially laminated. According to the above-mentioned structure, even when the first electrode 463 transmits light, the light is reflected by the source or drain wiring 462 and emitted to the side opposite the substrate 480. Note that in this structure, it is not necessary to use a material having light-transmitting properties for the first electrode 463. Lastly, the case where light is emitted to both the side of the substrate 480 and the opposite side thereof, in other words, dual emission is performed, is described with reference to FIG. 32C. Source or drain wiring 471, a first electrode 472, an electroluminescent layer 473 and a second electrode 474 which are electrically connected to the transistor 481 are sequentially laminated. At this time, when both the first electrode 472 and the second electrode 474 are formed of a material having light-transmitting properties, or formed to have a film thicknesses which can transmit light, dual emission can be achieved.

A light emitting element has a structure in which the electroluminescent layer is sandwiched between the first electrode and the second electrode. It is necessary to select a material for the first electrode and the second electrode considering a work function. The first electrode and the second electrode can be either an anode or a cathode depending on a pixel structure. In this embodiment mode, it is preferable to make the first electrode a cathode, and the second electrode an anode, since the polarity of a drive TFF is an n-channel type. In addition, when polarity of the drive TFT is a p-channel type, it is preferable to make the first electrode an anode, and the second electrode a cathode.

When the first electrode is an anode, in the electroluminescent layer, it is preferable to laminate an HIL (a hole injection layer), an HTL (a hole transport layer), an EML (a light emitting layer), an ETL (an electron transport layer), and an EIL (an electron injection layer) in order from the anode side. When the first electrode is a cathode, it is preferable to laminate layers adversely, namely, laminate an EIL (an electron injection layer), an ETL (an electron transport layer), an EML (a light emitting layer), an HTL (a hole transport layer), an HIL (a hole injection layer), and a cathode which is the second electrode in order from the cathode side. Additionally, the electroluminescent layer can be also formed with a single layer structure or a combined structure, in addition to a laminated structure.

As the eletcroluminescent layer, materials each indicates luminescence of red (R), green (G) and blue (B) are selectively formed by an evaporation method using an evaporation mask or the like for each. The materials (low molecular weight materials or high molecular weight materials or the like) each indicates luminescence of red (R), green (G) and blue (B) can be formed by a droplet discharge method as a color filter. In this case, it is preferable since RGB can be separately colored without using a mask.

Specifically, CuPc or PEDOT is used as the HIL; α-NPD, as the HTL; BCP or Alq$_3$, as the ETL; BCP:Li or CaF$_2$, as the EIL, respectively. When ITO or ITSO having light-transmitting properties is used for the second electrode in the case of top emission type, BzOS—Li in which Li is added to benzoxazole derivative, or the like can be used. In addition, Alq$_3$ doped with a dopant corresponding to respective luminescence colors of R, G, and B (DCM or the like in the case of R, and DMQD or the like in the case of G) may be used as the EML, for example.

Note that the electroluminescent layer is not limited to the above material. For example, a hole injectability property can be enhanced by co-evaporating oxide such as molybdenum oxide (MoO$_X$: X=2 to 3) and α-NPD or rubrene instead of using CuPc or PEDOT. An organic material (including a low molecular weight material or a high molecular weight material) or a composite material of an organic material and an inorganic material can be used as the material of the electroluminescent layer.

In addition, a color filter may be formed over a counter substrate of the substrate 480, although it is not shown in FIGS. 32A to 32C. The color filter can be formed by a droplet discharge method; in that case, photoplasma treatment or the like can be performed as the above-mentioned base pretreatment. The color filter can be formed in a desired pattern with favorable adhesion due to the base film of the invention. High-definition display can be performed by using the color filter. This is because the color filter can adjust a broad peak to sharp one in each emission spectrum of RGB.

The case of forming materials showing each light emission of RGB is described hereinabove; however, full color display can be performed also by forming a material showing light emission of single color and combining the material with a color filter or a color conversion layer. For example, in the case of forming an electroluminescent layer showing white or orange light emission, full color display can be performed by separately providing a color filter, a color conversion layer, or a combination of a color filter and a color conversion layer. For example, the color filter or the color conversion layer may be formed over a second substrate (a sealing substrate), and then, be attached to the substrate. As described above, the material showing light emission of single color, the color filter, and the color conversion layer can all be formed by a droplet discharge method.

Naturally, display of single color light emission may be performed. For example, an area color type light emitting display device may be formed by using single color light emission. A passive matrix display portion is suitable for the area color type and can display mainly characters and symbols.

A material having a low work function can be used for the cathode in the above-mentioned structure; for example, Ca, Al, CaF, MgAg, AlLi, or the like is preferable. The electroluminescent layer may be any of a single layer type, a lamination layer type, and a mixed type having no interface between layers. Any of the following materials can be used: a singlet material, a triplet material, a combined material thereof, an organic material including a low molecular weight material, a high molecular weight material, and an intermediate molecular weight material, an inorganic material typified by molybdenum oxide which is superior in an electron injection property, or the like, and a composite material of an organic material and an inorganic material. The first electrodes 484, 463, and 472 are formed by using a transparent conductive film which transmits light; for example, a transparent conductive film in which indium oxide is mixed with zinc oxide (ZnO) of from 2% to 20% as well as ITO or ITSO is used. Note that plasma treatment in an oxygen atmosphere or heat treatment in a vacuum atmosphere is preferably performed before forming the first electrodes 484, 463, and 472. A partition wall (also referred to as a bank) is formed by using a material containing silicon, an organic material, or a compound material. In addition, a porous film may be used. However, it is preferable to form the partition wall by using a photosensitive or non-photosensitive material such as acrylic or polyimide, since a side face thereof becomes a shape in which a radius of curvature continuously changes and an upper-layer thin film is formed without break. This embodiment mode can be freely combined with the above embodiment mode.

[Embodiment Mode 5]

In a display panel manufactured according to Embodiment Modes 2 to 4, a scanning line driver circuit can be formed over a substrate 3700 by forming a semiconductor layer of an SAS as described in FIG. 31.

Figure 22:
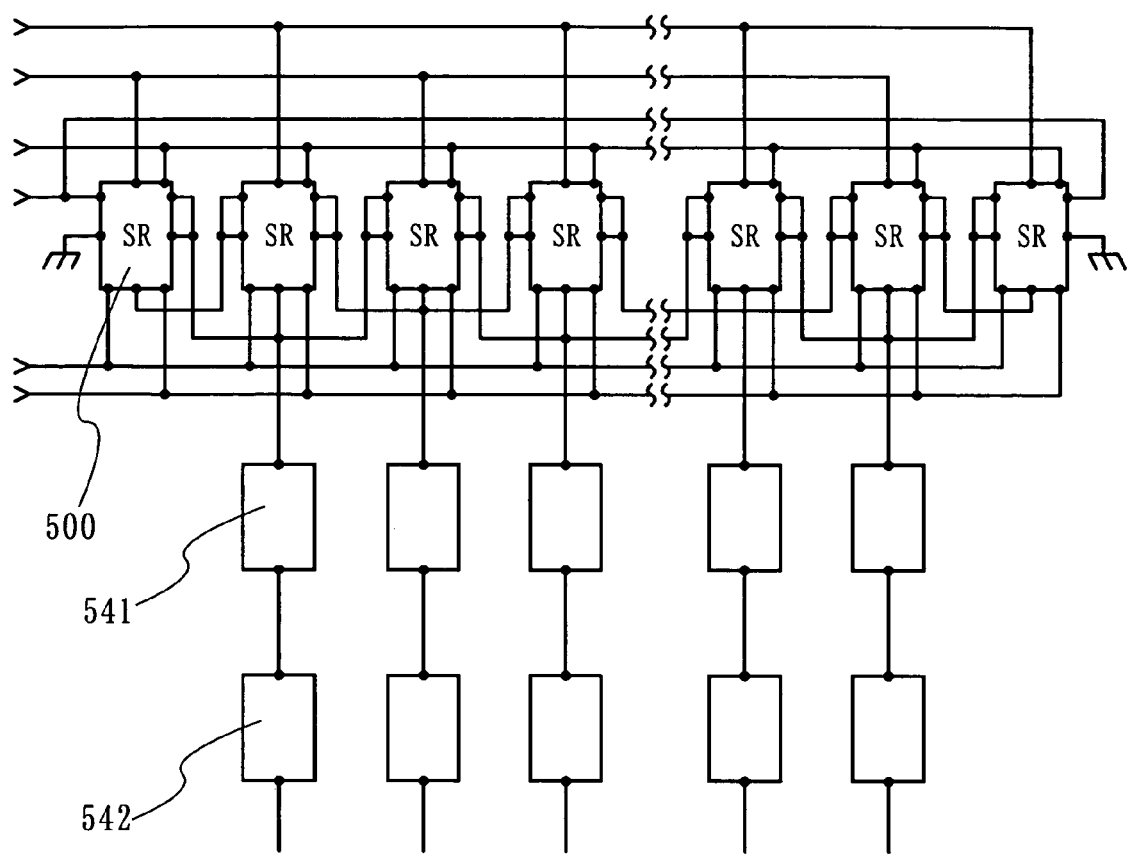
FIG. 22 is a diagram which explains a circuit structure when a scanning line driver circuit is formed of a TFT in an EL display panel of a certain aspect of the invention.

FIG. 22 shows a block diagram of a scanning line driver circuit including n-channel type TFTs using an SAS in which electric field-effect mobility of from 1 $cm^2/V \cdot sec$ to 15 $cm^2/V \cdot sec$ can be obtained.

A block shown in reference numeral 500 corresponds to a pulse output circuit outputting a sampling pulse for one stage in FIG. 22, and a shift register includes n pieces of pulse output circuit. Reference numeral 541 denotes a buffer circuit, and a pixel 542 is connected at the end thereof.

Figure 23:
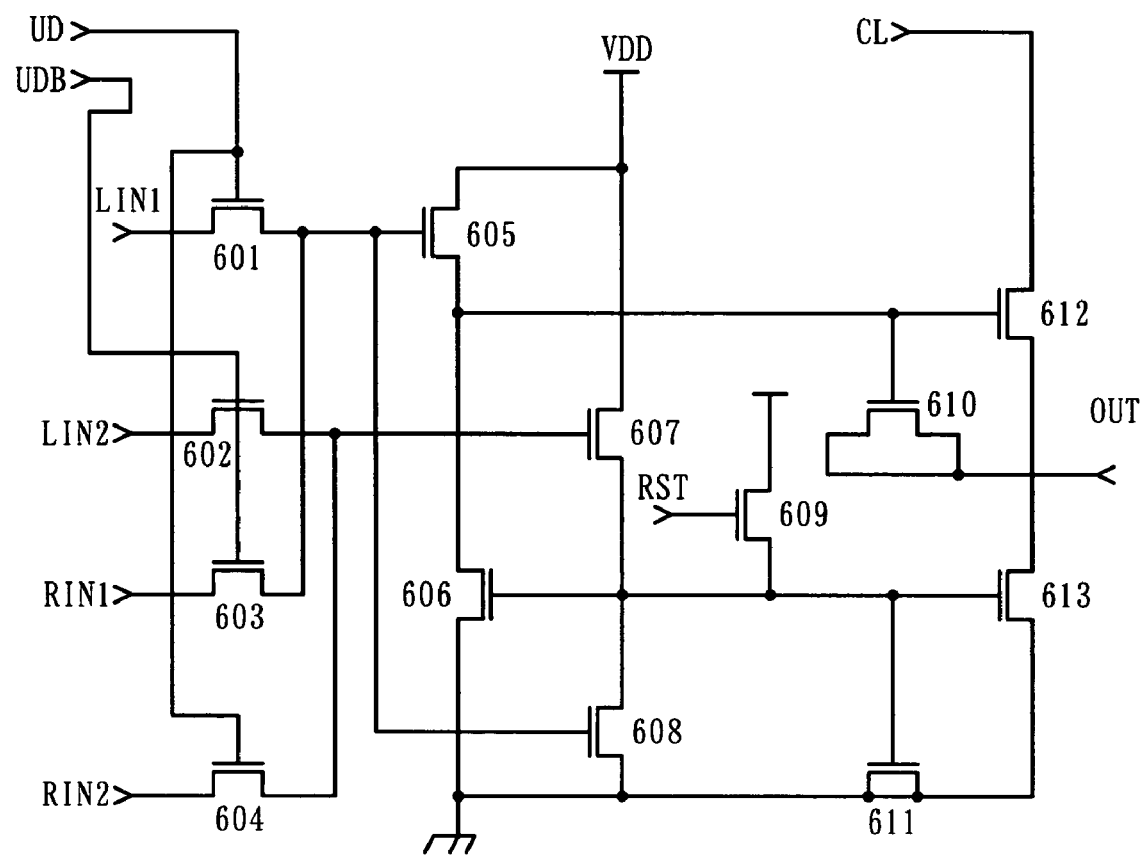
FIG. 23 is a diagram which explains a circuit structure when a scanning line driver circuit is formed of a TFT in an EL display panel of a certain aspect of the invention (a shift register circuit)

FIG. 23 shows a specific structure of the pulse output circuit 500, and the circuit includes n-channel type TFTs 601 to 613. At this time, the size of the TFTs may be decided in consideration of operating characteristics of the n-channel type TFTs using an SAS. For example, when a channel length is set to be 8 μm, the channel width can be set ranging from 10 μm to 80 μm.

Figure 24:
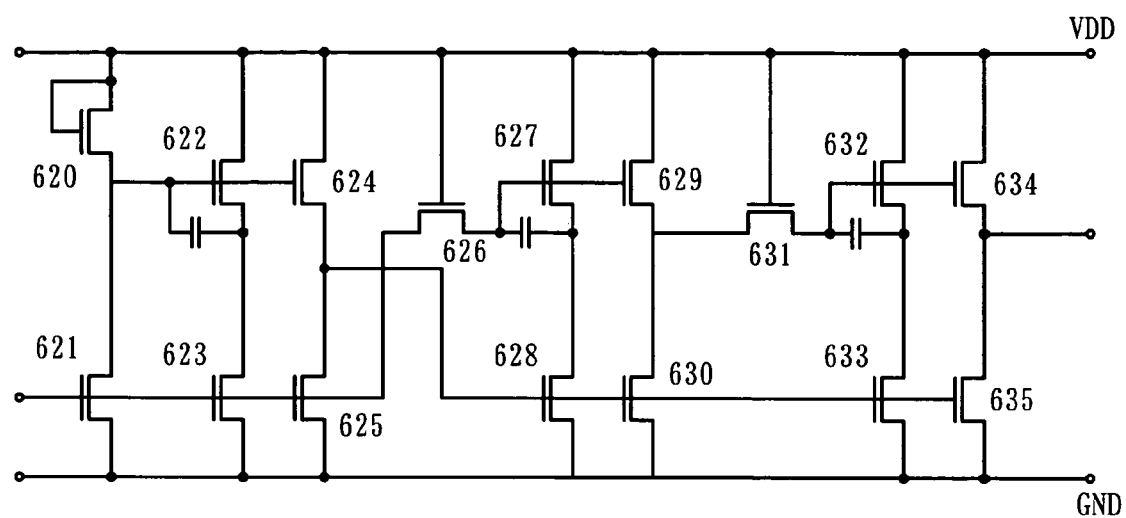
FIG. 24 is a diagram which explains a circuit structure when a scanning line driver circuit is formed of a TFT in an EL display panel of a certain aspect of the invention (a buffer circuit)

In addition, FIG. 24 shows a specific structure of the buffer circuit 541. The buffer circuit includes n-channel type TFTs 620 to 635 in the same manner. At this time, the size of the TFTs may be decided in consideration of operating characteristics of the n-channel type TFTs using an SAS. For example, when a channel length is set to be 10 μm, the channel width can be set ranging from 10 μm to 1800 μm.

Figure 25:
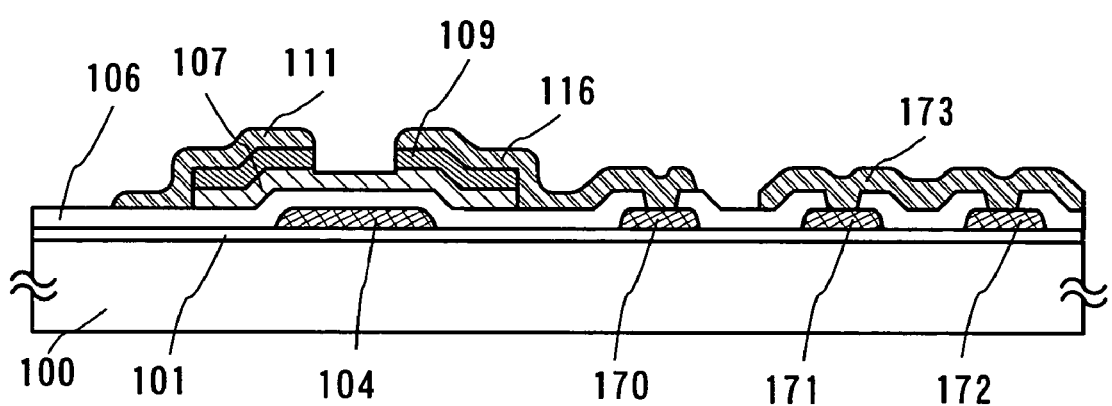
FIG. 25 shows a view describing a method for manufacturing a display device of a certain aspect of the invention.

It is necessary to connect the TFTs with one another by wirings to realize such a circuit, and FIG. 25 shows a structure example of wirings in the case thereof. FIG. 25 shows a state in which a gate electrode layer 104, a gate insulating layer 106 (a three-layer laminated body of an insulating layer 106a formed of silicon nitride, an insulating layer 106b formed of silicon oxide, and an insulating layer 106c formed of silicon nitride), a semiconductor layer 107 formed of an SAS, an N-type semiconductor layer 109 which forms a source and a drain, and source or drain electrode layers 111 and 116 are formed. In this case, connection wiring layers 170, 171 and 172 are formed over a substrate 100 in the same step with the gate electrode layer 104. Then, a part of the gate insulating layer is etching-processed so that the connection wiring layers 170, 171 and 172 are exposed, and various kinds of circuits can be realized by appropriately connecting the TFTs with the source or drain electrode layers 111 and 116, and a connection wiring layer 173 formed in the same step thereof.

[Embodiment Mode 6]

A mode in which a driver circuit for driving is mounted on a display panel manufactured according to Embodiment Modes 2 to 4 is described.

First, a display device to which a COG method is applied is explained with reference to FIG. 31. A pixel portion 3701 displaying information such as a character or an image, and a scanning line driver circuit 3702 are provided over a substrate 3700. The substrate over which a plurality of driver circuits are provided is separated into rectangles. Driver circuits after separation (hereinafter referred to as "a driver IC") 3705a and 3705b are mounted over the substrate 3700. FIG. 31 shows a mode in which a plurality of driver ICs 3705a and 3705b, and tapes 3704a and 3704b mounted on the ends of the driver ICs 3705a and 3705b are mounted. In addition, the separation size is made approximately same as a side of a signal line side in the pixel portion, and a tape may be mounted on an end of a single driver IC.

Alternatively, a TAB method may be applied, and in this case, a plurality of tapes are attached and driver ICs may be mounted on the tapes. As in the case of a COG method, single driver IC may be mounted on a single tape, and in this case, a metal piece, or the like to fix the driver IC may be attached at the same time in view of an intensity matter.

As for these driver ICs mounted on display panels, a plurality of the driver ICs may be mounted on a rectangular substrate having 300 mm to 1000 mm or more on a side in view of improving productivity.

In other words, a plurality of circuit patterns, in which a driver circuit portion and an input and output terminal are one unit, are formed over a substrate, and separated and obtained last. The length of a long side of a driver IC may be formed to be from 15 mm to 80 mm; and a short side, from 1 mm to 6 mm, which forms a rectangular shape, in consideration of the length of a side length of a pixel portion or a pixel pitch. Alternatively, it may be formed to have the length of a side of the pixel region, or the sum of a side of the pixel portion and a side of the driver circuit.

The advantage of the external dimension of a driver IC compared with an IC chip is the length of a long side. When a driver IC in which a long side is formed to be from 15 mm to 80 mm is used, less IC chips are required to mount correspondingly to a pixel portion; therefore, a manufacturing yield can be enhanced. When a driver IC is formed over a glass substrate, productivity is not impaired since it is not limited by a shape of a substrate to be used as a body. This is a significant advantage compared with the case where IC chips are obtained from a circular silicon wafer.

In FIG. 31, the driver ICs 3705a and 3705b over which a driver circuit is formed are mounted in a region outside the pixel portion 3701. These driver ICs 3705a and 3705b are signal line driver circuits. To form a pixel portion corresponding to RCB full colors, 3072 signal lines are required for an XGA class, and 4800 signal lines are required for a UXGA class. The signal lines of such a number forms a leading out line by being divided into several blocks at an edge of the pixel region 3701 and is gathered in accordance with a pitch of an output terminal of the driver ICs 3705a and 3705b.

The driver ICs are preferably formed of a crystalline semiconductor formed over a substrate. The crystalline semiconductor is preferable to be formed by being irradiated with a continuous-wave laser. Therefore, a continuous-wave solid state laser or gas laser is used as an oscillator in which the laser is generated. There are few crystal defects when a continuous-wave laser is used. As a result, a transistor can be manufactured by using a polycrystalline semiconductor layer with a large grain size. In addition, high-speed driving is possible since mobility or a response speed is favorable, and it is possible to further improve an operating frequency of an element than that of the conventional element; therefore, high reliability can be obtained since there are few property variations. Note that a channel length direction of a transistor and a scanning direction of laser light may be accorded with each other to further improve an operating frequency. This is because the highest mobility can be obtained when a channel length direction of a transistor and a scanning direction of laser light with respect to a substrate are almost parallel (preferably, from −30° to 30°) in a step of laser crystallization by a continuous-wave laser. A channel length direction coincides with a direction of current flowing in a channel form region, in other words, a direction in which an electric charge moves. The transistor thus manufactured has an active layer including a polycrystalline semiconductor layer in which a crystal grain is extended in a channel direction, and this means that a crystal grain boundary is formed almost along a channel direction.

In carrying out laser crystallization, it is preferable to narrow down the laser light largely, and a beam spot thereof preferably has a width of approximately from 1 mm to 3 mm of which width is same as that of a short side of the driver ICs. In addition, in order to ensure an object to be irradiated an enough and effective energy density, an irradiated region of the laser light is preferably a linear shape. However, a linear shape here does not refer to a line in a proper sense, but refers to a rectangle or an oblong with a large aspect ratio. For example, the linear shape refers to a rectangle or an oblong with an aspect ratio of 2 or more (preferably from 10 to 10000). Accordingly, productivity can be improved by identifying a width of a beam spot of the laser light with that of a minor axis of the driver ICs.

In FIG. 31, a mode in which the scanning line driver circuit is integrally formed with the pixel portion and the driver ICs are mounted as a signal line driver circuit is shown. However, the present invention is not limited to this mode, and the driver ICs may be mounted as both a scanning line driver circuit and a signal line driver circuit. In that case, it is preferable to differentiate a specification of the driver ICs to be used on the scanning line and signal line side.

In the pixel portion 3701, the signal line and the scanning line are intersected to form a matrix and a transistor is arranged in accordance with each intersection. A TFT having a structure in which a channel portion is formed from an amorphous semiconductor or a semi-amorphous semiconductor can be used as the transistor arranged in the pixel portion 3701 in the invention. An amorphous semiconductor is formed by a method such as a plasma CVD method or a sputtering method. It is possible to form a semi-amorphous semiconductor at temperatures of 300° C. or lower with a plasma CVD method. A film thickness necessary to form a transistor is formed in a short time even in the case of a non-alkaline glass substrate of an external size of, for example, 550 mm×650 mm. The feature of such a manufacturing technique is effective in manufacturing a display device of a large-sized screen. In addition, a semi-amorphous TFT can obtain electric field-effect mobility of 2 $cm^2$/V·sec to 15 $cm^2$/V·sec by constituting a channel form region with an SAS. Therefore, this TFT can be used as a switching element of pixels and as an element which constitutes the scanning line driver circuit. Accordingly, a display panel in which a system-on-panal is achieved, can be manufacture.

FIG. 31 is shown based on that the scanning line driver circuit is integrally formed over the substrate by using the TFT in which a semiconductor layer is formed of an SAS. When a TFT in which a semiconductor layer is formed of an SAS is used, the drive ICs may be mounted on both the scanning line driver circuit and the signal line driver circuit.

In that case, it is preferable to differentiate a specification of the driver ICs to be used in the scanning line and signal line side. For example, although the withstand pressure of approximately 30 V is required for a transistor constituting a scanning line driver IC, a drive frequency is 100 kHz or less, and thus high-speed operation is not relatively required. Therefore, it is preferable to set the channel-length (L) of a transistor constituting the scanning line driver sufficiently long. On the other hand, in a transistor of the signal line driver IC, although the withstand pressure of approximately of 12 V is sufficient, a drive frequency is about 3V and 65 MHz, and thus high-speed operation is required. Accordingly, it is preferable to set the channel length of a transistor constituting a driver in micrometer.

The method for mounting a driver IC is not particularly limited, and a COG method, a wire bonding method, or a TAB method, which are known methods can be used.

The thickness of the drive IC is made same as that of a counter substrate; therefore, the heights thereof are made approximately the same contributing to thinning a display device as a whole. By manufacturing each substrate of the same material, heat stress is not generated even when a change in temperature is generated in the display device and the characteristics of a circuit manufactured of the TFT are not impaired. Additionally, by mounting longer driver ICs than IC chips to the driver circuit as shown in this embodiment mode, the number of the driver ICs mounted on one pixel portion can be reduced.

As mentioned above, the driver circuit can be incorporated into a display panel.

[Embodiment Mode 7]

A structure of a pixel of a display panel shown in this embodiment is described with reference to equivalent circuit diagrams shown in FIGS. 26A to 26F.

Figure 26A:
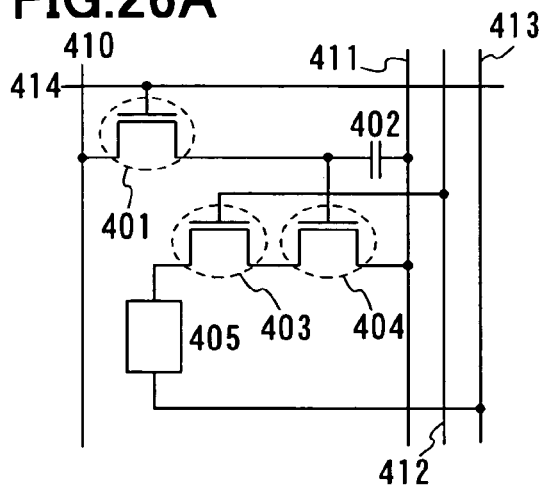
FIGS. 26A to 26F are circuit diagrams for explaining a pixel structure to which an EL display panel of a certain aspect of the invention can be applied.

In a pixel shown in FIG. 26A, a signal line 410 and power supply lines 411 to 413 are arranged in columns, and a scanning line 414 is arranged in a row. The pixel also includes a switching TFT 401, a driver TFT 403, a current controlling TFT 404, a capacitor element 402, and a light-emitting element 405.

Figure 26B:
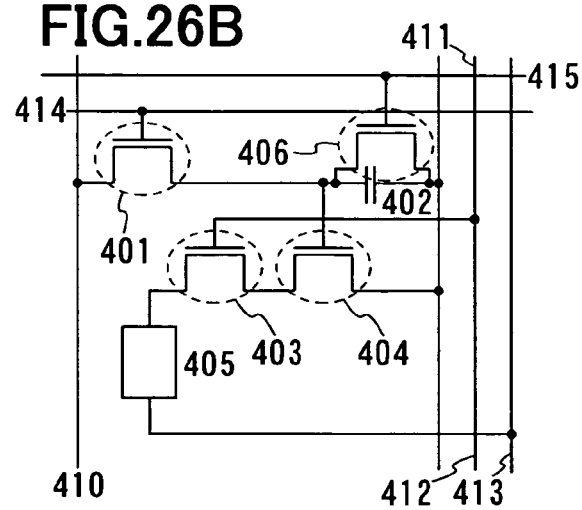
Figure 26C:
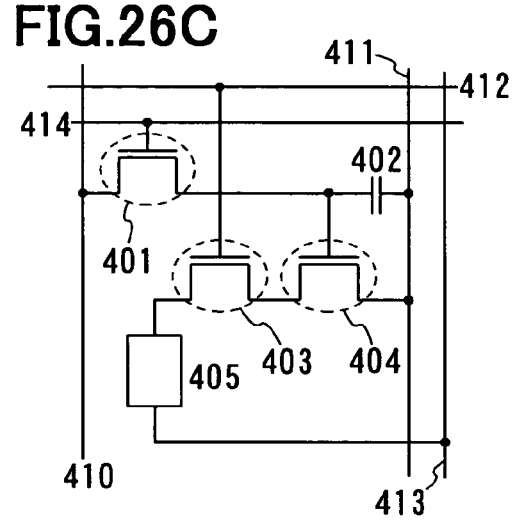
Figure 26D:
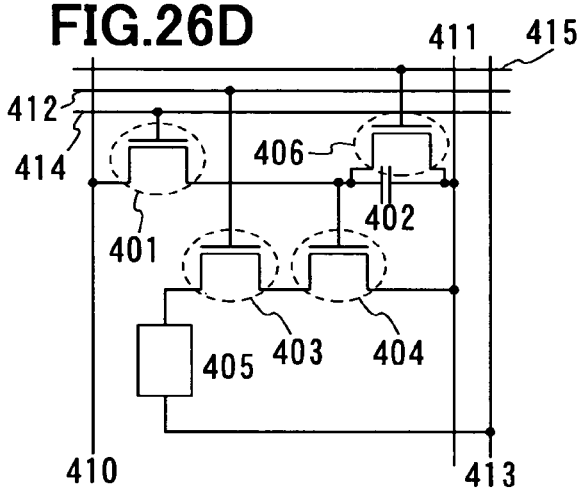

A pixel shown in FIG. 26C has the same structure as the one shown in FIG. 26A, except that a gate electrode of the driver TFT 403 is connected to the power supply line 412 arranged in a row. Both pixels in FIGS. 26A and 26C show the same equivalent circuit diagrams. However, each power supply line is formed of conductive layers in different layers in between the cases where the power supply line 412 is arranged in a column (FIG. 26A) and where the power supply line 412 is arranged in a row (FIG. 26C). The two pixels are each shown in FIGS. 26A and 26C in order to show that layers in which a wiring connected to the gate electrode of the driver TFT 403 is formed are different in between FIGS. 26A and 26C.

In both FIGS. 26A and 26C, the driver TFT 403 and the current controlling TFT 404 are connected in series in the pixel, and the ratio of the channel length $L_3$/the channel width $W_3$ of the driver TFT 403 to the channel length $L_4$/the channel width $W_4$ of the current controlling TFT 404 is set as $L_3/W_3: L_4/W_4=5$ to $6000:1$. For example, when $L_3$, $W_3$, $L_4$, and $W_4$ are 500 μm, 3 μm, 3 μm, and 100 μm, respectively.

The driver TF 403 is operated in a saturation region and controls the amount of current flowing in the light emitting element 405, whereas the current controlling TFT 404 is operated in a linear region and controls a current supplied to the light emitting element 405. The TFTs 403 and 404 preferably have the same conductivity in view of the manufacturing process. For the driver TFT 403, a depletion type TFT may be used instead of an enhancement type TFT. According to the invention having the above structure, slight variations in $V_{GS}$ of the current controlling TFT 404 does not affect the amount of current flowing in the light emitting element 405, since the current controlling TFT 404 is operated in a linear region. That is, the amount of current flowing in the light emitting element 405 is determined by the driver TFT 403 operated in a saturation region. Accordingly, it is possible to provide a display device in which image quality is improved by improving variations in luminance of the light emitting element due to variation of the TFT properties.

The switching TFT 401 of pixels shown in FIGS. 26A to 26D controls a video signal input to the pixel. When the switching TFT 401 is turned ON and a video signal is inputted to the pixel, the video signal is held in the capacitor element 402. Although the pixel includes the capacitor element 402 in FIGS. 15A to 15D, the invention is not limited thereto. When a gate capacitance or the like can serve as a capacitor for holding a video signal, the capacitor element 402 is not necessarily provided.

The light emitting element 405 has a structure in which an electroluminescent layer is sandwiched between a pair of electrodes. A pixel electrode and an opposing electrode (an anode and a cathode) have a potential difference therebetween so that a forward bias voltage is applied. The electroluminescent layer is formed of wide range of materials such as an organic material, an inorganic material. The luminescence in the electroluminescent layer includes luminescence that is generated when an excited singlet state returns to a ground state (fluorescence) and luminescence that is generated when an exited triplet state returns to a ground state (phosphorescence).

A pixel shown in FIG. 26B has the same structure as the one shown in FIG. 26A, except that a TFT 406 and a scanning line 415 are added. Similarly, a pixel shown in FIG. 26D has the same structure as the one shown in FIG. 26C, except that a TFT 406 and a scanning line 415 are added.

The TFT 406 is controlled to be ON/OFF by the added scanning line 415. When the TFT 406 is turned ON, charges held in the capacitor element 402 are discharged, thereby turning the TFT 404 OFF. That is, supply of a current to the light emitting element 405 can be forcibly stopped by providing the TFT 406. Therefore, a lighting period can start simultaneously with or shortly after a writing period starts before signals are written into all the pixels by adopting the structures shown in FIGS. 26B and 26D, thus, the duty ratio can be improved.

Figure 26E:
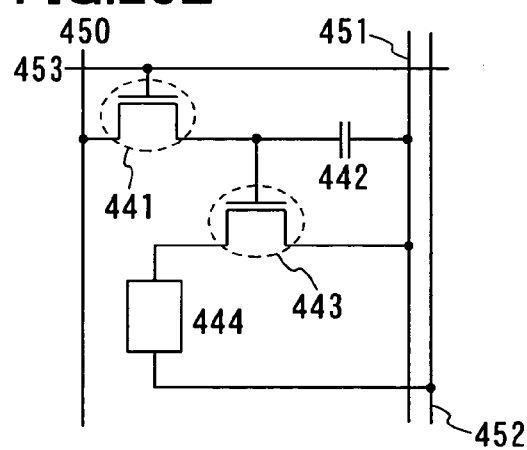
Figure 26F:
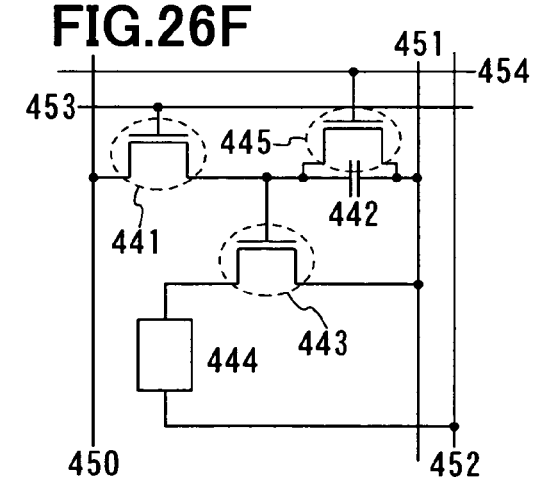

In a pixel shown in FIG. 26E, a signal line 450 and power supply lines 451 and 452 are arranged in columns, and a scanning line 453 is arranged in a row. The pixel further includes a switching TFT 441, a driver TFT 443, a capacitor element 442, and a light emitting element 444. A pixel shown in FIG. 26F has the same structure as the one shown in FIG. 26E, except that a TFT 445 and a scanning line 454 are added. It is to be noted that the structure of FIG. 26F also allows a duty ratio to be improved by providing the TFT 445.

[Embodiment Mode 8]

Figure 27:
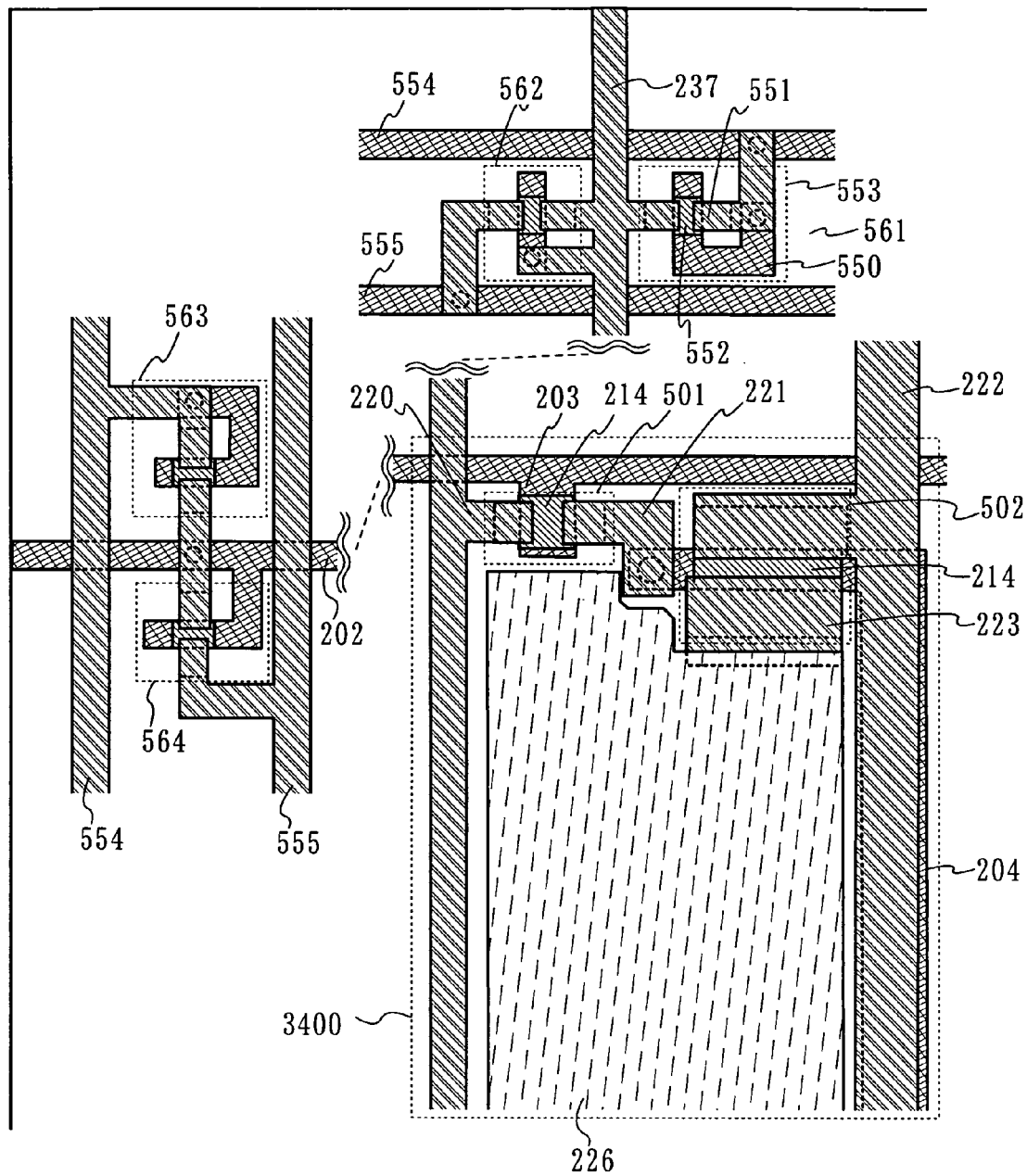
FIG. 27 is a top view for explaining an EL display panel of a certain aspect of the invention.

One mode in which a protective diode is provided for a scanning line input terminal portion and a signal line input terminal portion is explained with reference to FIG. 27. TFTs 501 and 502 are provided for a pixel 3400 in FIG. 27. The TFT has the similar structure as the one shown in Embodiment Mode 2.

Figure 28:
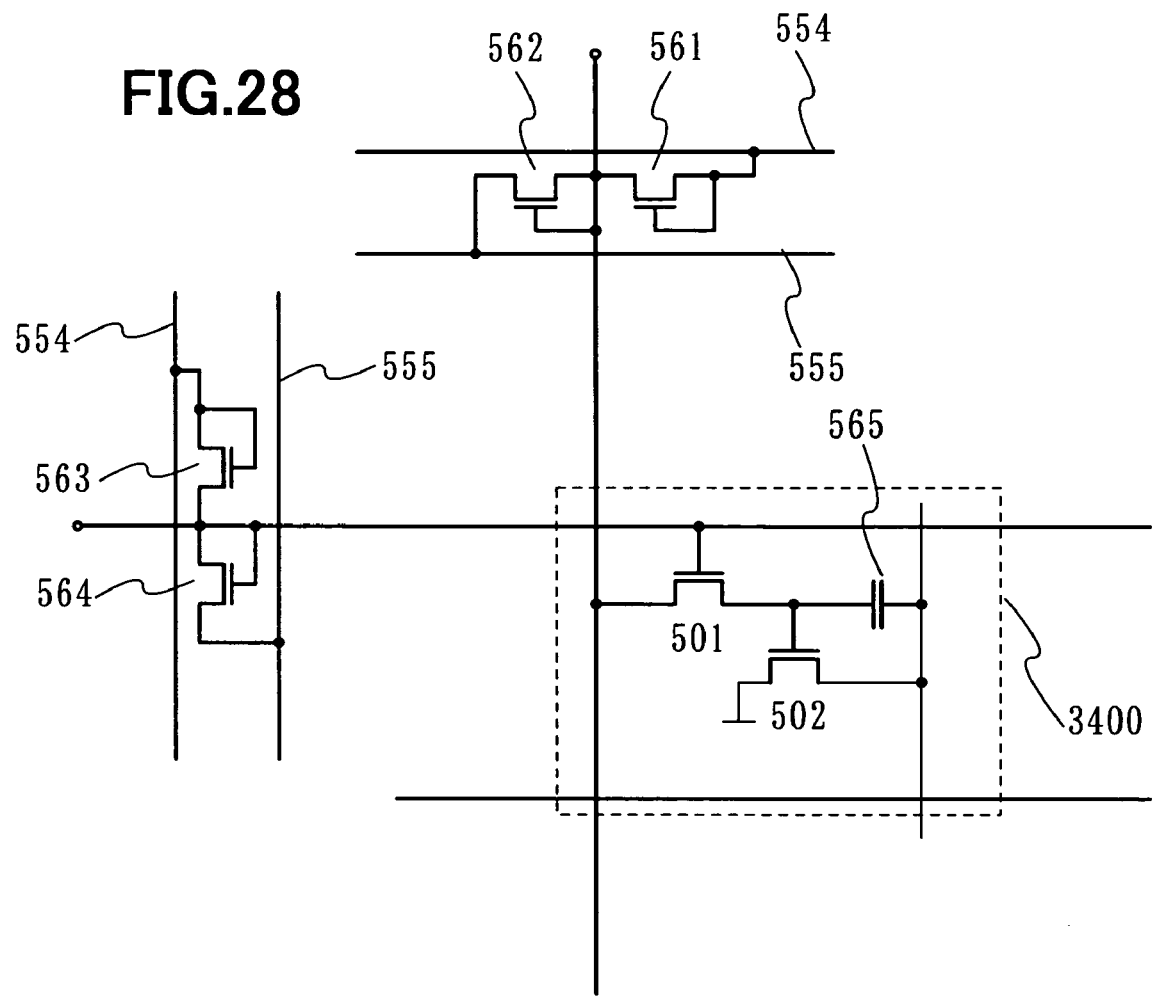
FIG. 28 is an equivalent circuit diagram of an EL display panel which is explained in FIG. 27.

Protective diodes 561 and 562 are provided for the signal line input terminal portion. These protective diodes are manufactured in the same step as that of the TFTs 501 or 502. The protective diodes 561 and 562 are operated as a diode by connecting a gate to one of a drain and a source. FIG. 28 shows an equivalent circuit diagram such as a top view shown in FIG. 27.

The protective diode 561 includes a gate electrode layer 550, a semiconductor layer 551, an insulating layer for channel protection 552, and a wiring layer 553. The protective diode 562 has the same structure. Common potential lines 554 and 555 connecting to this protective diode are formed in the same layer as that of the gate electrode. Therefore, it is necessary to form a contact hole in a gate insulating layer to electrically connect to the wiring layer 553.

A mask layer may be formed by a droplet discharge method and an etching-process may be carried out to form a contact hole in the gate insulating layer. In this case, when an etching-process by atmospheric pressure discharge is applied, a local discharge process is also possible, and it does not need to form a mask over the entire surface of a substrate.

A signal wiring layer 237 is formed in the same layer as that of a source or drain wiring layer 212 and has a structure in which the signal wiring 237 connected thereto is connected to a source side or a drain side.

A scanning signal line input terminal portion has a similar structure. According to the present invention, the protective diodes provided in an input stage can be formed at the same time. Note that the position of depositing a protective diode is not limited to this embodiment mode and can be also provided between a driver circuit and a pixel.

[Embodiment Mode 9]

Figure 20:
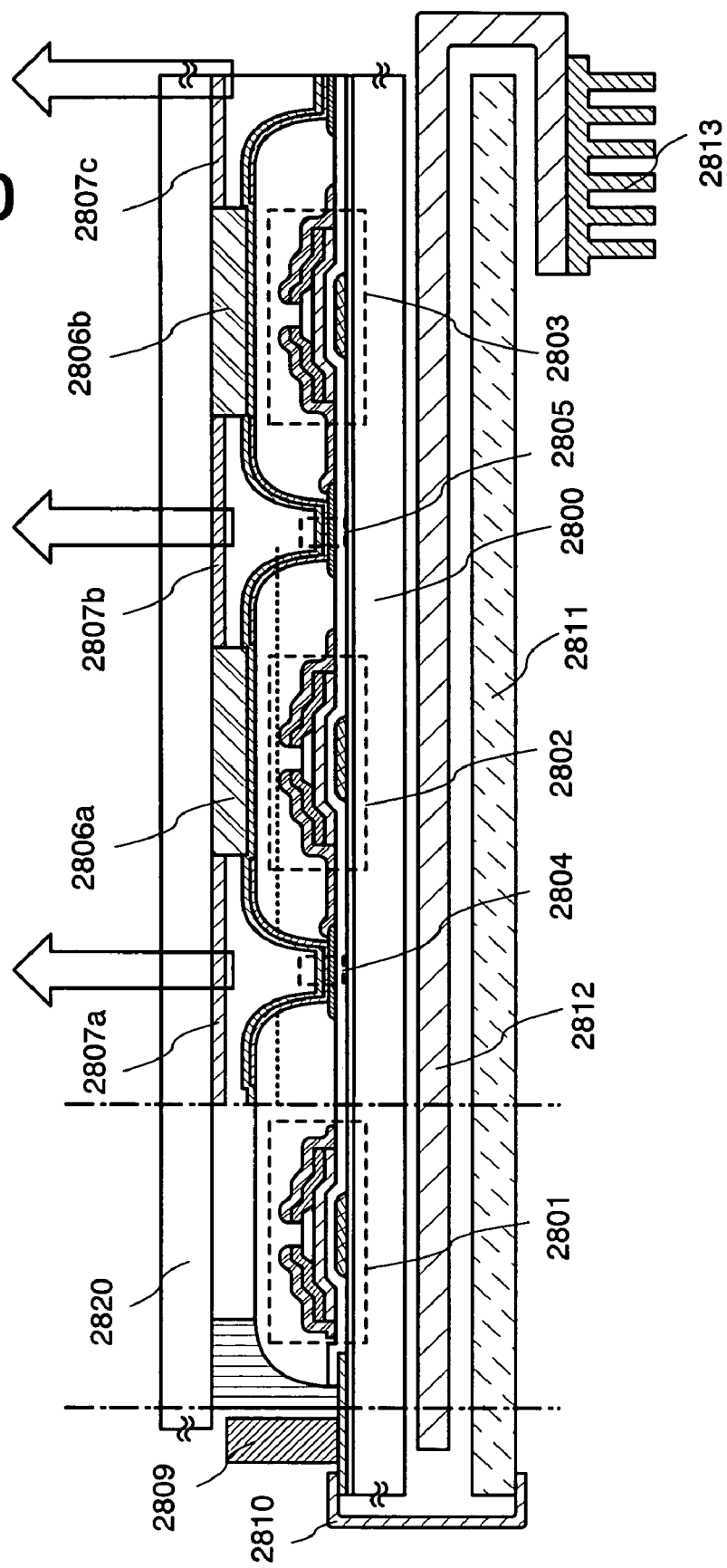
FIG. 20 is a cross-sectional view which explains a structure example of an EL display module of a certain aspect of the invention.

FIG. 20 shows an example of constituting an EL display module by using a TFT substrate 2800 manufactured by a droplet discharge method. In the figure, a pixel portion including a pixel is formed over the TFT substrate 2800.

In FIG. 20, a TFT which is same as the one formed in the pixel, or a protective circuit portion 2801 which is operated same as a diode by connecting a gate of the TFT and either a source or a drain is provided outside the pixel portion, and between a driver circuit and the pixel. A driver IC formed of a monocrystal semiconductor, a stick driver IC formed of a polycrystalline semiconductor film over a glass substrate, a driver circuit formed of an SAS, or the like are applied to a driver circuit 2809.

The TFT substrate 2800 is fixed to a sealing substrate 2820 with spacers 2806*a* and 2806*b* formed by a droplet discharge method therebetween. The spacers are preferably provided to keep the distance between two substrates constant, even when the substrates are thin and the pixel portion becomes larger in size. The gap between the TFT substrate 2800 and the sealing substrate 2820 over light emitting elements 2804 and 2805 may be filled with a resin material having light-transmitting properties and then cured, or may be filled with anhydrous nitrogen or an inert gas.

In FIG. 20, the case where the light emitting elements 2804 and 2805 have a top emission type structure is shown, and it is a structure in which light is emitted in a direction indicated by an arrow shown in the figure. Each pixel can perform multi-color display by making each pixel have different luminescent colors of red, green and blue. Additionally, color purity of light emission emitted to the exterior can be enhanced by forming colored layers 2807*a*, 2807*b* and 2807*c* corresponding to each color on the sealing substrate 2820 side. In addition, the pixel may be made a white color light emitting element, and the white color light emitting element can be combined with the colored layers 2807*a*, 2807*b* and 2807*c*.

The driver circuit 2809 is connected to a scanning line or a signal line connection terminal provided in an edge of the TFT substrate 2800 with a wiring substrate 2810. Alternatively, a heat pipe 2813 and an emission plate 2812 may provided to be in contact with or adjacent to the TFT substrate 2800, which is a structure to enhance a heat release effect.

In FIG. 20, although a top emission EL module is shown, a bottom emission structure may be also employed by changing the structure of a light emitting element or the position of an external circuit substrate. When it is a top emission type structure, an insulating layer to be a partition wall ay colored to use as black matrix. The partition wall can be formed by a droplet discharge method, and it can be formed by mixing carbon black or the like into a resin material such as polyimide, or by laminating thereof.

In the TFT substrate 2800, a sealing structure may be formed by attaching a resin film to the side where the pixel portion is formed with the use of a sealant or an adhesive resin. On the surface of the resin film, a gas barrier film which prevents vapor from transmitting may be preferably formed. By applying a film sealing structure, a display device can be made further thinner and lighter.

[Embodiment mode 10]

Figure 19:
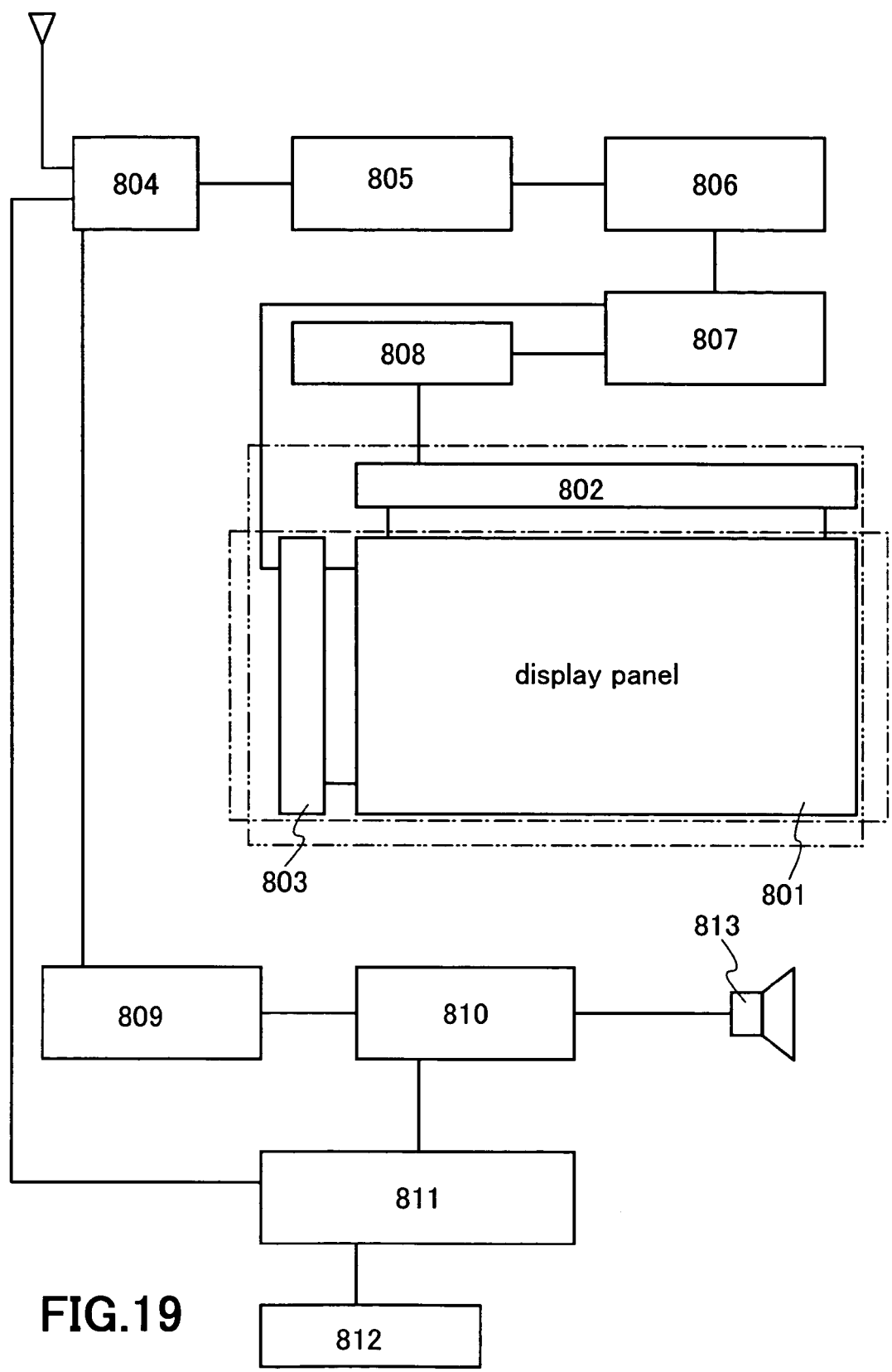
FIG. 19 is a block diagram which shows a main structure of an electronic device of a certain aspect of the invention.

A TV set can be completed by using a display device formed according to the present invention. FIG. 19 shows a block diagram which shows a main structure of a TV set. In a display panel, there are a case where only a pixel portion is formed, and a scanning line driver circuit and a signal line driver circuit are mounted by a TAB method as a structure as shown in FIG. 29, a case where the pixel portion, and the scanning line driver circuit and the signal line driver circuit at the periphery of the pixel portion are mounted by a COG method as a structure as shown in FIG. 30, and a case where the TFT is formed of an SAS, the pixel portion and the scanning line driver circuit are integrally formed over the substrate, and the signal line derive circuit is separately mounted as the driver IC as shown in FIG. 31. Any of the modes can be applied.

Another external circuit structure may include a video signal amplifier circuit 805 which amplifies a video signal among signals received by a tuner 804, a video signal processing circuit 806 which converts a signal to be outputted therefrom into a chrominance signal corresponding to each color of red, green, and blue, a control circuit 807 which converts the video signal into an input specification of a driver IC, and the like on an input side of a video signal. The control circuit 807 outputs a signal to both a scanning line side and a signal line side. In the case of digital driving, a signal dividing circuit 808 may be provided on the signal line side, and an input digital signal may be divided into m parts and be supplied.

An audio signal among signals received by the tuner 804 is transmitted to an audio signal amplifier circuit 809 and is supplied to a speaker 813 through an audio signal processing circuit 810 to be outputted. A control circuit 811 receives control information on a receiving station (receive frequency) or volume from an input portion 812 and transmits the signal to the tuner 804 and the audio signal processing circuit 810.

Figure 21:
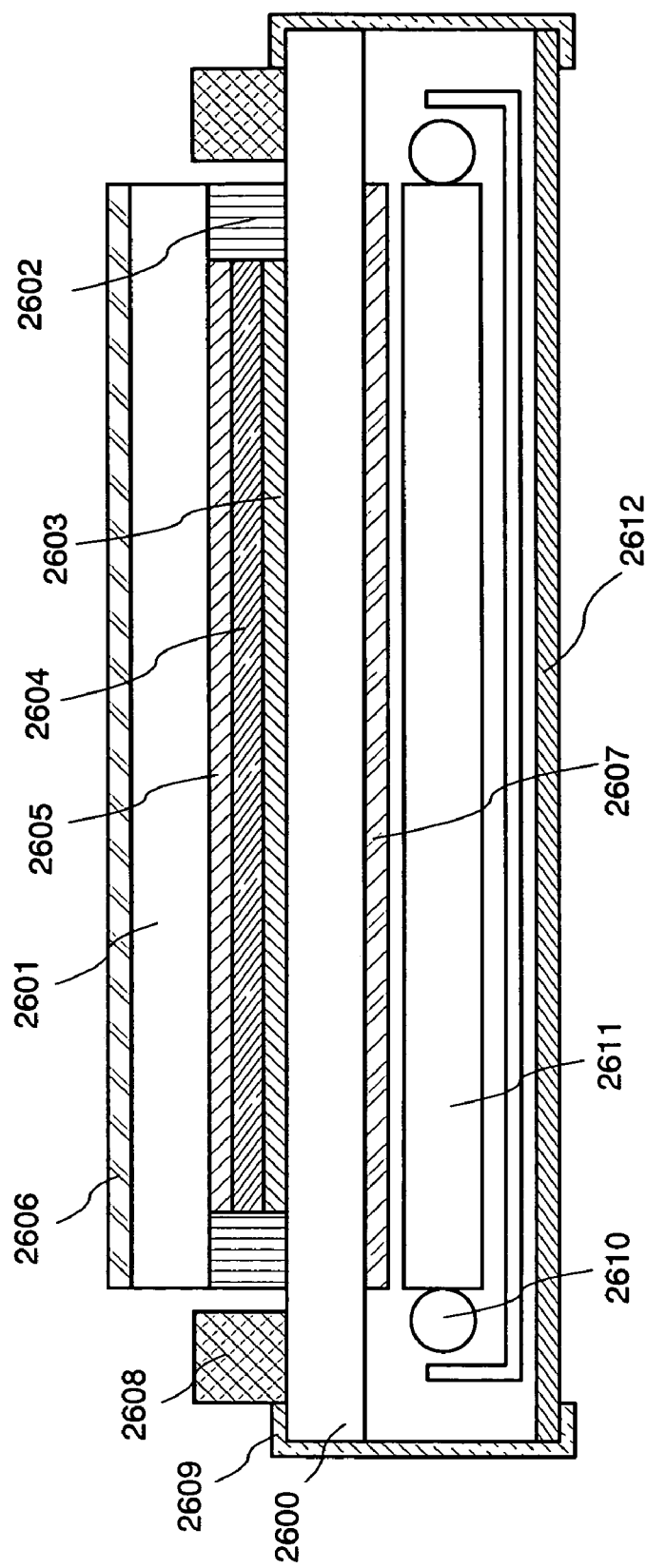
FIG. 21 is a cross-sectional view which explains a structure example of a liquid crystal display module of a certain aspect of the invention.

A TV set can be completed by incorporating the module into a chassis 2001 as shown in FIG. 17. When an EL display module as shown in FIG. 20 is used, an EL television set can be completed, and when a liquid crystal display module as shown in FIG. 21 is used, a liquid crystal television can be completed. A main display screen 2003 is formed by using the display module, and speaker portions 2009, an operation switch, and the like may be provided as an attachment. Thus, a TV set can be completed according to the present invention.

In addition, in a TV set, reflected light of light entering from outside may be blocked by using a wave plate and a polarizing plate. A quarter-wave plateYa half-wave plate are used as the wave plate, and may be designed to be able to control light. A module has a laminated structure of a TFT element substrates a light emitting element¥ a sealing substrate (sealant)¥ a wave plate (a quarter-wave plate¥ a half-wave plate)¥ a polarizing plate, and light emitted from a light emitting element passes therethrought and is emitted outside on a polarizing plate side. The wave plate and the polarizing plate may be provided on an emitted side of light. In the case of a dual emission light emitting display device which emits light on both sides, the wave plate and the polarizing plate can be provided on both sides. In addition, an anti-reflective film may be provided outside the polarizing plate. This makes it possible to display a high-definition precise image.

A display panel 2002 utilizing a liquid crystal or an EL element is incorporated in the chassis 2001. Not only can ordinary TV broadcasting be received by a receiver 2005, but also one-way information and telecommunication (from a transmitter to a receiver) or two-way information and telecommunication (between a transmitter and a receiver or between receivers) can be achieved by connecting to a communication network with or without a wire through a modem 2004. The TV set can be operated by a switch incorporated in the chassis or a separately-provided remote control unit 2006, and a display portion 2007 showing information to be outputted may be included in the remote control unit.

Further, also the TV set may be made to have a structure which displays channels or volume by forming a sub screen 2008 using a second display panel as well as a main screen 2003. In this structure, the main screen 2003 may be formed by using an EL display panel having wide view angle and the sub screen may be formed by using a liquid crystal display panel which allows display at low energy consumption. Further, in the case of putting priority on lower power consumption, the main screen 2003 may be formed by using a liquid crystal display panel, the sub screen 2008 may be formed by using an EL display panel, and then, the sub screen can be turned on and off. A highly display device can be formed by applying the invention even when such a large-sized substrate is used, and thus, a large number of TFTs or electronic parts are used.

Of course, the invention is not limited to a TV set and can be applied to various use applications particularly as a large-area display medium such as an information display board in a train station, an airport, or the like, or an advertisement display board in the street as well as a monitor of a personal computer.

[Embodiment Mode 11]

Various light emitting display devices can be manufactured by applying the present invention. That is to say, the invention can be applied to various electronic devices in which the light emitting display devices are incorporated in a display portion.

Such electronic devices can be given as follows: a camera such as a video camera, a digital camera or the like; a projector; a head mounted display (a goggle type display); a car navigation system; a car stereo; a personal computer; a game machine; a personal digital assistance (a mobile computer, a cellular phone, an electronic book, or the like); an image reproducing device including a recording medium (specifically, a device capable of processing data in a recording medium such as a Digital Versatile Disc (DVD) and having a display that can display the image of the data); and the like. Examples thereof are shown in FIGS. 18A to 18D.

Figure 18A:
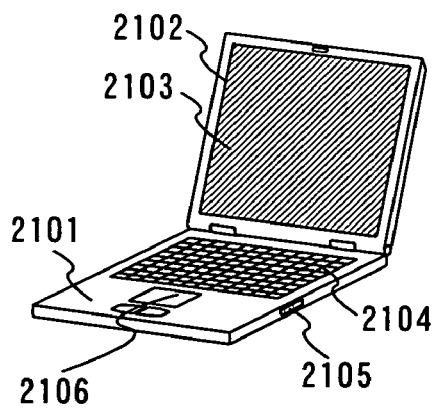
FIGS. 18A to 18D show electronic devices to which a certain aspect of the invention is applied.

FIG. 18A shows a personal computer, which includes a main body 2101, a chassis 2102, a display portion 2103, a keyboard 2104, an external connection port 2105, a pointing mouse 2106, and the like. The invention is applied to manufacturing the display portion 2103. When the invention is applied, a highly reliable high-quality image can be displayed even if the personal computer is miniaturized and a wiring or the like becomes precise.

Figure 18B:
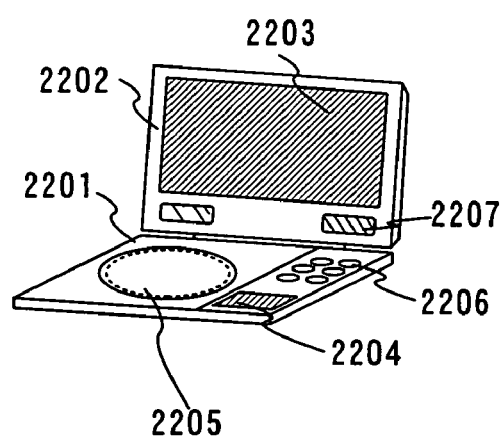

FIG. 18B shows an image reproducing device including a recording medium (specifically, a DVD reproducing device), which includes a main body 2201, a chassis 2202, a display portion A 2203, a display portion B 2204, a recording medium (a DVD or the like) reading portion 2205, operation keys 2206, speaker portions 2207, and the like. The display portion A 2203 mainly displays image information, and the display portion B 2204 mainly displays character information. The invention is applied to manufacturing the display portion A 2203 and the display portion B 2204. When the invention is applied, a highly reliable high-quality image can be displayed even if the image reproducing device is miniaturized and a wiring or the like becomes precise.

Figure 18C:
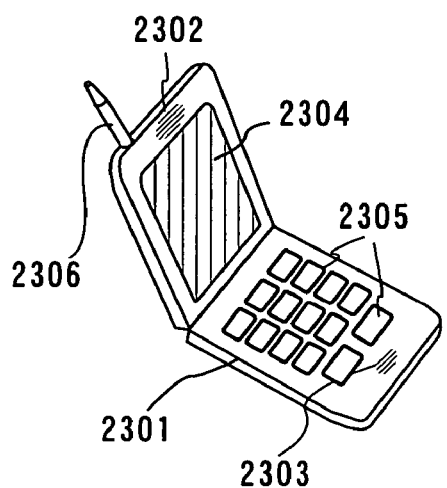

FIG. 18C shows a cellular phone, which includes a main body 2301, an audio output portion 2302, an audio input portion 2303, a display portion 2304, operation switches 2305, an antenna 2306, and the like. A highly reliable high-quality image can be displayed even in a cellular phone which is miniaturized and in which a wiring or the like becomes precise by applying the display device manufactured according to the invention to the display portion 2304.

Figure 18D:
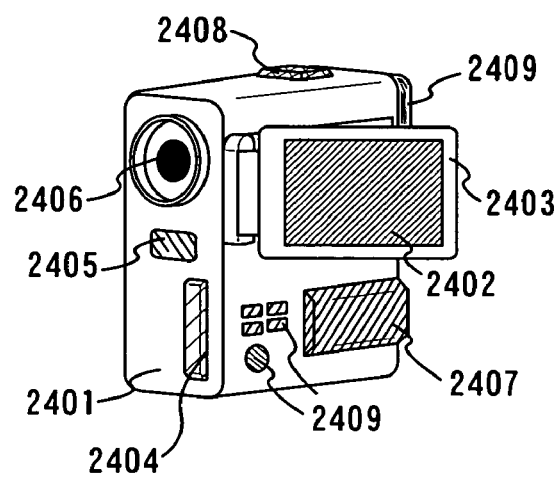

FIG. 18D shows a video camera, which includes a main body 2401, a display portion 2402, a chassis 2403, an external connection port 2404, a remote control receiving portion 2405, an image receiving portion 2406, a battery 2407, an audio input portion 2408, operation keys 2409, and the like. The invention can be applied to the display portion 2402. A highly reliable high-quality image can be displayed even in a video camera which is miniaturized and in which a wiring or the like becomes precise by applying the display device manufactured according to the invention to the display portion 2402. This embodiment can be freely combined with the above embodiment modes.

What is claimed is:

1. A method for manufacturing a display device comprising a semiconductor layer, a wiring, and an electrode, comprising:
    discharging a composition including a conductive material over a formation region, and
    selectively enlarging the composition to shape a part of a shape of the composition,
    thereby forming the wiring and the electrode.

2. A method for manufacturing a display device according to claim 1, wherein a part of the shape of the composition is shaped with a needle shape object for shaping.

3. A method for manufacturing a display device according to claim 1, wherein the conductive material is formed by using silver, gold, copper or indium tin oxide.

4. A method for manufacturing a display device according to claim 1, wherein the electrode is a gate electrode layer, and a width in a channel direction of the gate electrode layer is formed to be from 0.3 pm or more to 10 µm or less.

5. A method for manufacturing a display device according to claim 1, wherein the electrode is formed so that the length in a channel direction in a region where the electrode and the semiconductor layer are intersected is from 0.3 µm or more to 10 µm or less.

6. A method for manufacturing a display device according to claim 1, wherein the semiconductor layer is a non-crystalline semiconductor which is formed of a gas containing hydrogen and halogen.

7. A method for manufacturing a display device according to claim 1, wherein the semiconductor layer is a semi-amorphous semiconductor which is formed of a gas containing hydrogen and halogen.

8. A method for manufacturing a display device according to claim 1, wherein the semiconductor layer is a polycrystalline semiconductor which is formed of a gas containing hydrogen and halogen.

9. A method for manufacturing a display device according to claim 1, wherein the wiring and the electrode is formed at the same time.

10. A method for manufacturing a display device according to claim 1, further comprising forming the semiconductor layer after forming the wiring and the electrode.

11. A method for manufacturing a device comprising a transistor, the transistor comprising a semiconductor layer, a wiring, and an electrode, comprising:
    discharging a composition including a conductive material over a formation region, and
    selectively enlarging the composition to shape a part of a shape of the composition formed on the formation region,
    thereby forming at least one of the wiring and the electrode.

12. A method for manufacturing a device according to claim 11, wherein the wiring and the electrode is on the formation region.

13. A method for manufacturing a device according to claim 11, further comprising forming the semiconductor layer after forming the wiring and the electrode.

14. A method for manufacturing a display according to claim 11, wherein apart of the shape of the composition is shaped with a needle shape object for shaping.

15. A method for manufacturing a device according to claim 11, wherein the conductive material is formed by using silver, gold, copper or indium tin oxide.

16. A method for manufacturing a display device according to claim 11, wherein the electrode is a gate electrode layer, and a width in a channel direction of the gate electrode layer is formed to be from 0.3 μm or more to 10 μm or less.

17. A method for manufacturing a device according to claim 11, wherein the electrode is formed so that the length in a channel direction in a region where the electrode and the semiconductor layer are intersected is from 0.3 μm or more to 10 μm or less.

18. A method for manufacturing a device according to claim 11, wherein the semiconductor layer is a non-crystalline semiconductor which is formed of a gas containing hydrogen and halogen.

19. A method for manufacturing a device according to claim 11, wherein the semiconductor layer is a semi-amorphous semiconductor which is formed of a gas containing hydrogen and halogen.

20. A method for manufacturing a device according to claim 11, wherein the semiconductor layer is a polycrystalline semiconductor which is formed of a gas containing hydrogen and halogen.

21. A method for manufacturing a display device comprising a semiconductor layer, a wiring, and an electrode, comprising:
    discharging a composition including a conductive material to a shape portion by a nozzle attached to the shape portion, a part of the shape portion being in contact with a formation region, and
    scanning the shape portion to form at least one of the wiring and the electrode comprising the composition including the conductive material on the formation region through the shape portion.

22. A method for manufacturing a display device comprising a semiconductor layer, a wiring, and an electrode, comprising:
    discharging a composition including a conductive material to a formation region by a nozzle attached to a shape portion through a space of the shape portion to form at least one of the wiring and the electrode.

* * * * *